(12) United States Patent
Dutta

(10) Patent No.: US 9,184,202 B2
(45) Date of Patent: Nov. 10, 2015

(54) BROADBAND IMAGE SENSOR AND MANUFACTURING THEREOF

(71) Applicant: Banpil Photonics, Inc., Santa Clara, CA (US)

(72) Inventor: Achyut Dutta, Sunnyvale, CA (US)

(73) Assignee: BANPIL PHOTONICS, INC., Santa Clara, CA (US)

( * ) Notice: Subject to any disclaimer, the term of this patent is extended or adjusted under 35 U.S.C. 154(b) by 0 days.

(21) Appl. No.: 13/831,750

(22) Filed: Mar. 15, 2013

(65) Prior Publication Data

US 2014/0264270 A1 Sep. 18, 2014

(51) Int. Cl.
*H01L 27/144* (2006.01)
*H01L 27/146* (2006.01)

(52) U.S. Cl.
CPC ...... *H01L 27/14636* (2013.01); *H01L 27/1464* (2013.01); *H01L 27/14647* (2013.01); *H01L 27/14694* (2013.01)

(58) Field of Classification Search
CPC .......... H01L 27/14647; H01L 27/14609; H01L 27/14621; H01L 27/14603; H01L 27/14652; H01L 27/1446; H01L 33/06; H01L 33/32; H01L 29/127; H01L 27/14636; H01L 27/14694; H01L 27/1464

USPC ................................................. 257/440, 14
See application file for complete search history.

(56) References Cited

U.S. PATENT DOCUMENTS

| 5,479,032 | A  | * | 12/1995 | Forrest et al. | 257/190 |
|---|---|---|---|---|---|
| 6,437,414 | B1 | * | 8/2002 | Nishino et al. | 257/440 |
| 6,445,000 | B1 | * | 9/2002 | Masalkar et al. | 257/21 |
| 6,534,759 | B1 | * | 3/2003 | Koscielniak et al. | 250/214.1 |
| 7,972,885 | B1 | * | 7/2011 | Dutta et al. | 438/48 |
| 8,035,184 | B1 | * | 10/2011 | Dutta et al. | 257/443 |
| 8,357,960 | B1 | * | 1/2013 | Dutta | 257/292 |
| 8,546,853 | B2 | * | 10/2013 | Tian et al. | 257/226 |
| 2003/0160231 | A1 | * | 8/2003 | Cole et al. | 257/22 |
| 2009/0179291 | A1 | * | 7/2009 | Nam et al. | 257/440 |
| 2010/0079631 | A1 | * | 4/2010 | Mitra | 348/294 |
| 2013/0076910 | A1 | * | 3/2013 | Scott | 348/164 |

* cited by examiner

*Primary Examiner* — Latanya N Crawford

(57) ABSTRACT

This invention relates to multiband detector and multiband image sensing devices, and their manufacturing technologies. The innovative detector (or image sensing) provides significant broadband capability covering the wavelengths from within ultra-violet (UV) to long-Infrared, and it is achieved in a single element. More particularly, this invention is related to the multiband or dual band detectors, which can not only detect the broad spectrum wavelengths ranges from within as low as UV to the wavelengths as high as 25 μm, but also band selection capability. This invention is also related to the multiband detector arrays or image sensing device for multicolor imaging, sensing, and advanced communication.

20 Claims, 56 Drawing Sheets

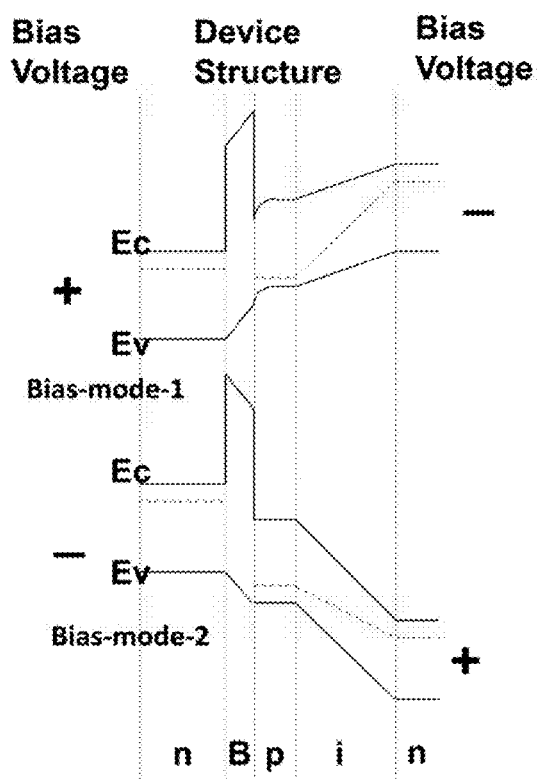
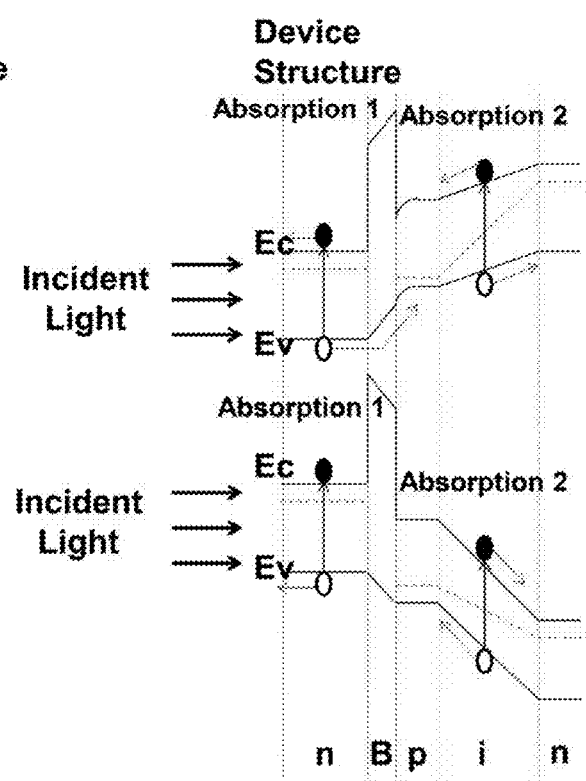
FIG. 28A
FIG. 28B

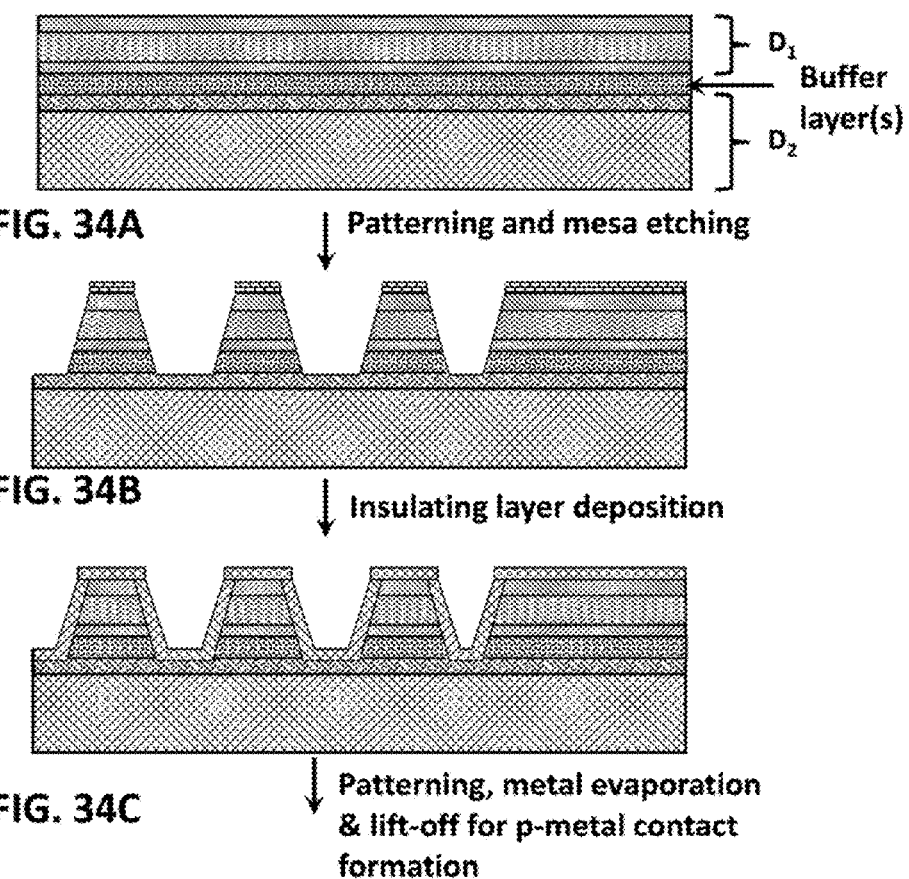

↓ Patterning, etching, passivation layer, and top diode n-contact formation

↓ Patterning, etching, passivation layer, bottom diode n-contact & common n-contacts interconnect

BROADBAND IMAGE SENSOR AND MANUFACTURING THEREOF

FIELD OF THE INVENTION

This invention relates to photodetector and its array (a.k.a. image sensor or focal plane array) having broadband detection capability either single, dual, or multiband covering the wavelengths ranging within from ultra-violet (UV), or near UV to mid infrared (3500 nm and also up to 5500 nm) and to longwave infrared (LWIR) (10,000 nm and also up to 25,000 nm). More particularly, this invention is related to the multicolor detector, which can detect the light wavelengths ranges within from as low as UV to the wavelengths as high as 3500 nm, from UV to as high as 5500 nm, or near UV to LWIR, using of the single monolithic detector fabricated on the single wafer. This invention is also related to the multispectral photodetector arrays for multicolor imaging, sensing, and advanced communication.

BACKGROUND OF THE INVENTION

Solid-state imaging devices with higher resolution are used in many commercial applications, especially cameras, and also for other light imaging uses. Such imaging devices typically are based on CCD (charge coupled device) or complementary metal oxide semiconductor (CMOS) image sensor with associated switching elements, and address (scan) and read out (data) lines. These CCD and CMOS image sensor technologies have matured so much that currently millions of pixels and surrounding circuitry can be fabricated using silicon based CMOS) technology. As today's CCD and CMOS image sensor technologies are based on silicon (Si), the detectable spectral ranges of CCD and CMOS sensor are limited to the wavelengths below 1 μm, where Si exhibits absorption. Additionally, CCD and CMOS image sensor-based imaging have other shortcomings, since it lacks high efficiency response combined with high quantum efficiency over broad spectral ranges. This broad spectral detection is required in many applications. One of them is the free space laser communication, where shorter (in visible ranges) and near infrared wavelengths are used. Image sensors having broad spectral detection capabilities, disclosed in this invention, are expected to provide those features not available in today's CCD, CMOS image sensor, and other imaging technologies. With a well-designed array, appreciably better resolution can be achieved.

Detectors (also known as photodiode or sensor pixel), especially of p-i-n type, have been studied extensively over the last decade for their application in optical communication. Currently, multiple wavelength ranges can be detected, but only in separate sensor for each wavelength-band (i.e., ranges from specific wavelength to other specific wavelength). Those photodiodes which have been most extensively studied are for near infrared detection, especially in the wavelength vicinity 1310 nm to 1550 nm, where today's optical communication is dealt with. Today the photodetector speed as high as 40 Gb/s, as described in the publication by Dutta et. Al. in IEEE Journal of Lightwave Technology, vol. 20, pp. 2229-2238 (2002), is also available for optical communication. These photodiodes use InGaAs material as absorption material, and the diode is fabricated on the InP wafer. On the other hand, Si substrate is used for the photodiode for detection of visible radiation. Other materials such as PbS, InAs, InSb, GaSb, PtSi, and HgCdTe have been used for detectors for wavelength-band with wavelengths greater than 1.65 μm, but they generally have to be cooled to low temperatures, often have very slow responses, or have high dark current.

For mid-wave infrared detectors (MWIR, approximately 3-μm, or 5-8 μm), the most common materials are either InSb or GaSb. Additionally, there has been some success in using type II materials in a superlattice structure for achieving wavelength-band covering MWIR. Some of the problems associated with these materials can be solved with avalanche photodiode structures, but that solution is imperfect due to the high manufacturing cost, the slower response times, and the fact that in order to decrease dark current, conversion efficiency often must be sacrificed.

For long wave infrared detection (LWIR, 8-12 μm), generally HgCdTe is used. HgCdTe is a particularly attractive material because its band gap is very flexible depending on the percentage of Hg versus Cd. Advancement in this material field, however, has been slow due to the high lattice mismatch between HgCdTe and available cost-effective substrate (e.g. Si). There has also been some success with use of type II material superlattice structure grown on InSb.

While current technology provides spectral detection in a large number of wavelength-bands r, no current technology can provide broad spectral detection capability ranging all the way from UV to long wave infrared wavelengths in a single photodetector. It is highly desirable to design the sensor having broader spectral detection ranges and can be fabricated on a single wafer. In addition, it is also important to have a single image sensor whose wavelength-band can be selectable. For covering multiple spectral ranges (a.k.a. bands), two photodiodes fabricated from Si and InP, discretely integrated, can be used. Monolithically, wafer bonding technology to bond Si and InP can be used to fabricate the photodiode covering the wavelengths from visible to near infrared. However, the reliability of wafer bonding over wide range of temperatures is still an unsolved issue and a high-speed operation is not feasible with a wafer bonding approach. It is highly desirable to have a monolithic photodetector array (forming the image sensor), which could offer high bandwidth (GHz and above) combined with high quantum efficiency over a broad spectral range (<0.2 μm to >40 μm). For use especially in imaging where CCD or Si-CMOS based image sensors are currently used, the multicolor image sensor array with the possibility to rapidly and randomly address any pixel could able to provide multiple spectral bands image and their fused image which are very much essential in numerous applications such as bio-medical, security, agriculture, communication, etc.

It is our objective to develop a monolithic photodiode and their array for broad spectral ranges covering from UV to long wave infrared wavelengths, while having high frequency response and high quantum efficiency over the entire wavelength region.

Our innovative approach utilizes surface incident type (either top or bottom illuminated) photodiode structure having a single set of absorption layers, which can provide broad spectral response due to the material used and their unique structure. The photodiode can be used as a single element and also in an array.

According to the current invention, photodiodes having ultra-broad spectral bands, from near UV to LWIR. High quantum efficiency, and high frequency response can be fabricated using a single wafer. According to this invention, in the case of a photodiode array, each photodiode can also be operated independently. Some applications include imaging applications such as for astronomical observation, communication, biomedical, security, etc.

DEFINITIONS

Unless defined otherwise, all technical and scientific terms used herein have the same meaning as commonly understood by one of ordinary skill in the an to which the invention pertains. The following definitions supplement those in the art and are directed to the current application and are not to be imputed to any related or unrelated case, such as any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an," and "the" include plural referents unless context clearly dictates otherwise. Thus, for example, reference to "a layer" includes a plurality of layers, and the like.

The term "heterostructure" when used with reference to layers within a device refers to devices characterized by at least two different and/or distinguishable material types. Typically, this refers to the p-layer of one material type and n-layer of a second material type within a diode. This is merely an example, though. Another example is a photoconductor heterostructure, perhaps n-i-n. This would mean that the two n-layers, although doped similarly, are made from different material types. In the above examples, "heterostructure" referred to entirely different materials, but it can also be used to refer to different dopants being used, or different concentrations of dopants. For example, a diode might be formed of Si, and have two layers within it which have been differently doped in order to form a p-n junction. This is still a heterostructure, even though the base materials for each layer are the same.

The term "homostructure" when used with reference to layers refers to devices characterized by only one material type.

The term "layer" is used in this application to describe the regions within the device which are stacked on top of one another, and so refers to one particular horizontal region. Use of the term "layer" does not necessarily imply anything about the size or shape of the region. For example, two adjacent layers are not necessarily the same width or thickness. The bottom layer might be wider than the top, creating a mesa structure. Likewise, a layer is not necessarily uniform thickness, or an unbroken surface. For example, many of the embodiments show layers which have been "punctured" by a metal contact and insulator.

A "buffer" refers to at least one layer of material sandwiched between two others. The purpose of the buffer is to connect two materials which have significant lattice mismatch. For instance, if HgCdTe (which has a lattice constant of just under 6.5 Å) is used in one layer, and Si (Lattice constant 5.43 Å) in another, a buffer is needed to prevent defects from weakening the structural integrity of the device. Generally the buffer is approximately 0.5 µm and above. For the above example, a buffer layer of CdTe or CdSeTe (Lattice constant approximately the same as HgCdTe) can be used. But since it still has significant mismatch with Si, the layer would need to be thicker in order to make sure that the defects created from that mismatch to not extend through the layer to affect the HgCdTe layer. Another way to avoid this would be to use multiple buffer layers, where each layer has a slightly different lattice-constant, until the layers on the top and bottom are approximate matches with the materials they touch. Graded layers with different composition can also be used. Within this application, the term "buffer" alone is used to identify this whole region in general, whether it consists of one layer or many.

The term "bumps" is used generally to indicate regions which are raised from a surface. Such regions might be extensions of the surface material, or separate material placed on the surface. "Bump" does not imply anything about the specific shape or size of the region, merely that it is raised from the surface. For example, but not a limitation, a bump might be a sphere, a hemisphere, a cylinder, or a cube. Any 3-dimensional shape could be utilized to form a bump.

The term "device" is used in this application to refer in general to the individual unit which is connected to another unit in parallel, thus forming the invention. For instance, in one embodiment the invention is created from two photodiodes connected in parallel. In that example, each diode is a "device." The term "device" can refer to any number of things, such as a photodiode, a photoconductor, or an nBn detector, "device" can also refer to several such units connected in series. For example, if a series of photodiodes were connected in parallel to a photoconductor, the photodiodes together would be one "device" while the photoconductor would be another "device."

"Substrate" is used in this application to mean the initial layer upon which the other layers of the structure are formed. Typically this results in the substrate also doubling as the "base" of the structure, but this is not always the case. For instance, one might choose to form another layer on the bottom of the substrate, or flip the whole structure so that the substrate is on the top instead.

"p-layer" or "n-layer" are terms used to identify the type of doping (i.e. electronic material type) used to form a layer. They are simply shorthand for "p-doped layer" and "n-doped layer." Generally, it refers to the doping in a p-n junction, where the n-layer contains electrons as majority charge carriers, and the p-layer contains electron holes as the majority charge carriers. However, such layers are not always just utilized in p-n junctions. For example, a photoconductor can be formed from two n-layers sandwiching an i-layer. Likewise, "i-layer" is shorthand for "intrinsic semiconductor layer" or "i-type semiconductor layer" or "undoped or lightly doped semiconductor layer."

"Pillars" refers to a 3-dimensional shape, and is not meant to be specific to any particular shape. To clarify, while a layman might read "pillars" to mean cylindrical columns, it is actually meant to include many variations, such as cubes, pyramids, trapezoids, and many others.

"Passivation layers" is the layer generally used to isolate the part of a device from another part of a device and/or to avoid electrical conduction and/or to reduce the leakage current, "passivation layers" refer to those layer which has larger band-gap than the electrical conductivity materials used to make a device.

"Mesa" is a general term, used here to describe any three-dimensional geometric shape. Typically the term is used to refer to pyramids, cones, truncated pyramids, or truncated cones. However, "mesa" may also refer to columns, cubes, prisms, spheres, or other such three-dimensional shapes.

"Wavelength of interest" is a general term, not referring to any specific range of wavelengths. Instead, it is intended to refer to whatever range of wavelengths which are meant to be absorbed by the detector.

SUMMARY OF THE INVENTION

This invention, in most general terms, is a broadband photodetector (a.k.a. broadband detector) and its array with an extremely expanded spectral detection range. This is done by forming a detector on a single wafer, from at least two devices electrically connected in parallel. One device (referred to also as "first device") is formed from a material which absorbs wavelengths from the visible spectrum, below 1 µm to 2.5 µm or beyond, while the other device (referred to as also "second device") is formed from a material which absorbs radiations with having wavelengths from the upper limit of the first device, up to as high as 40 µm. Some overlap in the detection ranges of each device is also possible, but redundant.

The two devices (e.g. the first device and the second device) above are formed on a substrate of semiconductor material, metal, or dielectric material. If the semiconductor material is used, then it can be either separate from the devices, or it can be integrated as part of one of the devices. This structure can then be placed in an array, attached to an read-out integrated circuit (ROIC), and/or attached to a common carrier in a number of ways.

In order to form a device that has extremely expanded detection range, several materials can be used. There are several material systems which have adjustable ranges depending on the ratio of one of the materials within it. One classic example is HgCdTe, which absorbs different wavelengths depending on Cd and Hg contents. Other materials may also be used for this purpose, though. A more detailed discussion of the materials that can be used for different components of the invention follows below, in the detailed description of the drawings.

Accordingly, the first several embodiments are included in this specification to show the many variations on how the two devices (e.g. the first device and the second device) can be structurally made, and how each device individually can be arranged. Because of the vast number of variations, it is most convenient to describe the device structures first before discussing the ROIC, as done below in the detailed description of the invention.

According to the invention, one photodetector array comprises: (1) A first type photodiode device comprising: (a) a doped substrate, (b) optionally, an undoped or lightly doped intrinsic layer making the first type photodiode device, and (c) a doped layer, opposite type from the substrate, either as a separate grown layer or part of the substrate; (2) at least one buffer layer; (3) a second type photodiode device comprising: (a) a first doped layer, (b) optionally, an undoped or lightly doped intrinsic layer making the second type photodiode device, and (c) a doped layer, opposite type from the first doped layer; (4) metal contacts, electrically insulated from each other, connecting the two devices in parallel and creating individual pixel.

The first device is formed from a material system suitable for detecting wavelengths in from near UV and/or visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, especially formed on the substrate and/or using the substrate, as examples. However, the first device can be formed also on the top. It can serve as either device. The other device (e.g. the second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The device can be made for either top-illuminated or bottom-illuminated types, whereby radiations incident on the bottom or top of the device. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength-bands especially more than 1.0 µm is transparent to for example Si and longer wavelength is absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts, will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact.

Alternatively, a photodetector array comprises (1) a substrate; (2) A first type photodiode device comprising: (a) a doped first layer, (b) optionally, an undoped or lightly doped intrinsic layer making the first type photodiode device, and (c) a doped layer, opposite type from the first doped layer; (3) at least one buffer layer; (4) a second type photodiode device comprising: (a) a first doped layer, (b) optionally, an undoped or lightly doped intrinsic layer making the second type photodiode device, and (c) a doped layer, opposite type from the first doped layer; (5) metal contacts, electrically insulated from each other, connecting the two devices in parallel and creating individual pixels.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths from near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP or InSb. The first device is shown in most of the Figures as the one on the bottom, however it can be formed also on the top. It can serve as either device. The other device (e.g. the second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 μm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, the photodetector array comprises: (1) A first-type photodiode device comprising: (a) a doped substrate, (b) optionally, an undoped or lightly doped intrinsic layer making the first type photodiode device, and (c) a doped layer, opposite type from the substrate, either as a separate grown layer or part of the substrate; (2) at least one buffer layer; (3) a second type photodiode device comprising: (a) a first doped layer, (b) a superlattice layer, and (c) a doped layer, opposite type from the first doped layer; (4) metal contacts, electrically insulated from each other, connecting the two devices in parallel and creating individual pixels.

The first device is formed from a material system suitable for detecting wavelengths from near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however, it can be formed on the top instead. It can serve as either device. The other device (e.g. the second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The superlattice layer comprises a series of layers forming a type I, type II, or type III superlattice. This is achieved by including at least 3 alternating layers, where the materials chosen for the layers determines what type of superlattice is formed. For instance, a type I superlattice might be alternating AlGaAs and GaAs, a type II might be GaSb and InAs, and a type III might be CdTe and HgTe. Alternatively, one can place a superlattice in either device, or both, between the two oppositely doped layers of the device.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength hands especially more than 1.0 μm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, the photodetector array comprises: (1) a substrate; (2) A first type photodiode device comprising: (a) a doped first layer, (b) a superlattice layer (c) a doped layer, opposite type from the first doped layer; (3) at least one buffer layer; (4) a second type photodiode device comprising: (a) a first doped layer, (b) optionally, an undoped or lightly doped intrinsic layer making the second type photodiode device, and (c) a doped layer, opposite type from the first doped layer; (5) metal contacts, electrically insulated from each other, connecting the two devices in parallel and creating individual pixels.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths from near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however it can be formed also on top. It can serve as either device. The other device (e.g. the second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The superlattice layer comprises a series of layers forming a type I, type II, or type III superlattice. This is achieved by including at least 3 alternating layers, where the materials chosen for the layers determines what type of superlattice is formed. For instance, a type I superlattice might be alternating AlGaAs and GaAs, a type II might be GaSb and InAs, and a type III might be CdTe and HgTe. Alternatively, one can place a superlattice in either device, or both, between the two oppositely doped layers of the device.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact.

Alternatively, a photodetector array comprises: (1) a substrate; (2) A first type photoconductor device comprising: (a) a doped first layer, (b) an undoped or lightly doped intrinsic layer, and (c) a doped layer, the same way as the first doped layer; (3) at least one buffer layer; (4) a second type photodiode device comprising: (a) a first doped layer, (b) optionally, an undoped or lightly doped intrinsic layer, or a superlattice, and (c) a doped layer, opposite type from the first doped layer; (5) metal contacts, electrically insulated from each other, connecting the two devices in parallel and creating individual pixels.

According to this invention, one device is a photoconductor while the other is a photodiode. Either device can be the photoconductor. Alternatively, both devices can be photoconductors, eliminating the photodiode completely.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths from near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP or InSb. The first device is shown in most of the Figures as the one on the bottom, however it may also be formed on top. It can serve as either device. The other device (e.g. the second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, a photodetector array comprises: (1) A first type photoconductor device comprising: (a) a doped substrate, (b) an undoped or lightly doped intrinsic layer, either separate from the substrate or part of it, and (c) a doped layer, the same way as the doped substrate, either separate from the substrate and undoped layer, or part of them; (2) at least one buffer layer; (3) a second type photodiode device comprising: (a) a first doped layer, (b) optionally, an undoped or lightly doped intrinsic layer, or superlattice, and (c) a doped layer, opposite type from the first doped layer; (4) metal contacts, electrically insulated from each other, connecting the two devices in parallel and creating individual pixels.

According to this invention, one device is a photoconductor while the other is a photodiode. Either device can be the photoconductor. Alternatively, both devices can be photoconductors, eliminating the photodiode completely.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths from near UV and/or the visible spectrum, such as Si, AlGaAs, Ge, SiGe, CdTe, ZnO, ZnCdTe, HgCdTe, HgZnTe, GaAs, GaN, InP, GaSb, ZnS, or InSb. The first device is shown in most of the Figures as the one on the bottom, however it may also be formed on top. It can serve as either device. The other device (e.g. the second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, a photodetector array comprises: (1) A first type photodiode device comprising: (a) a doped substrate, (b) optionally, an undoped or lightly doped intrinsic layer, either separate from the substrate or part of it, or a superlattice, and (c) a doped layer, opposite type from the substrate, either separate from the substrate and optional undoped layer, or part of them (if a superlattice is utilized, then this layer will necessarily be separate); (2) at least one buffer layer; (3) a second type photoconductor device comprising: (a) a first doped layer, (b) an undoped or lightly doped intrinsic layer, and (c) a doped layer, same type as the first doped layer; (4) metal contacts, electrically insulated from each other, connecting the two devices in parallel and creating individual pixels.

According to this invention, one device is a photoconductor while the other is a photodiode. Either device can be the photoconductor. Alternatively, both devices can be photoconductors, eliminating the photodiode completely.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however, it also may be formed on top. It can serve as either device. The other device (e.g. second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, one photodetector array comprises: (1) A first device comprising: (a) a doped substrate, (b) optionally, an undoped or lightly doped intrinsic layer, or a superlattice, and (c) a doped layer, opposite or same type as the substrate, either as a separate grown layer or part of the optional intrinsic layer and substrate (if the optional layer is a superlattice, then this layer necessarily must be a separate layer); (2) at least one buffer layer; (3) a second barrier detector device comprising: (a) a first doped layer, (b) a thin undoped barrier layer, and (c) and a doped layer, either the same or opposite type from the first doped layer; (4) metal contacts, electrically insulated from each other, connecting the two devices in parallel and creating individual pixels.

This embodiment refers to a first device and a second barrier detector device. The latter device's most common construction is nBn, but it can also be formed from pBp, nBp, or pBn. According to this invention, one device is a barrier detector device while the other is not. Either device can be the barrier detector device. Alternatively, both devices can be a barrier detector device, eliminating the other devices completely. The first device can be a photodiode, a photoconductor, a barrier detector, or a superlattice photodiode.

One device is formed from a material system suitable for detecting wavelengths near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however it may also be formed on the top. It can serve as either device. The other device (e.g. second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 μm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, a photodetector array comprises (1) a substrate; (2) A first device comprising: (a) a doped first layer, (b) optionally, an undoped or lightly doped intrinsic layer, or a superlattice and (c) a doped layer, opposite or same type as the first doped layer; (3) at least one buffer layer; (4) a second barrier detector device comprising: (a) a first doped layer, (b) a thin undoped barrier layer, and (c) an n-doped layer; (5) metal contacts, electrically insulated from each other, connecting the two devices in parallel and creating individual pixels.

This embodiment refers to a first device and a barrier detector device. The latter device's most common construction is nBn, but it can also be formed from pBp, nBp, or pBn.

According to this invention, one device is a barrier detector device while the other is not. Either device can be the barrier detector device. Alternatively, both devices can be a barrier detector device, eliminating other devices completely. The first device can be a photodiode, a photoconductor, a barrier detector, or a superlattice photodiode.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths bear UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however it can also be formed on top. It can serve as either device. The other device (e.g. second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 μm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Any one of the above variations can then be attached to the ROIC in a number of ways. The ROIC can be attached separately, through bumps. More interestingly, though, it can also be integrated into the invention itself. Since an ROIC can be made from any number of materials, it is quite simple to integrate it so that it doubles as a device for detecting wavelengths in the visible spectrum and the ROIC at the same time. For instance, one embodiment places the device for detecting wavelengths from the visible spectrum to LWIR on the bottom, then connecting the ROIC, through bumps, to the top. The ROIC in this case doubles as the device for detecting wavelengths in the visible spectrum. Alternatively, one could place the two devices on the same wafer by placing the ROIC on the bottom, acting as the visible spectrum device, and growing directly on top the device for detecting from the visible spectrum to LWIR. This embodiment can then be attached to a common carrier substance through bumps.

According to the invention, a photodiode array comprises (1) a substrate, (2) a first device, (3) at least one buffer layer, (4) a second device, (5) metal contacts connecting the two devices in parallel and creating individual pixels, (6) bumps attached to each of the pixel contacts and the common contact, (7) a readout integrated circuit (ROIC), and (8) bumps attached to the ROIC, which are in turn attached to the bumps attached to the metal contacts.

In the above description, "device" is used to mean any variation discussed already, such as at least one photodiode, photoconductor, p-n diode, p-i-n diode, superlattice diode, or nBn detector.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however it can also be formed on top. It can serve as either device. The other device (e.g. the second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, a photodiode array comprises (1) a first device, wherein the substrate is integrated into it, (2) at least one buffer layer, (3) a second device, (4) metal contacts connecting the two devices in parallel and creating individual pixels, (5) bumps attached to each of the pixel contacts and the common contact, (6) a readout integrated circuit (ROIC), and (7) bumps attached to the ROIC, which are in turn attached to the bumps attached to the metal contacts.

In the above description, "device" is used to mean any variation discussed already, such as at least one photodiode, photoconductor, p-n diode, p-i-n diode, superlattice diode, or nBn detector.

According to this invention, one device is formed from a material system suitable for detecting wavelengths near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however it can also be formed on top. It can serve as either device. The other device (e.g. second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, a photodiode array comprises (1) a substrate, (2) a first device, wherein the ROIC is integrated into the same materials, (2) a first metal contact connecting to the common doped array layer of the first device, (3) multiple second metal contacts connected to the other doped layer in the first device, forming pixels, (4) bumps connecting to each first and second contact, (5) a second device, (6) a third metal contact, connecting to the common doped array layer of the second device, (7) multiple fourth metal contacts connected to the other doped layer in the second device, forming pixels, and (8) bumps connecting to each third and fourth metal contact, and also to the bumps on the first device, thereby connecting the first and third metal contacts, and the second and fourth metal contacts.

In the above description, "device" is used to mean any variation discussed already, such as a photodiode, photoconductor, p-n diode, p-i-n diode, superlattice diode, nBn detector, pBp detector, nBp, nBp-i-n, pBn-i-p, pB-i-n, nB-i-p, or pBp-n detector.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, InAs, or InSb. The first device is shown in most of the Figures as the one on the bottom, however it can also be formed on top, and this is based on whether the device bottom-illuminated or top-illuminated types . . . . The other device (e.g. the second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

Alternatively, a photodiode array comprises (1) a first device, wherein the ROIC and the substrate are integrated into the same materials, (2) a first metal contact connecting to the common doped array layer of the first device, (3) multiple second metal contacts connected to the other doped layer in the first device, forming pixels, (4) bumps connecting to each first and second contact, (5) a second device, (6) a third metal contact, connecting to the common doped array layer of the second device, (7) multiple fourth metal contacts connected to the other doped layer in the second device, forming pixels, and (8) bumps connecting to each third and fourth metal contact, and also to the bumps on the first device, thereby connecting the first and third metal contacts, and the second and fourth metal contacts.

In the above description, "device" is used to mean any variation discussed already, such as a photodiode, photoconductor, p-n diode, p-i-n diode, superlattice diode, or nBn detector.

According to this invention, the first device is formed from a material system suitable for detecting wavelengths near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however it can also be formed on top. It can serve as either device. The other device (e.g. second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency if there is absorption and/or reflection of radiation by metal contacts. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device. Alternatively, top-illuminated device can be made in such as way that radiation can be absorbed by opening portion of the device and carriers are diffused and/or drifted in side to the device. In this case, carriers movement in longitudinal rather vertical until they are reached to the device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, a photodiode array comprises (1) a substrate, (2) a first device, wherein the ROIC is integrated into the same materials, (3) at least one buffer layer, (4) a second device, (5) metal contacts connecting the two devices in parallel and creating individual pixels, (6) bumps attached to each of the pixel contacts and the common contact, (7) a common carrier substance, (8) bumps attached to the common carrier, which are in turn attached to the bumps attached to the metal contacts.

In the above description, "device" is used to mean any variation discussed already, such as a photodiode, photoconductor, p-n diode, p-i-n diode, superlattice diode, or nBn detector.

According to this invention, the substrate can be a semiconductor, metal, or dielectric material. Alternatively, the substrate can be multiple layers of any combination of the above, or the substrate can be etched out completely. The first device is formed from a material system suitable for detecting wavelengths near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however it can also be formed on top. It can serve as either device. The other device (e.g. second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device. Alternatively, top-illuminated device can be made in such as way that radiation can be absorbed by opening portion of the device and carriers are diffused and/or drifted in side to the device. In this case, carriers movement in longitudinal rather vertical until they are reached to the device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. Alternatively, a photodiode array comprises (1) a first device, wherein the substrate and ROIC are integrated into it, (2) at least one buffer layer, (3) a second device, (4) metal contacts connecting the two devices in parallel and creating individual pixels, (5) bumps attached to each of the pixel contacts and the common contact, (6) a common carrier substance, and (7) bumps attached to the common carrier, which are in turn attached to the bumps attached to the metal contacts.

In the above description, "device" is used to mean any variation discussed already, such as a photodiode, photoconductor, p-n diode, p-i-n diode, superlattice diode, or nBn detector.

According to this invention, the first device is formed from a material system suitable for detecting wavelengths near UV and/or the visible spectrum, such as Si, AlGaAs, Ge, SiGe, CdTe, ZnO, ZnCdTe, HgCdTe, HgZnTe, GaAs, GaN, InP, GaSb, ZnS, InGaAs, InAsP, or InSb. The first device is shown in most of the Figures as the one on the bottom, however it may also be formed on the top. It can serve as either device. The other device (e.g. second device) is formed from a material system suitable for detecting wavelengths from the visible spectrum to LWIR, such as HgCdTe, InAsP, InGaAs, PbSnSe, PbSnTe, ZnCdTe, InGaSb, InAsSb, InAsP, HgZnTe, AlGaAs, or AlAsSb.

The devices can be made for either top-illuminated or bottom-illuminated types, whereby radiation is incident on the top or bottom of the devices. However, material systems for the first device and the second device are to be selected accordingly. For instance, if the device is illuminated from the bottom, the metal contacts and insulators can be transparent or not. If the device is top-illuminated, then the metal contacts and insulators should be transparent to all wavelengths of interest so that they may pass through and be absorbed by the detector. It might also affect efficiency. For instance, if one device is formed from Si, and the other from HgCdTe, then the absorption spectrums for both devices significantly overlap. Since Si absorbs a significantly narrower range of wavelengths, however, it is most efficient for the radiation to strike Si first so that the HgCdTe device is not overburdened. The longer wavelength bands especially more than 1.0 µm is transparent to, for example, Si and longer wavelengths are absorbed by the second device. Alternatively, top-illuminated device can be made in such as way that radiation can be absorbed by opening portion of the device and carriers are diffused and/or drifted in side to the device. In this case, carriers movement in longitudinal rather vertical until they are reached to the device.

According to the invention, the buffer layer is introduced to reduce defects due to lattice mismatch between the two devices. If there is very little or no mismatch, however, a buffer may or may not be needed. Alternatively, this buffer layer can comprise multiple layers, a graded layer, multiple graded layers, or a combination thereof.

According to the invention, the metal contacts are connected to make contact the first device and the second device to form the broadband device and its array. What this means is that, in a structure where each device contains two doped layers (for example only) a first series of metal contacts will connect a doped layer in the first device to a doped layer in the second device, while a second metal contact will connect the remaining unconnected layer in the first device to the remaining unconnected layer in the second device. For example, in an embodiment where each device is a p-n diode, the first series of contacts can connect the p-layers in each device to each other, and the second contact can connect the two n-layers. Those contacts are electrically isolated from each other. The p-contacts act as the individual pixels, while the n-contacts act as the common contact. From a fabrication point of view, the invention can be made in many ways. The following are meant only as examples, and not to be construed as limitations.

According to the invention, the fabrication process of the bottom-illuminated photodetector array comprises: (1) either growing the layers for the first device on the substrate, or doping the substrate to form the layers, (2) growing the buffer layer(s) appropriate for preventing defects resulting from lattice mismatch between the first and second device materials, (3) growing the layers for the second device on the buffer layer(s), or on the first device if the buffer is unneeded, (4) electron-beam patterning and etching (dry or wet) to form the gaps for the individual pixel contacts, (5) depositing insulating material on the top surface, (6) patterning and depositing the metal for the individual pixel contacts and lifting-off any excess metal, (7) patterning and etching out the gap for the first common contact, depositing a passivation layer (or insulator) within the gap, etching out the insulator from the bottom of the gap, and depositing a metal into the gap, (8) patterning and etching out the gap for the second common contact, depositing a passivation layer (or insulator), etching out the insulator from the bottom of the gap, and depositing a metal into the gap, (9) depositing a metal to connect the two common contacts, (10) optionally, etching out or thinning the substrate, and (11) optionally, patterning and etching the first device to form pillars, etching either partially into the device, or completely, so that the bases of the pillars are formed from the buffer layer.

According to the invention, the fabrication process of the top-illuminated photodetector array comprises: (1) either growing the layers for the first device on the substrate, or doping the substrate to form the layers, (2) growing the buffer layer(s) appropriate for preventing defects resulting from lattice mismatch between the first and second device materials, (3) growing the layers for the second device on the buffer layer(s), or on the first device if the buffer is unneeded, (4) electron-beam patterning and etching (dry or wet) to form the gaps for the individual pixel contacts, (5) optionally, patterning and etching to form pillars in the second device, etching either partially into the device or completely, so that the bases of the pillars are formed from the buffer layer, (6) depositing insulating material on the top surface, (7) patterning and depositing the metal for the individual pixel contacts and lifting-off any excess metal, (8) patterning and etching out the gap for the first common contact, depositing a passivation layer (or insulator) within the gap, etching out the insulator from the bottom of the gap, and depositing a metal into the gap, (9) patterning and etching out the gap for the second common contact, depositing a passivation layer (or insulator), etching out the insulator from the bottom of the gap, and depositing a metal into the gap, (10) depositing a metal to connect the two common contacts, and (10) optionally, etching out or thinning the substrate.

BRIEF DESCRIPTION OF THE DRAWINGS

Other aspects, features, and advantages of the present invention will become apparent from detailed description, in view of a brief description of accompanying drawings in which:

FIG. 26A shows a circuit diagram of a photodiode placed in parallel with a pB-i-n detector, while

FIG. 28A and FIG. 28B are the band diagrams of n-B-p-i-n detector at both forward and reverse bias conditions at dark and under illumination, according to this invention.

FIG. 34A-H are schematics showing the fabrication process step for the broadband detector and its array according to these inventions.

DETAILED DESCRIPTION OF THE INVENTION

Figure 1:
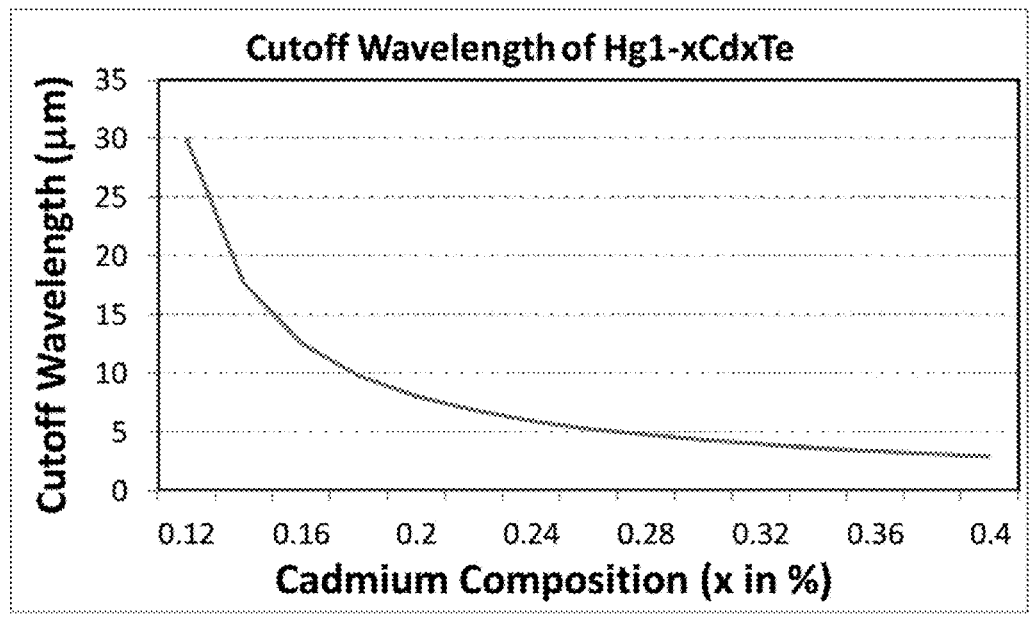
FIG. 1 is a graph showing the absorption cutoff wavelength for HgCdTe as the percentage of Cd is altered.

Reference is made in detail to the preferred embodiments of the invention. While the invention is described in conjunction with the preferred embodiments, the invention is not intended to be limited by these preferred embodiments. The contemplated embodiments for carrying out the present invention are described in turn with reference to the accompanying Figures. The best modes for carrying out the present invention will be described in terms with reference to the accompanying drawings. In the following description, the same reference numerals denote components having substantially the same functions and arrangements, and duplicate explanation will be made only where necessary.

A photodiode is defined to be a device that absorbs photons to generate a current. The absorption of the photons provides the electrons with the energy to jump the bandgap between the valance band and the conduction band, leaving a positive charge called a hole behind. Each bandgap has a minimum amount of energy required by the electrons to jump the bandgap and the amount may vary depending on the material. The minimum amount of energy may be translated to a cutoff wavelength using Plank's relation $$E = \frac{hc}{\lambda},$$

where h is Plank's constant, E is energy, and c is the speed of light. Photons with wavelengths longer than the cutoff wavelength will not provide the necessary energy required to surmount the material's bandgap and will pass through the material. A photodetector is a type of photodiode wherein a forward or reverse bias can be applied, which increases the dark current but speeds up the response time. Measuring the amount of current generated can give very precise measurements of wavelength and intensity.

Photodetectors typically comprise semiconductors configured in p-n or p-i-n junctions. A p-n junction is formed by joining p-type and n-type semiconductors in close contact. A p-i-n junction is similar to a p-n junction, but includes a very low doped or undoped intrinsic layer between the p-type and n-type semiconductors. Due to the electric field generated by the diffusion regions of the p-n or p-i-n junctions the electrons and holes are moved in opposite directions generating a current.

According to this invention, Mercury Cadmium Telluride (HgCdTe) can be used to extend the spectral imaging range of a photodiode. HgCdTe's bandgap can be tuned between 0.7 to 40 micrometer by varying the percentage of Hg versus Cd. The equation showing this relationship is $Eg=-0.302+1.93x-0.81x^2+0.832x^3+(5.35 \times 10^{-4})T(1-2x)$ where x is the percentage of cadmium, T is the material temperature, and Eg is the energy required for the electrons to jump the bandgap in the material. This equation is plotted in FIG. 1. Although HgCdTe will often be mentioned in this invention, it is only done so as an example. Many other materials exhibit this same bandgap adjustability, and those may be used as well. Some examples are InGaAs, ZnCdTe, AlAnSb, AlGaN, GaInSb, and AlGaAs. There are several factors that contribute to infrared detecting efficiency. The ability of a material to absorb the wavelength of available energy is a key factor. This key factor determining the net conversion efficiency of photodiodes is quantum efficiency (QE). (QE) is the probability that an incident photon of energy E will deliver an electron to the external circuit. Other factors affecting conversion efficiency are cell layer thicknesses, contact resistances and leakages.

Although HgCdTe is mentioned in detail, this invention is not limited to it as the only possible material. This device can be fabricated using many materials and combinations. These materials might be used as the diode for detecting wavelengths from the UV spectrum to the IR spectrum (0.8-40 μm and beyond), the visible light diode (or substrate), the buffer layer(s), or any other portion of an embodiment. Hereinafter, the diode for detecting UV-IR will be referred to as $D_1$, and the diode for detecting visible light will be referred to as $D_2$. The substrate might be a semiconductor material, metal, or dielectric material (such as glass, sapphire, polymer, or any transparent conductive oxide). This substrate can be either integrated into one of the devices, or it can be a separate layer. $D_2$ can be formed from polysilicon, crystalline silicon, AlGaAs, Ge, SiGe, CdTe, ZnO, ZnCdTe, HgCdTe, HgZnTe, GaAs, GaN, InP, GaSb, ZnS, or InSb, $D_1$ can be formed from HgCdTe, HgTe, CdTe, ZnCdTe, ZnTe, CdTe, InGaSb, GaSb, InSb, InAsSb, InAs, InSb, InGaAs, GaAs, InAs, InAsP, InP, HgZnTe, AlGaAs, AlAs, AlSb, AlP, GaP, AlAsSb, PbTe, PbSnSe, PbSnTe, or polymer material systems. The choice of material is largely due to which embodiment is used. For instance, when making a QWIP diode, a common material system is AlGaAs layers alternating with GaAs. More detailed discussions of the recommended material systems will be included further on, when discussing the applicable device.

Figure 2:
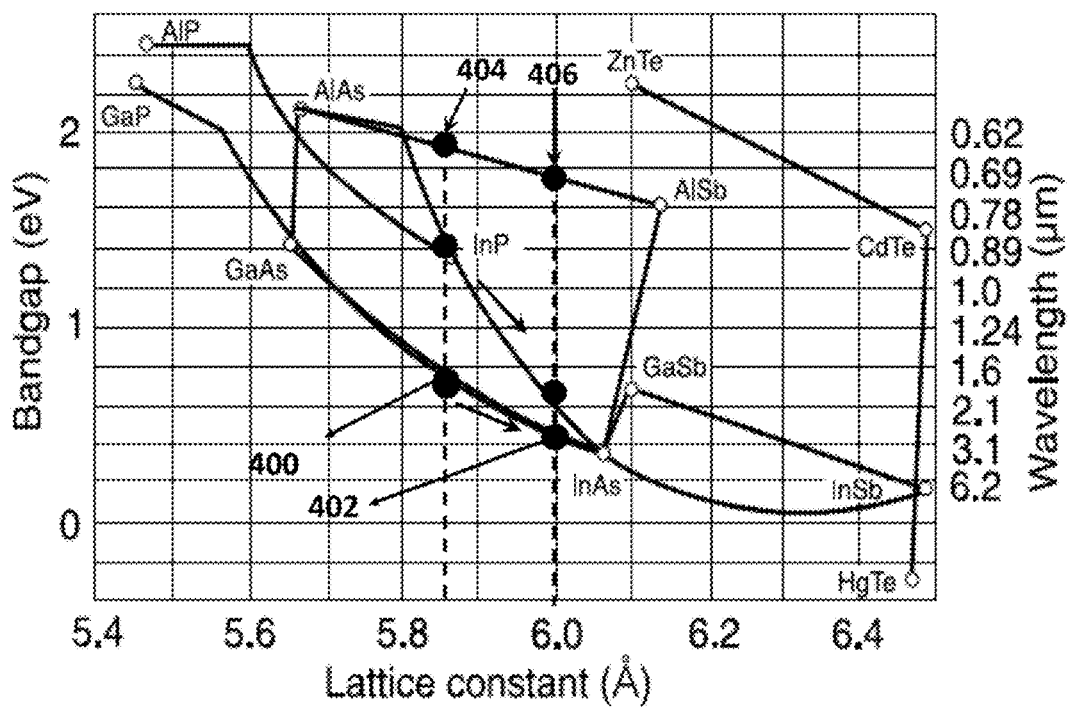
FIG. 2 is a graph showing the lattice constants and bandgaps for various material systems

FIG. 2 shows a graph of various material systems and how their bandgaps and lattice constants vary when the percentage of certain components are altered. FIG. 2 illustrates several materials which may be desirable for fabrication, and whether buffers or graded layers need to be used with them. For example, as shown HgCdTe is a highly desirable material since it has a large range of bandgaps, and remains at almost the same lattice constant no matter its composition. However, if one wanted to fabricate HgCdTe based material on an InP substrate, the lattice mismatch is quite large. One or several buffers would need to be inserted in between, such as graded layers of ZnCdTe, then graded layers of AlAsSb.

On FIG. 2, several specific materials have been added and highlighted. For example, point 400 shows $In_{0.52}Ga_{0.47}As$ and point 402 shows $In_{0.8}Ga_{0.2}As$. According to this graph, while altering the components has resulted in two materials with significantly different bandgaps, it has also significantly altered their lattice constants. If those two were placed directly on top of each other, it would result in some defects in the structure. To remedy this, a graded layer could be placed between these layers, which spans the difference between them slowly, as illustrated in the chart by the arrow between 400 and 402. Any material which falls along the dotted line for 400, such as 404 and InP, can be safely placed next to material 400 without need for a buffer or graded layer. Likewise, any material along the dotted line for 402, such as InAsP or 406, can be safely placed next to material 402 without need for a buffer or graded layer.

Figure 3A:
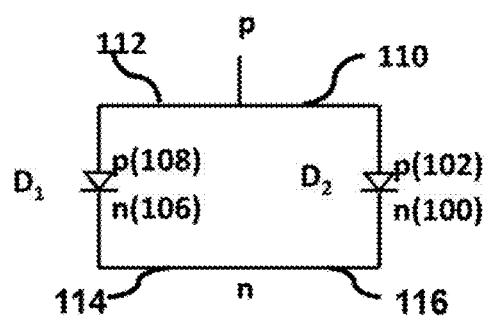
FIG. 3A is an electrical diagram of the invention, where two photodiodes are placed in parallel.
Figure 3B:
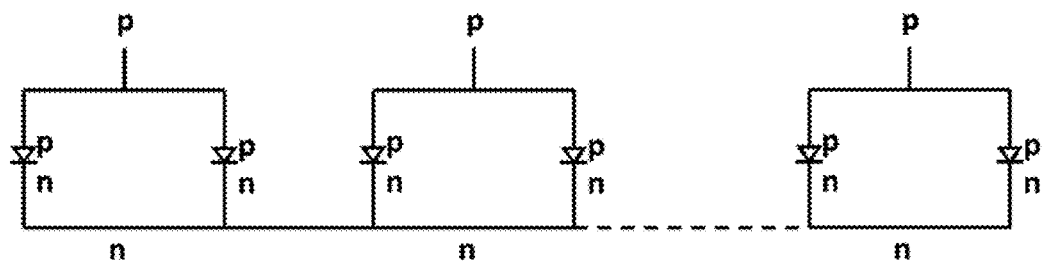
FIG. 3B is an electrical diagram of an array of pixels as shown in FIG. 2A

In most general terms, this invention is a photodetector with ultra-broadband spectral range, fabricated on a monolithic wafer. One general embodiment consists of two devices connected in parallel, resulting in a two-terminal detector which can then be used as a single pixel or in an array. As an example, but not a limitation, FIG. 3A shows the electrical circuit diagram of an embodiment utilizing two photodiodes in parallel. For this embodiment, one diode ($D_2$) is formed from a material system which absorbs wavelengths in the visible spectrum, such as Si, and the other diode ($D_1$) is formed from a material system which absorbs wavelengths in the UV to IR spectrum, such as HgCdTe. The numerals correspond to the various parts of the physical embodiment, which will be explained in FIG. 4A. They are included here in order to further explain how the electrical diagram relates to the physical structure. FIG. 3B shows the photodetector diagram in an array. FIG. 3B is intended to show a more generalized schematic of an array, rather than one which is specific to any particular configuration, and the numerals are therefore not included. If included, the numerals could be placed in each pixel the same way as they are in FIG. 3A. The invention in FIG. 3A can be formed in a large number of different ways. Some will be described in detail below as examples, but these embodiments should not be viewed as the only possibility. As long as the two diodes are connected in parallel, their p and n layers can be in whatever configuration is desired, including configurations which utilize multiple layers.

Additionally, while $D_1$ or $D_2$ generally refer to one diode each in the embodiments below, this should not be viewed as a limitation. They are illustrated this way for ease of explanation only. Instead, it should be interpreted as meaning "at least one diode." in this way, there are possible embodiments which utilize several diodes in series, and then the $D_1$ series and $D_2$ series are connected in parallel.

Figure 4A:
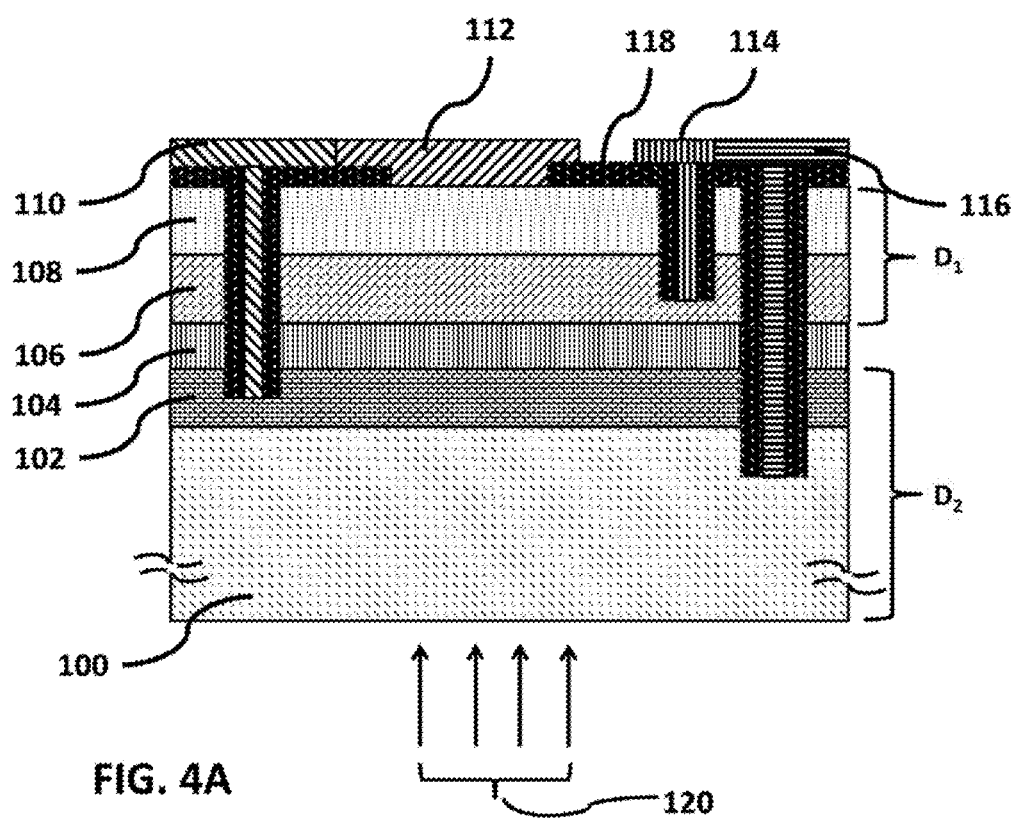
FIG. 4A is an example of a physical embodiment for the invention shown in FIG. 2A

FIG. 4A depicts an embodiment, according to this invention, of a bottom-illuminated image sensor pixel utilizing two terminals, which places two diodes in parallel in the same monolithic structure. As an example of one of many possible configurations consistent with FIG. 3A, here the structure is based on $D_1$ and $D_2$ placed in parallel. First, $D_2$ is formed by starting with an n-doped substrate, 100. Si is the most common choice for this, since it is both cost-effective and it absorbs the desired wavelengths. Either as part of the substrate by dopant diffusion, or a different material on top of that substrate is a p-layer, 102, thereby forming a p-n junction and absorbing the wavelengths up to 1 μm.

Although Si is listed here as the most common and desirable material, there are several others which may be used as a semiconductor substrate. For example, GaAs, InP, Ge, GaSb, ZnCdTe, or CdTe may be used as well. For some of these alternate materials, though, the spectral detection ranges might overlap significantly with the range from the other device, and so it might be best to flip the structure so that the radiation strikes the top rather than the substrate first.

In order to reduce the lattice mismatch between the two devices' materials, a buffer 104 can be placed upon $D_2$. This buffer might be one single layer, a single graded layer, multiple layers, multiple graded layers, superlattice layer, or any combination of the above. Additionally, if the materials chosen for layers 102 and 106 have no (or very little) lattice mismatch, a buffer layer may not be necessary at all. Considering the common materials for $D_1$ and $D_2$ absorption, however, this is fairly unlikely. For simplicity, 104 is shown as a single layer. For instance, if Si is used as the substrate and $D_2$, and HgCdTe is used as $D_1$, then the buffer region could be two layers; CdTe connected to Si, then CdSeTe on top of that connecting to the HgCdTe. On top of this buffer layer (s) $D_1$ is formed. The bottom layer of this diode, connected directly to the buffer, is n-doped 106. Finally, the topmost layer is p-doped 108.

In order to connect the diodes in parallel, two common metal contacts (or terminals) are used, and kept electrically isolated from each other. These contacts can be made from several materials. For example, but not to be construed as a limitation, if the diode is formed from HgCdTe, the p contact could be In or Au, and the n contact can be Au. For a diode formed from InSb or GaInP the p contact might be an Au:Zn alloy. Ni:Au, or stacked layers of Ti/Pt/Au, and the n contact might be an Au:Ge alloy, Ni:Au, or stacked layers of Ti/Pt/Au. If the diode is formed from Si, then either contact can be Al, Cu, TiW, CuW, or SeW. If the invention is being flipped so that the radiation strikes the top rather than the substrate first, the metal contacts can instead be fabricated from transparent materials in order to prevent absorption of the wavelengths of interest. Such contacts can be formed from Indium-Tin-Oxide, Titanium Oxide, Tin-Oxide, or Zinc-Oxide.

The first p-contact, 110, extends through the layers of the structure to connect 102, and is electrically isolated from layers 100, 104, 106, and 108 with a non-conducting material, or dielectric, 118. Alternatively, it may instead connect to buffer layer 104 (not shown here). The second p-contact, 112, can be either an extension of 110 or a separate material. This material sits atop the structure, connecting 108 to contact 110. The first n-contact, 114, extends through the layers of the structure to connect 106, and is electrically isolated from 108 by the same non-conducting material 118, or different non-conducting material (not shown here). The second n-contact can either be an extension of 114 or a separate material, 116. This contact extends down to connect 114 to 100, and is isolated from 102, 104, 106, and 108 by the non-conducting material, 118. Using this configuration, when photons 120 strike the bottom surface of the structure, the $D_2$ diode will absorb the shorter wavelengths (e.g. UV or visible spectrum), allowing all others to pass through, and the $D_1$ diode will absorb the longer wavelengths from the upper limit of the $D_2$ diode's absorption range up to LWIR. Also note that the insulator, 118, can be all one material-type, or different insulators can be used in combination which is not shown here. For instance, one insulator might be used to surround contact 110, and another insulator type to surround contacts 114 and 116. One could also split it further, and use a different insulator for each contact, or multiple insulators for each contact.

Figure 4B:
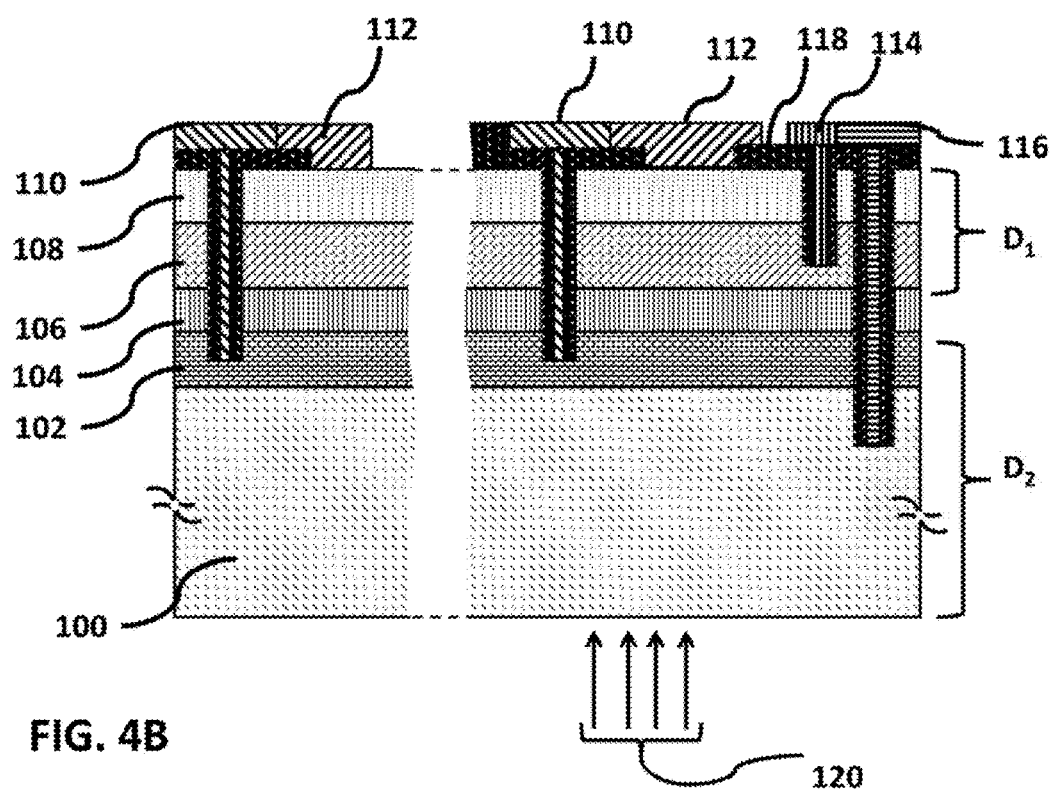
FIG. 4B is an array of pixels according to FIG. 3A.

FIG. 4B is a schematic showing an array, created using the detector in FIG. 4A. All of the materials are the same, so explanation of the numerals is omitted here. To create the array, here the n-contact is the common one. All layers are extended out, and multiple p-contacts are inserted, all electronically isolated from each other. In this way, multiple pixels can be formed on a common wafer and can be made into a photodiode array wherein each diode is independently operated.

Figure 4C:
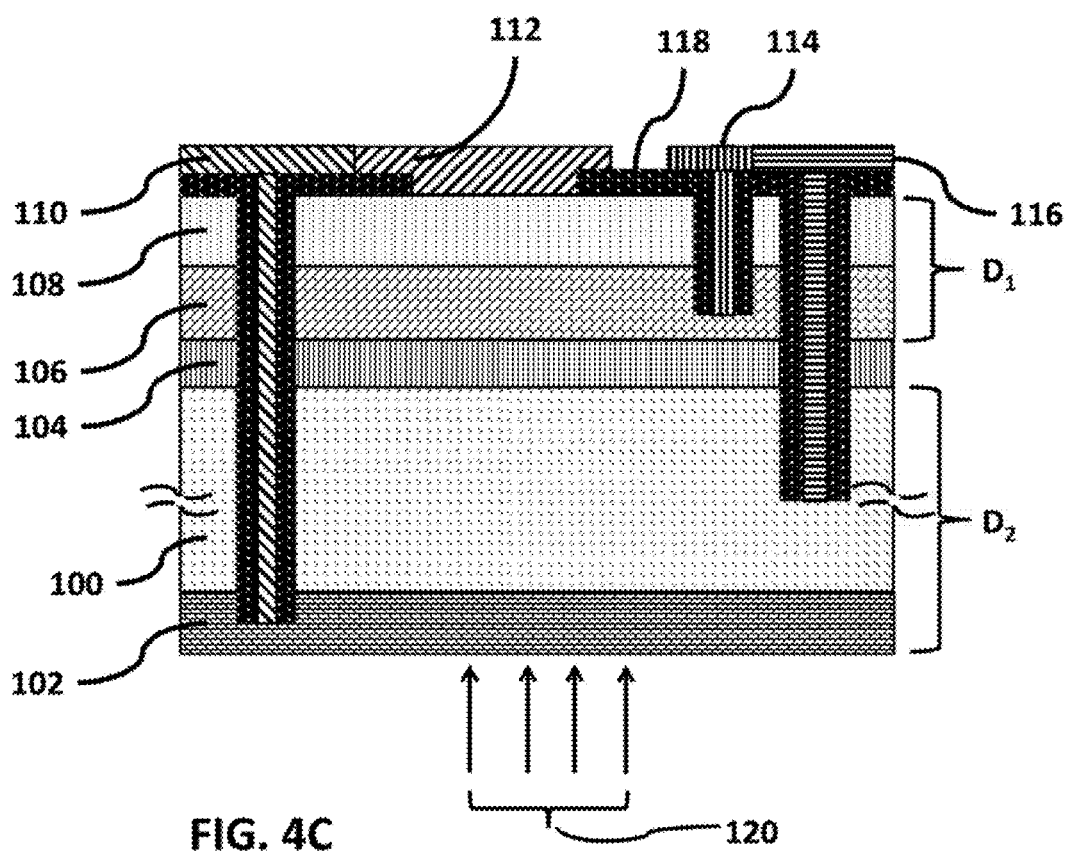
FIG. 4C is an alternate embodiment of FIG. 2A.

FIG. 4C is an alternate configuration, included to illustrate that there are many possible physical configurations in order to achieve the basic setup in FIG. 3A. In this example, the $D_2$ diode is formed by putting p-doped layer 102 on the bottom, instead of forming it on top of the n-doped substrate 100. In order to accommodate this, the depths of the contacts have also been altered so that 110 and 112 are connected to the p-layers while 114 and 116 are connected to the n-layers. This means 116 is shorter here than in FIG. 4A, and 110 is longer. Likewise, it is possible to reverse the p-layer and n-layer of $D_1$ (so that 106 is on top, and 108 below it), and move the contacts accordingly.

It is also important to note that the invention can be formed by reversing the locations of $D_1$ and $D_2$. Alternatively, the structure can be oriented instead so that the radiation strikes the top rather than the bottom. In this case, it would be particularly important to use transparent materials for the contacts and insulator 118.

Although the general structure above is described as using the substrate to form part of the $D_2$ diode, this is not required. Not shown in the Figures, an alternate embodiment is to use a dielectric material or metal as a substrate instead. Such a dielectric material could be glass, sapphire, polymer, or any transparent conductive material oxide (such as InSnOx). In this case, the substrate would be a separate layer from $D_2$, rather than being integrated. Additionally, the "substrate" may consist of more than one layer itself. For example, one could use glass as the substrate and InSnOx as the transparent conducting layer, then form CdTe and ZnS on top to create $D_2$. Similarly, a semiconductor material can be used for the substrate, but then kept separate instead of incorporating it into one of the devices.

Figure 5:
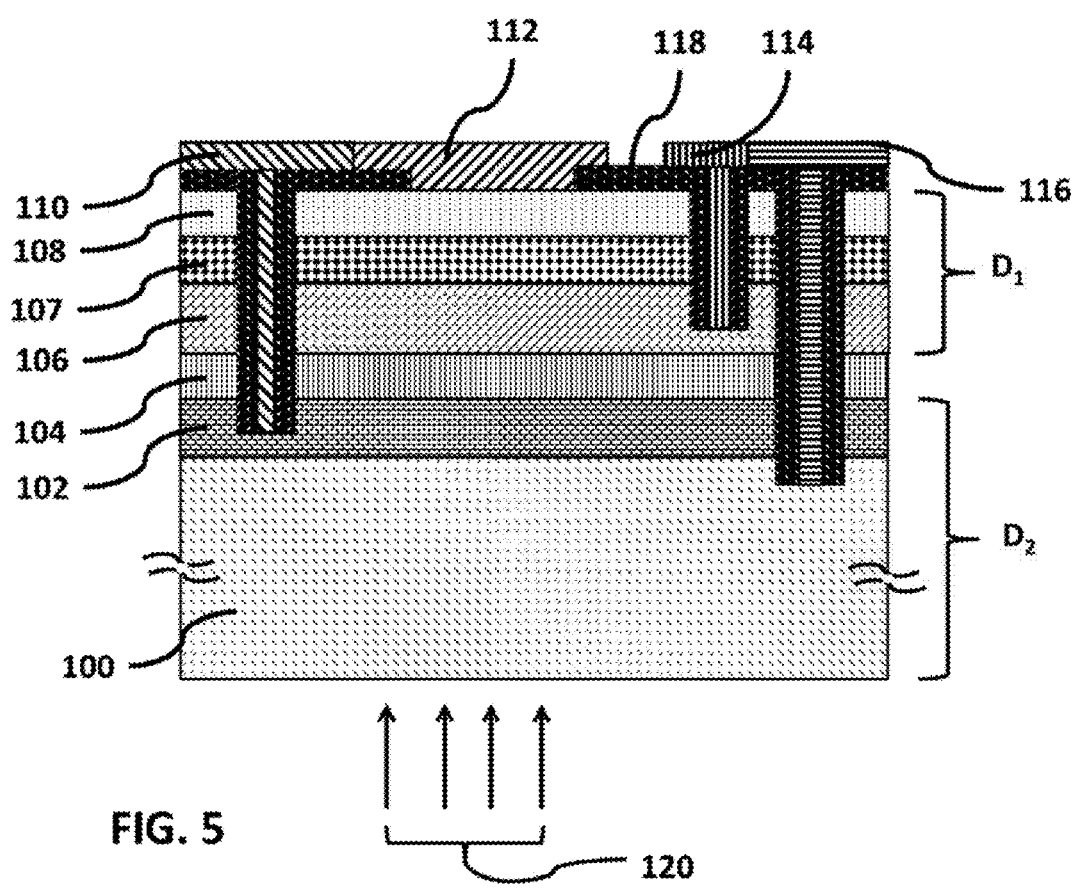
FIG. 5 is an alternate embodiment of FIG. 2A, where $D_1$ is a p-i-n photodiode rather than a p-n diode.

FIG. 5 is the embodiment from FIG. 4A, but utilizing a p-i-n junction in the $D_1$ diode rather than a p-n junction. To illustrate this, all of the numerals from FIG. 4A have been repeated so that repeated explanation has been omitted to avoid redundancy. Only difference is that an i-layer 107 has been added. This layer is formed from an intrinsic semiconductor material. For ease of explanation, most embodiments described hereafter will include this extra 107 layer, though this should not be interpreted as a limitation on those embodiments. Similarly, but not shown here, an i-layer can also be included in the $D_2$ diode, as a layer between 100 and 102. To illustrate the fact that the i-layer is optional in both diodes, this layer will not be shown in $D_2$ for most embodiments.

Figure 6A:
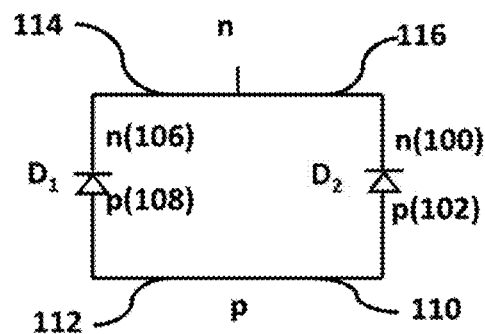
FIG. 6A is an alternate embodiment where two photodiodes are placed in parallel, but with the directions reversed from where they were in FIG. 3A.
Figure 6B:
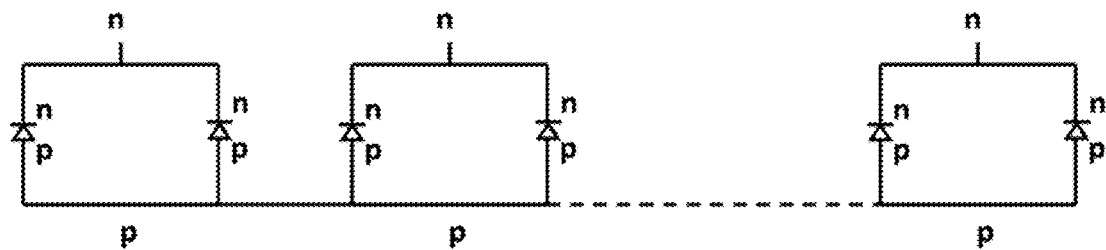
FIG. 6B shows the alternate embodiment from 5A placed in an array, where the common contact is p-doped rather than n-doped.

FIGS. 6A and 6B illustrate a device where the p-contact is used as the common contact in an array, rather than the n-contact as in FIG. 3B. This embodiment is an example, not to be construed as a limitation, illustrating one of the many combinations possible with this invention. The numerals are included to clarify how this diagram relates to the physical structure shown in FIG. 7A and FIG. 7B. Here, the diodes have merely been flipped so that the n and p sides are reversed from where they were in FIG. 3A.

Figure 7A:
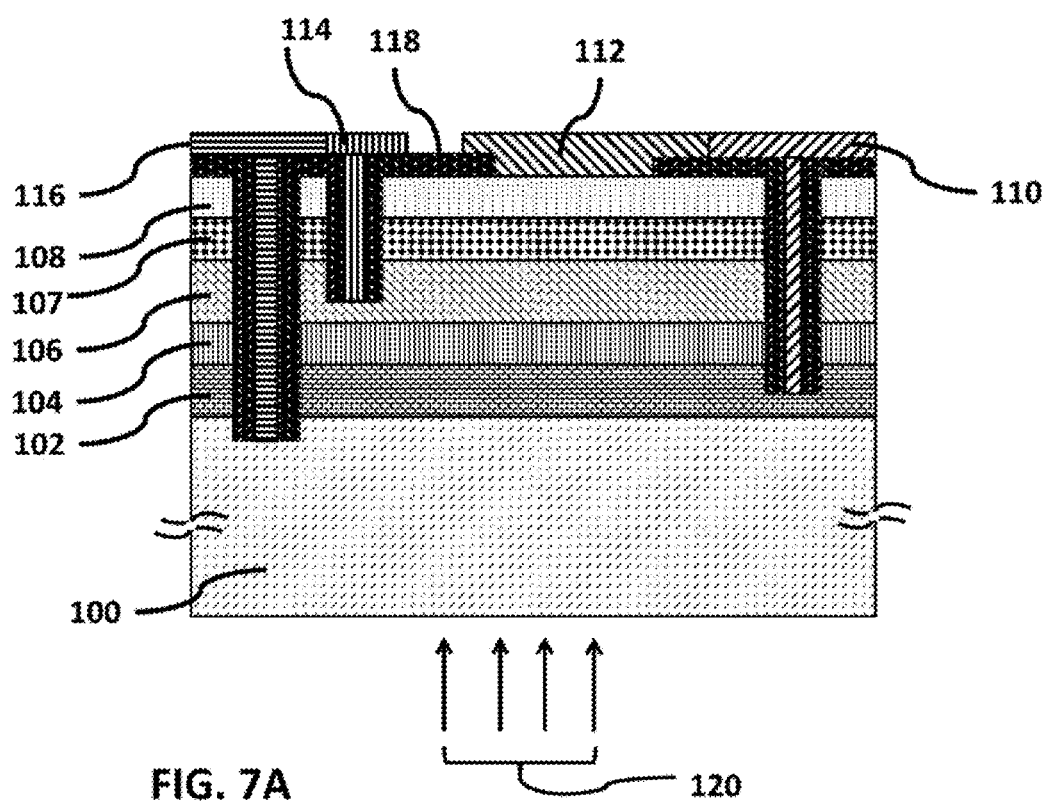
FIG. 7A shows an example embodiment of the invention described in FIG. 5A.
Figure 7B:
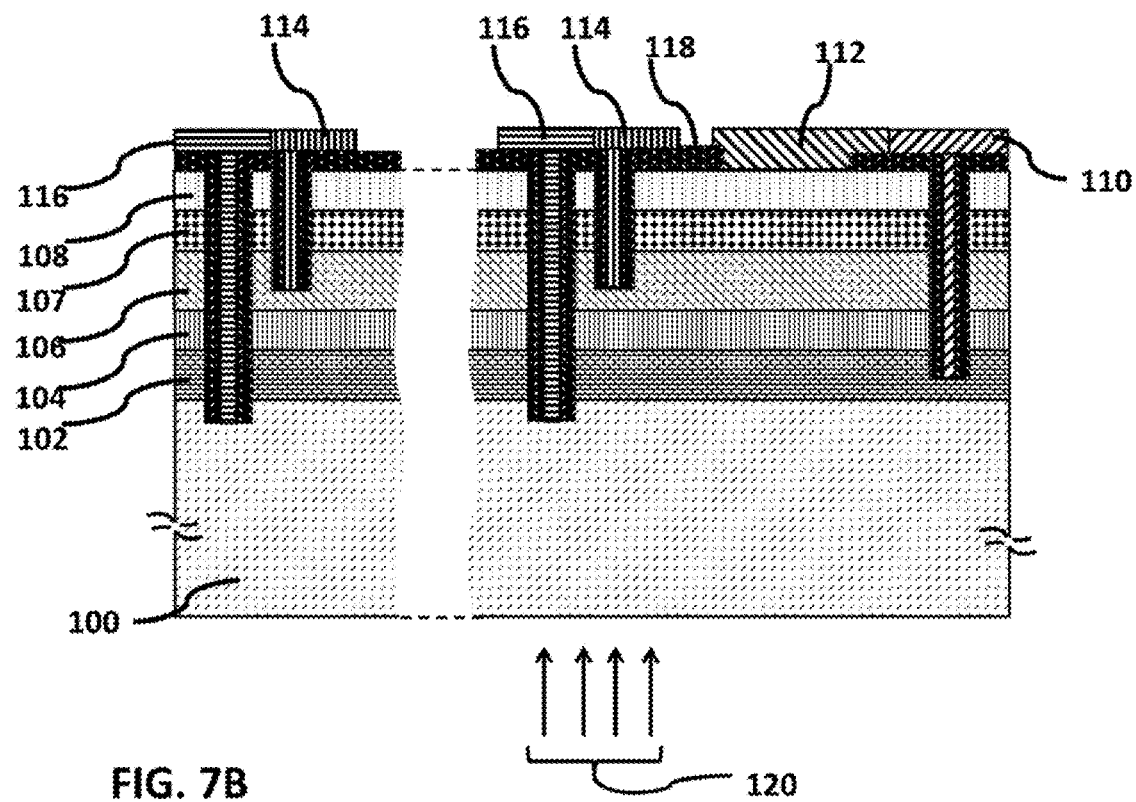
FIG. 7B shows the structure in FIG. 6B placed in an array.

FIG. 7A and FIG. 7B are the schematic showing the cross-sectional views of one of the configurations that can be used to achieve single detector and the array, shown in FIGS. 6A and 6B in accordance of this invention, wherein the same numerals as shown in FIG. 5, are the same parts so that repeated explanation is omitted here.

The only difference is that the placement of the p and n contacts have been switched horizontally. This way, when we extend the layers out to the right (for example), we can easily add more n-contacts in the middle, as shown in FIG. 7B. The array in FIG. 6B can also be created using a number of different techniques, including changing the order of the layers. For instance, one could create the array by swapping the p and n layers within each diode. So, in this example, the structure would comprise of layers from the bottom up: 102, 100, 104, 108, 107, and 106. For this configuration, the depths of the contacts will have to change as well in order for each contact to stay connected to the right layer, 110 would extend down further, while 112 would have to extend into the structure instead of sitting on top. It would also have to be insulated from layers 107 and 106, 114 would instead sit on top, while 116 would be slightly shorter. To form an array. The layers would be extended out, and multiple n-contacts would be inserted in the middle, electrically isolated from each other.

Figure 8A:
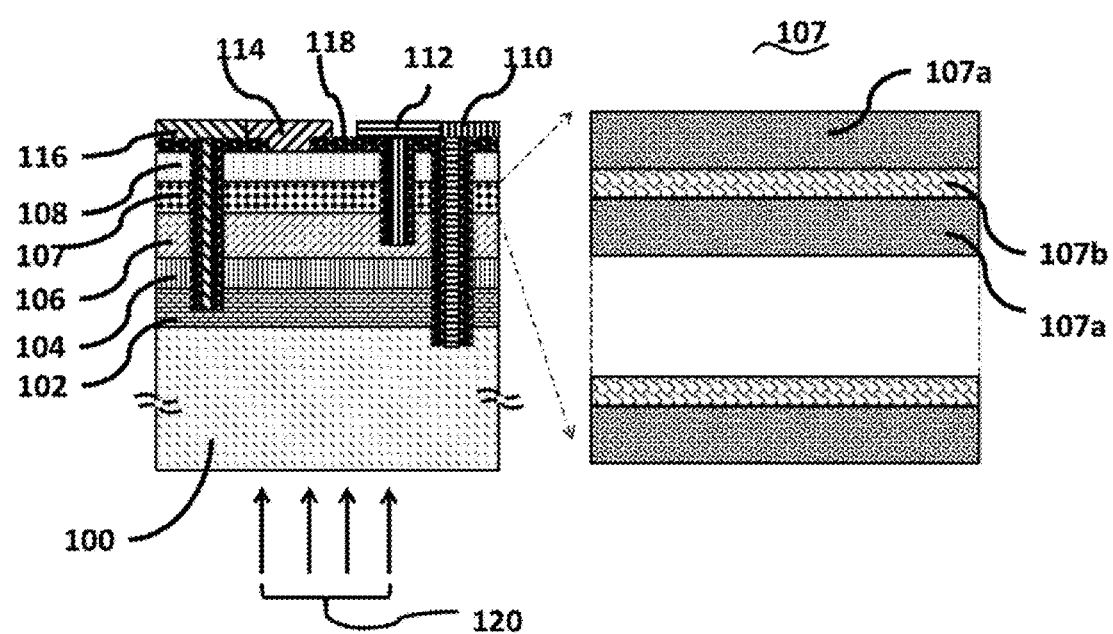
FIG. 8A shows an alternate embodiment utilizing a superlattice, to replace the i-layer.

FIG. 8A is the schematic showing cross-sectional view of detector according to this invention, wherein the same numerals as shown in FIGS. 5 and 7, are the same parts so that repeated explanations are omitted here. Only differences are that the i-layer 107 has been replaced with either a type I superlattice (otherwise known as a QWIP—quantum well infrared photodetector), a type II superlattice, or a type III superlattice. FIG. 8A shows only 3 layers, but in fact it is only a minimum. To form a superlattice, any odd number of semiconductor layers greater than or equal to 3 can be used. The dotted lines and additional two layers in the drawing are included to illustrate that any number of layers can be used, so long as they alternate, and the first and last layers are the same type. FIG. 8A shows the invention, and an additional close-up view of the superlattice. A superlattice forms a series of quantum potential wells, and allows the spectral response of the materials used to be adjusted depending on the thickness and doping used.

Figure 8B:
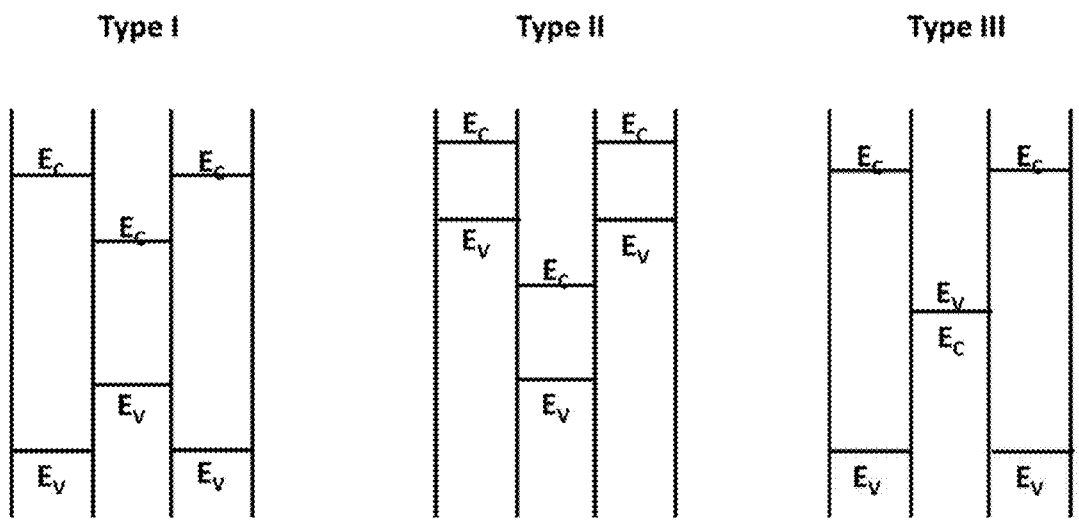
FIG. 8B is a diagram showing the band structure in the three different types of superlattices.

As shown in FIG. 8B, a QWIP refers to a type of superlattice formed when the 107a materials have a higher conduction band ($E_C$) than the 107b materials, and a lower valence band ($E_V$) than the 107b materials. In other words, the bandgaps are approximately aligned so that the conduction band of one layer does not overlap the valence band of the layers on either side of it, and vice versa. The example is AlGaAs (as 107a) alternating with GaAs (as 107b). Although identical materials can be used for each 107a or 107b layer (homostructure), it is not required. One can instead create a heterostructure by using different materials for each 107a layer and each 107b layer. What matters is that the valence and conduction bands line up approximately as shown in FIG. 8B. A type II superlattice, on the other hand, is one where the 107a material has conduction and valence bands that are both higher than the conduction and valence bands in the 107b material. This means that the valence and conduction bands overlap with the bands in the materials on either side. The type II superlattice is created using GaSb or GaInSb as the 107a material and InAs as the 107b material. A type III superlattice is created by alternating materials which do not have band symmetry. This is done by using a semimetal which has a negative bandgap. Alternatively, this can also be achieved by using a semiconductor which has zero bandgap. A common material pairing for this is CdTe and HgTe.

Figure 9A:
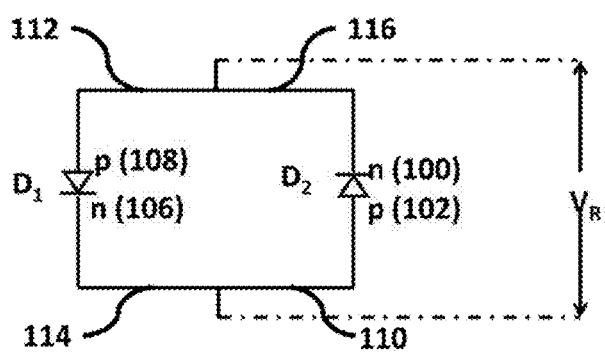
FIG. 9A shows a circuit diagram of an alternate invention, where two detectors are connected in parallel, but one diode is oriented in the opposite direction from the other (forming a diode ring).
Figure 9B:
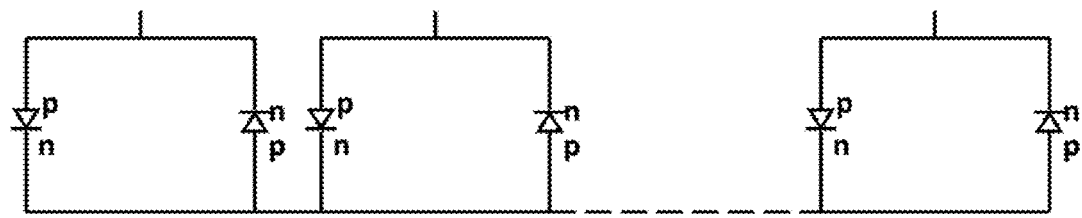
FIG. 9B shows the invention in FIG. 9A in an array.
Figure 9C:
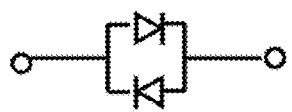
FIG. 9C is a schematic showing the circuit diagram a diode ring.
Figure 9D:
FIG. 9D is a schematic showing two diodes connected in back to back.
Figure 9E:
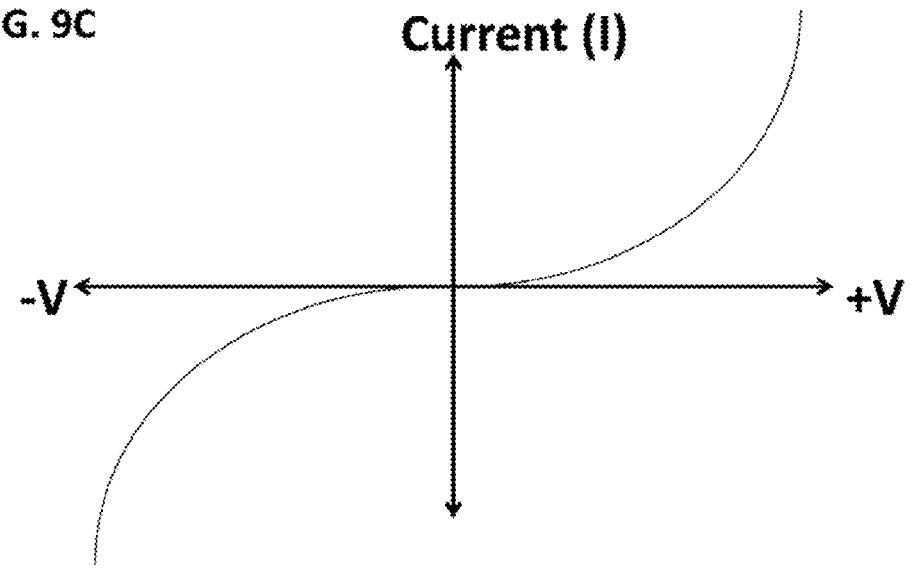
FIG. 9E is a graph showing generally how diode rings and diodes placed back to back behave.

FIG. 9A shows the circuit diagram of one of the alternate embodiments of the invention. According to this embodiment, the two diodes are arranged in parallel, but instead of connecting their n and p contacts to the like version, they are connected to the opposite in what is called a "diode ring." The n contact of $D_2$ is connected to the p contact of $D_1$, and vice versa. In this way, only one diode acts at a time, and you can control which diode is operating by applying either a reverse or forward bias. FIG. 9B shows diode rings in an array. FIG. 9C shows a schematic of diodes which are put in parallel, but in opposite direction. Alternatively, the same effect can be achieved by placing the two diodes back-to-back, as shown in FIG. 9D. The graph shows an idea of what happens when a bias is applied to a diode ring. When a forward bias, +V is applied, one diode detects and creates current as shown in the upper right quadrant of the graph. If, instead, a reverse bias is applied (−V), then the other diode detects and creates a current as shown in the lower left quadrant.

Figure 10A:
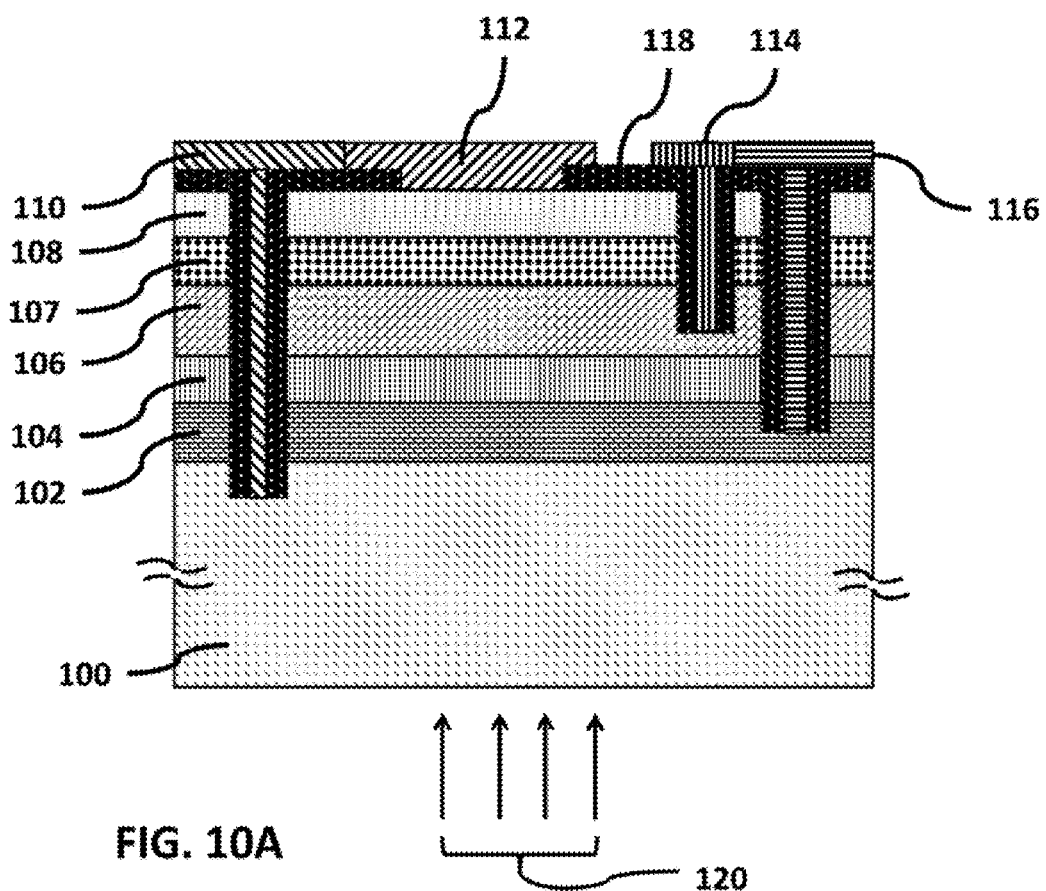
FIG. 10A is a schematic showing cross-sectional view of a detector shown in FIG. 9A, according to this invention.
Figure 10B:
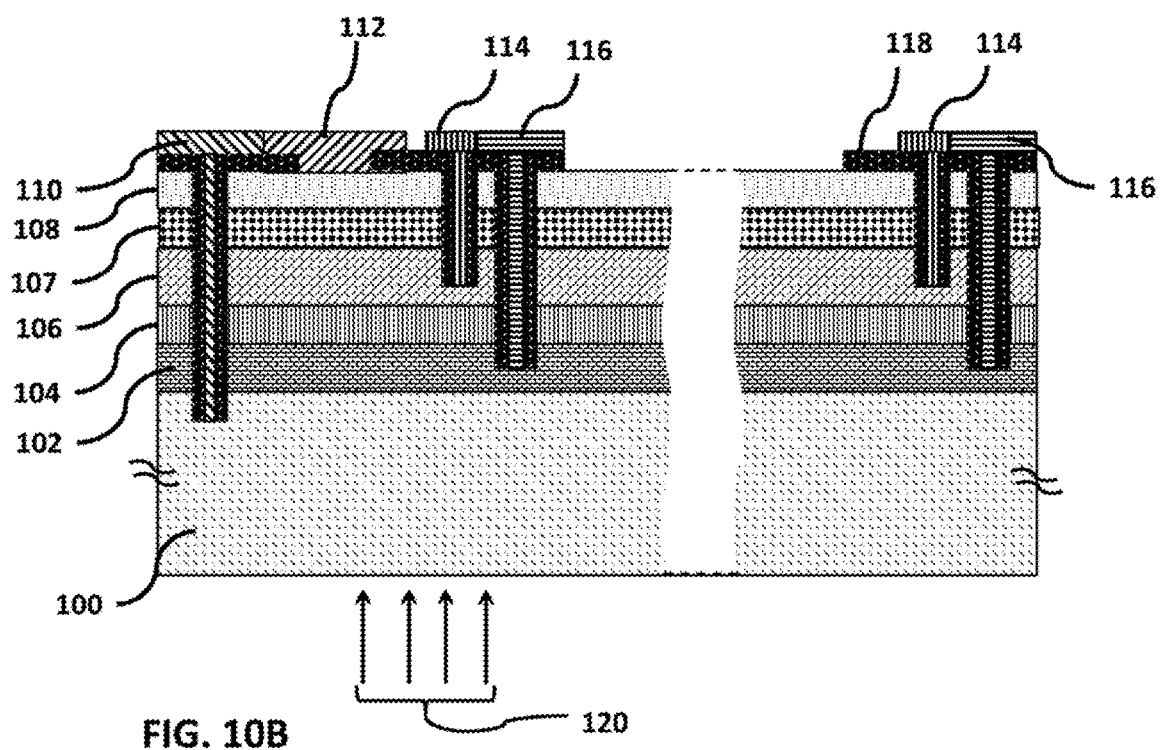
FIG. 10B is the schematic showing the cross-sectional view of detector array, single element of which is shown in FIG. 10A, according to this invention.

FIG. 10A is a schematic showing a cross-sectional view of a detector to achieve a same functionality of FIG. 9, by altering only the depths of the p and n contacts, according to this invention. Note also that the materials used for those contacts may have to be changed depending on the materials used for the layers, as discussed earlier in reference to FIG. 4A. This alternate embodiment can be achieved in any number of ways, such as adjusting the locations of the various layers. For example, one could flip the location of the n-layer and p-layer in $D_1$. This would result in the layers being, from the bottom up, 100, 102, 104, 108, 107, and 106. The contacts could then remain in the same locations, although their materials might have to be changed depending on what materials are used for the layers. FIG. 10B is a schematic showing the cross-sectional view of detector in array.

Figure 11A:
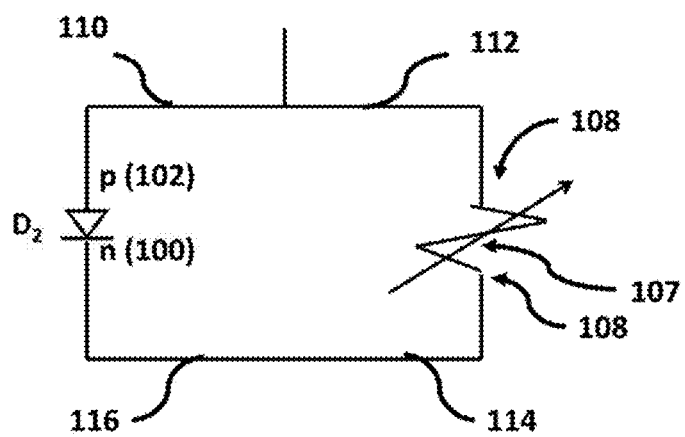
FIG. 11A is an alternate invention where one photodiode and one photoconductor are placed in parallel.
Figure 11B:
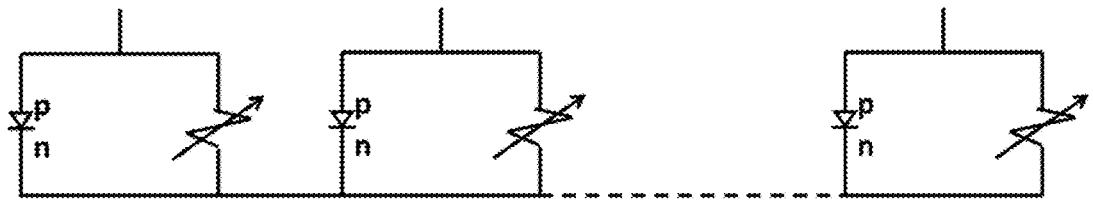
FIG. 11B shows the invention in FIG. 11A in an array.

FIG. 11A shows an alternate embodiment where one of the diodes (shown here, $D_1$) is replaced by a photoconductor, according to this invention wherein the same numerals shown previously are the same parts, so that repeated explanations are omitted here. A photoconductor according to this invention, as opposed to a photodiode, is similar in structure but rather than being a p-i-n junction, it comprises a three-layer doped structure, where the two outside structures are the same type. For example, if the two outside layers are n⁺ doped, then the middle layer can be i, p⁻, or n⁻ doped. If the outer layers are p⁺ doped, then the middle layer can be i, p⁻, or n⁻ doped. With this structure, the photoconductor still acts as a detector, but it is also a resistor whose resistance decreases as the incident radiation intensity increases. While the two outside layers must be doped the same way, they may still be different materials (either homostructure or heterostructure). In this embodiment, since $D_1$ is being replaced, the photoconductor would be made from a material system which absorbs the same approximate wavelength spectrum. The numerals shown in FIG. 11A illustrate the p-i-p version only, where 108 is one p-layer. The zig-zag symbol with the arrow cutting through it is the symbolic representation of a variable resistance (i.e. variable photoconductor). FIG. 11B shows this alternate embodiment in an array.

Figure 12A:
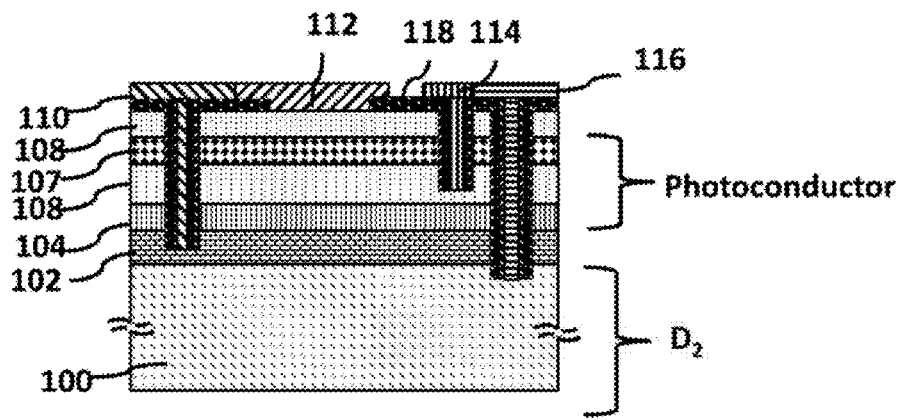
FIG. 12A shows an example of a physical embodiment of the invention in FIG. 11A, utilizing a p-i-p photoconductor.
Figure 12B:
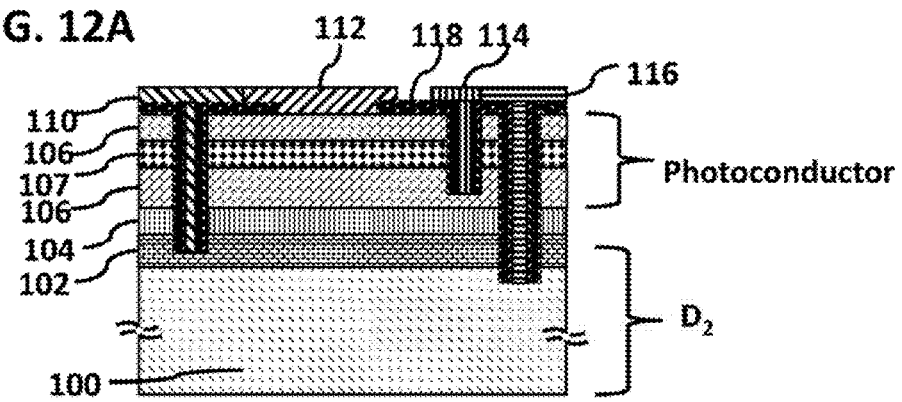
FIG. 12B shows an example of a physical embodiment of the invention in FIG. 11A, utilizing an n-i-n photoconductor.

FIG. 12A shows an example embodiment of the invention described in FIG. 11A, according to this invention, wherein the same numerals shown in FIGS. 5, 7, 8, and 10 are the same parts, so that repeated explanations are omitted here. In this version, the $D_1$ diode is replaced with a photoconductor. This can be achieved in several ways, but this embodiment as an example shows where the n-layer, 106, has simply been replaced with another layer of the p-layer 108, creating a p-i-p photoconductor. FIG. 12B shows an alternate version where, instead, the p-layer 108 has been replaced with an additional n-layer, 106, creating an n-i-n photoconductor. These embodiments are only examples. As mentioned in the discussion of FIG. 11A, they need not utilize an i-layer, but can instead omit it or replace it with another layer (such as n⁻ if the outer layers are n⁺). Additionally, the two n or p layers need not be made from the same material. They need only be doped the same way, as explained earlier.

Figure 13A:
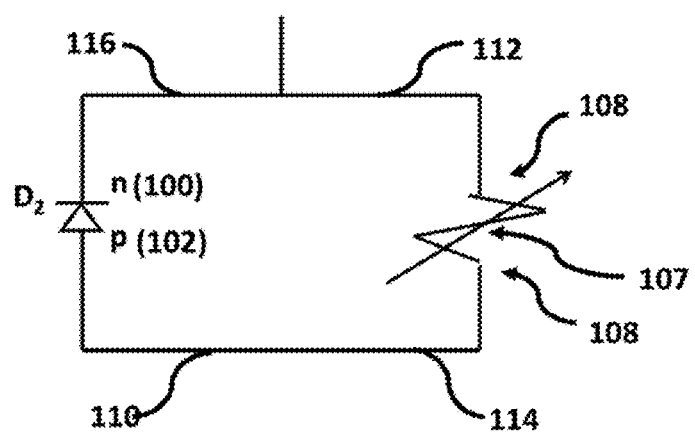
FIGS. 13A and 13B show an alternate invention, similar to 11A and 11B, except where the photodiode's direction is reversed so that the p-contact is the common contact rather than the n-contact.
Figure 13B:
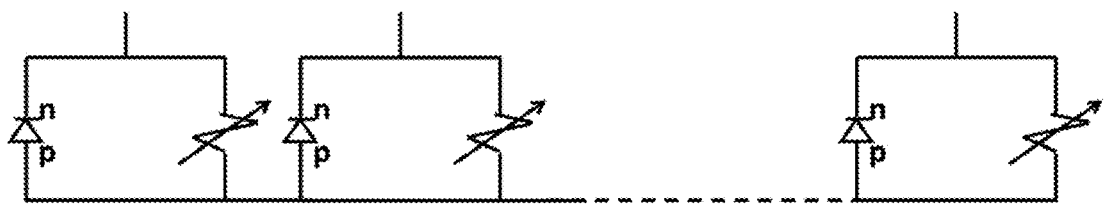

FIG. 13A shows an alternate device to 11A, where the p and n contacts are reversed. In this way, as FIG. 13B shows, the array would use a common p contact rather than n contact. Once again, the zig-zag/arrow symbol is utilized to represent a variable photoconductor.

Figure 14A:
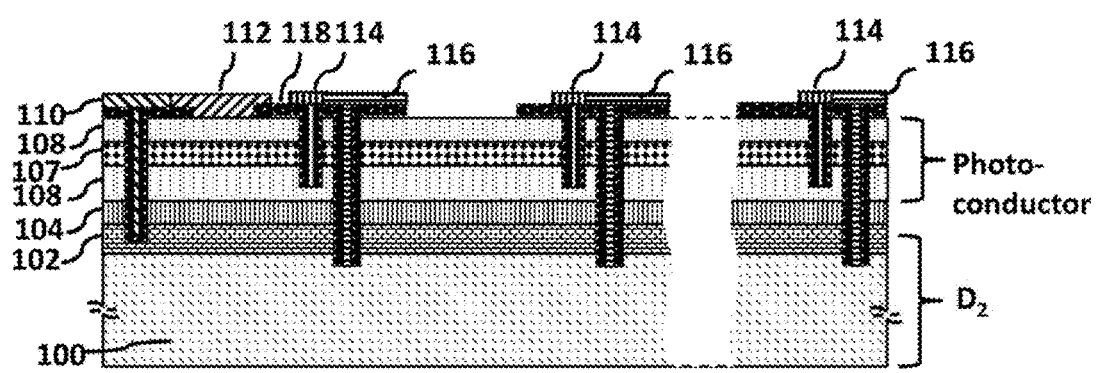
FIG. 14A is an example of an array using the invention in 13A, where the photoconductor is firmed from a p-i-p structure.
Figure 14B:
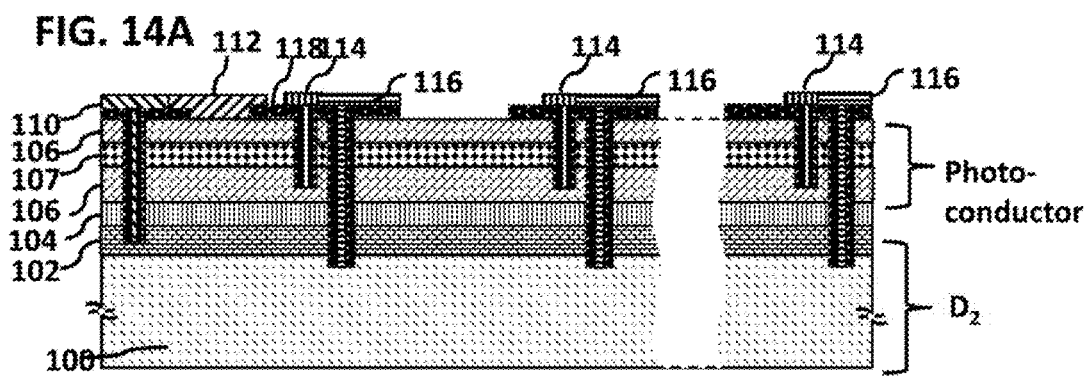
FIG. 14B is an example of an array using the invention in 13A, where the photoconductor is formed from an n-i-n structure.

FIGS. 14A and 14B are the schematics showing the cross-sectional views of array (representation of 13B), respectively, according to this invention, wherein the same numerals shown in FIGS. 5, 7, 8, and 10 are the same parts, so that repeated explanations are omitted here. 14A shows the p-i-p device, and 14B shows the n-i-n device. Explanations of the numerals have been omitted to avoid repetition.

Figure 15A:
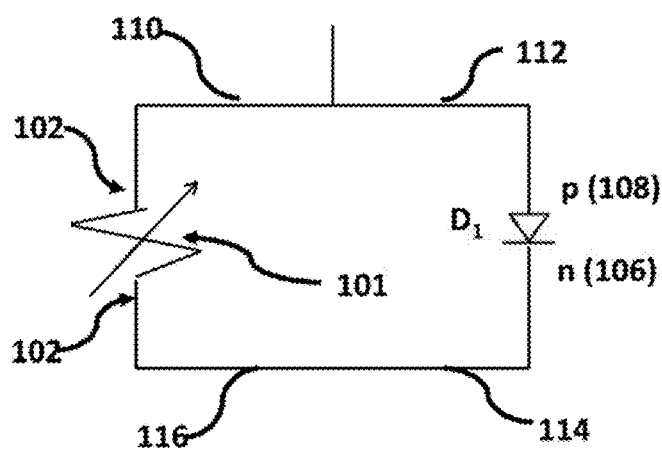
FIGS. 15A and 15B show the same invention as in 11A and 11B, except where the other photodiode is replaced with a photoconductor instead.
Figure 15B:
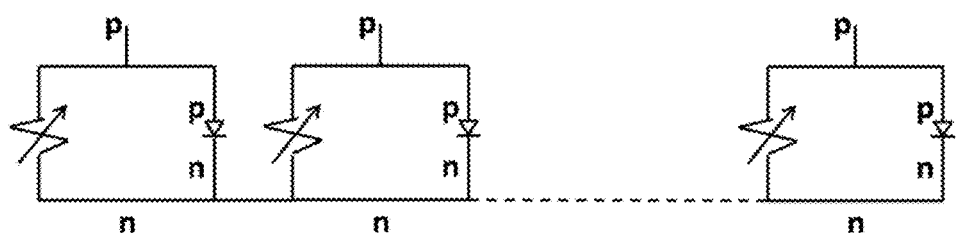

FIG. 15A shows a device similar to 11A, except where $D_2$ is replaced by a photoconductor, and $D_1$ remains as a photodiode. The same description of photoconductor structure applies here, and so is omitted. The numerals correspond to the p-i-p structure only. 15B shows this alternate embodiment in an array.

Figure 16A:
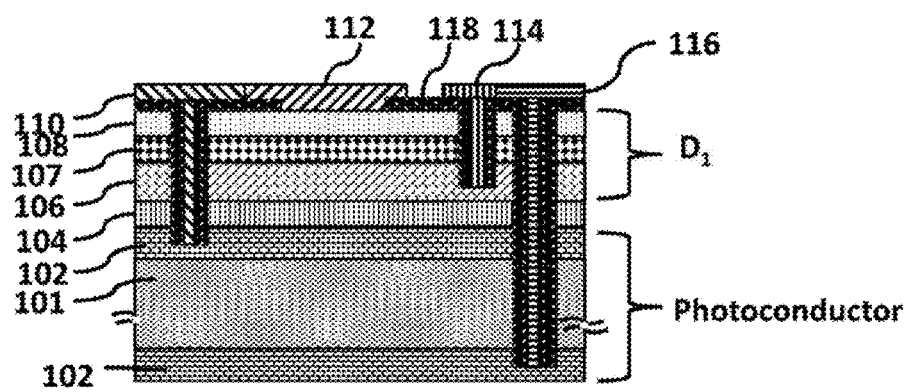
FIG. 16A is an example of a physical structure for the invention in FIG. 15A, where the photoconductor is formed from a p-i-p structure.
Figure 16B:
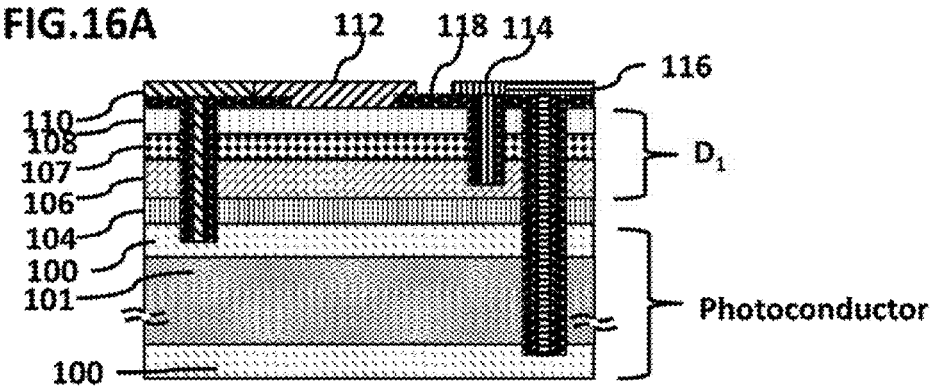
FIG. 16B is an example of a physical structure for the invention in FIG. 15A, where the photoconductor is formed from an n-i-n structure.

FIG. 16A shows an example of a physical embodiment of the device described in FIG. 15A. In order for this to work, an additional i-layer needs to be added to the embodiment, shown here as 101. This is typically done by using the same substrate as a base, and doping it to create the three layers. In this version, the n-layer, 100, has been replaced with an additional p-layer, 102, forming a p-i-p photoconductor. In FIG. 16B, instead the p layer 102 has been replaced with an additional n layer 100, creating an n-i-n photoconductor. As with embodiment 12A and 12B, these are merely examples. The i layer may be replaced with something different, and the two outer layers need not necessarily be identical. For example, one could create a p⁺-p⁻-p⁺ conductor, where the outer layers were different materials. Also like those embodiments, it would be a simple matter to arrange these embodiments in a similar array, using either the n or p contact as the common one. This array is omitted to avoid needless repetition.

Figure 17A:
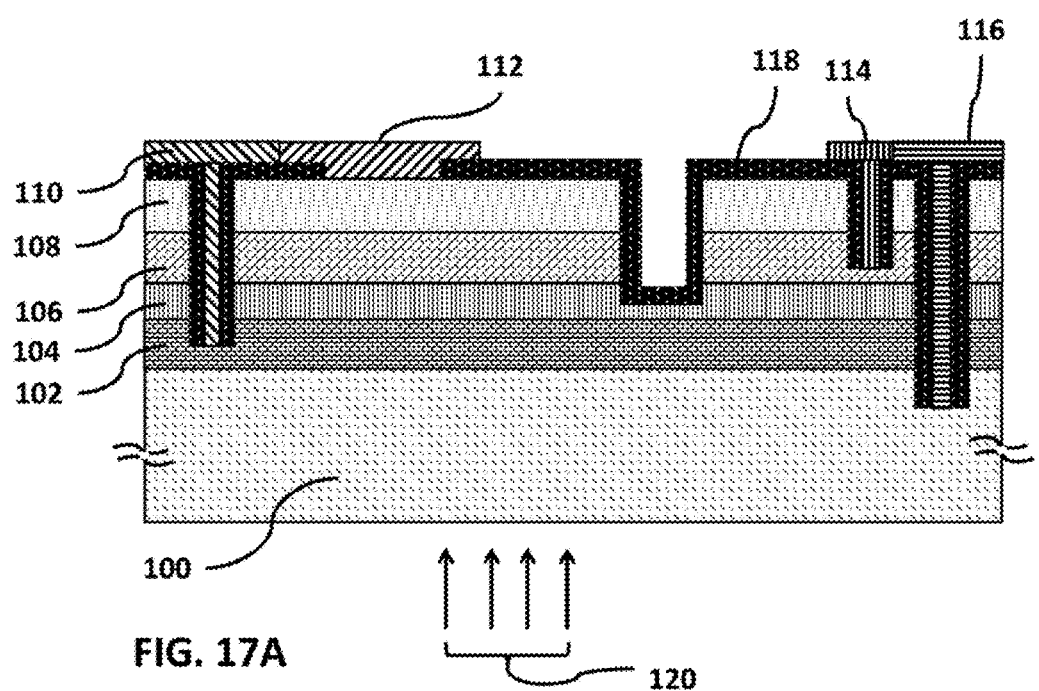
FIG. 17A shows an alternate embodiment where an insulated gap is introduced between the p and n contacts.
Figure 17B:
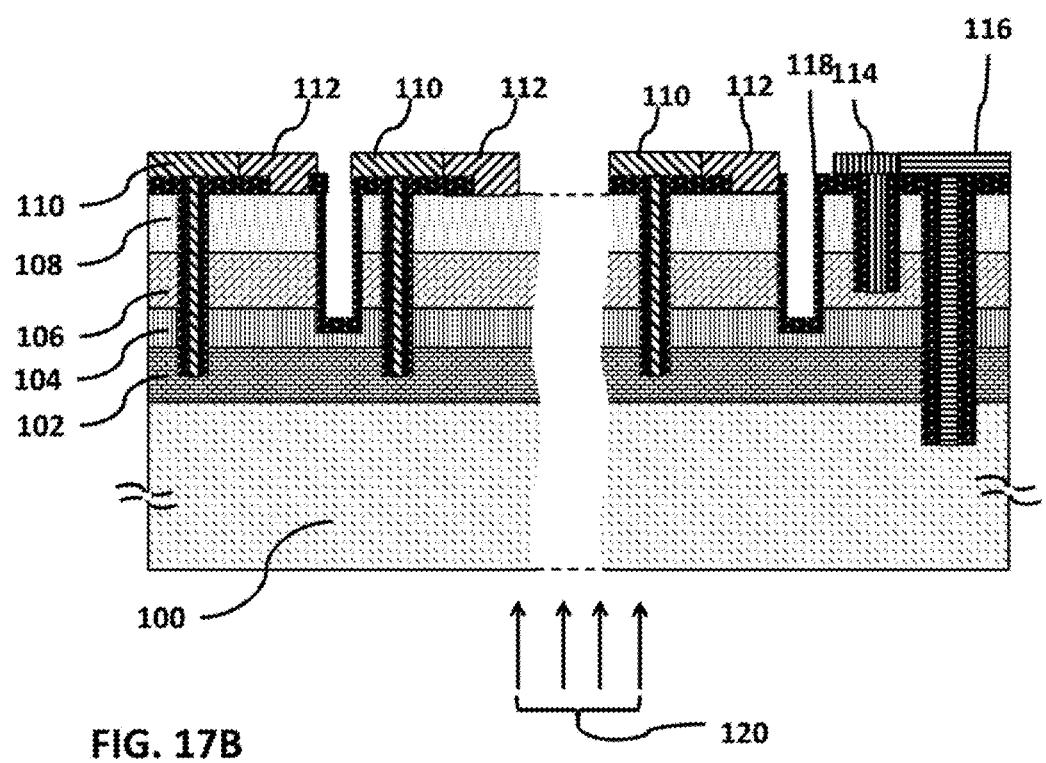
FIG. 17B shows this embodiment placed in an array.

In order to reduce noise (cross-talk) across pixel to pixel or in a single pixel to neighbourpixel, as well as noise across an image sensor array, an additional insulator can be added. FIG. 17A shows one such embodiment, where a small vertical section of layers 106 and 108 have been removed, and the gap lined with insulator 118. In this way, the n and p contacts are more completely isolated from each other. This embodiment shows the gap as completely empty, but it can alternatively be filled by some other insulating material, or completely by insulator 118. FIG. 17B shows how this noise-reducing gap would be implemented in an array.

Figure 18A:
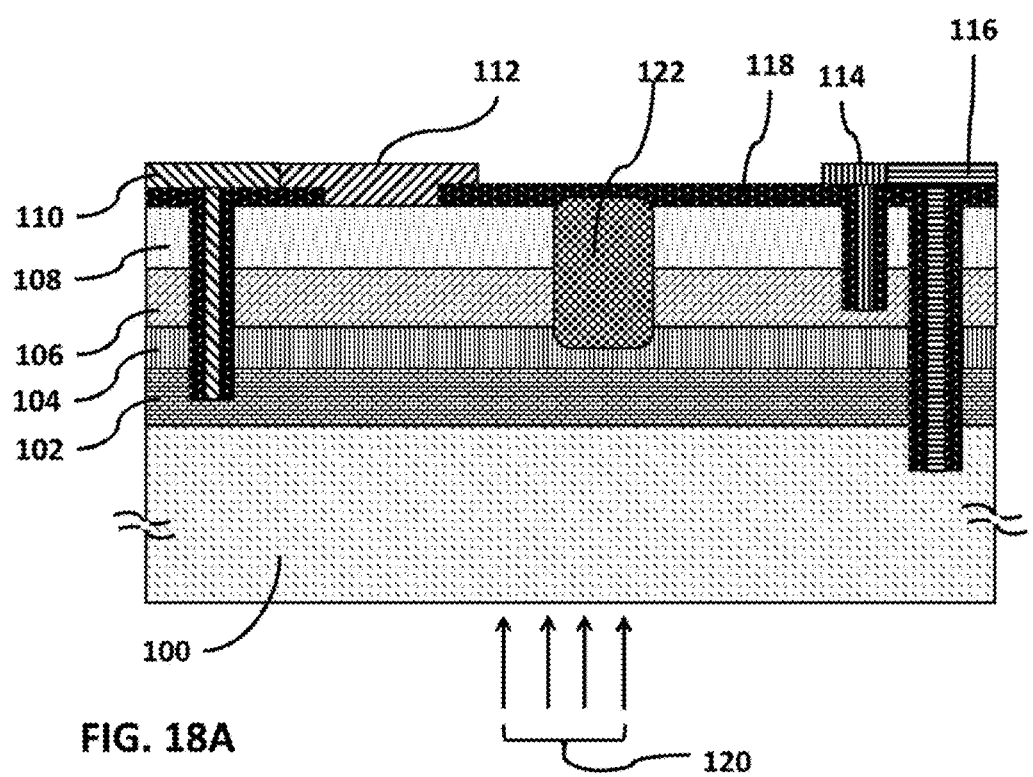
FIG. 18A shows an alternate embodiment where an ion-implanted region is inserted between the p and n contacts.
Figure 18B:
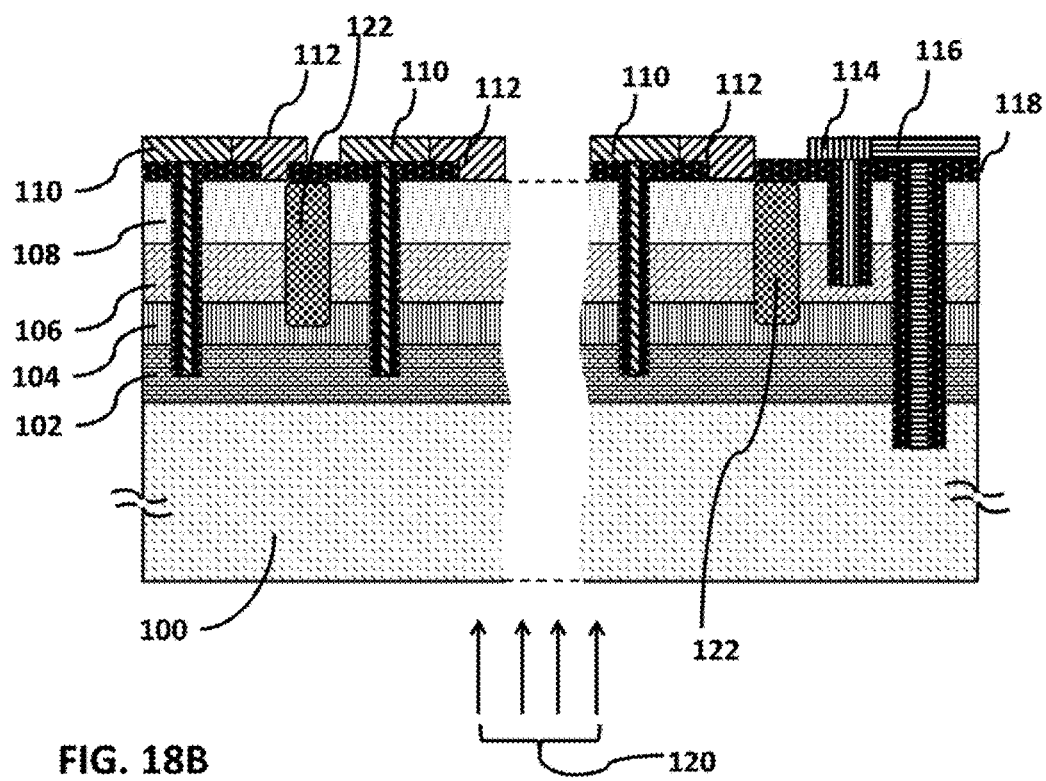
FIG. 18B shows this embodiment in an array.

FIG. 18A shows an alternate embodiment similar to 17A, but rather than using a gap or other insulator, this embodiment specifically utilizes material that has been ion implanted, 122. Such materials can make especially effective insulators. FIG. 8B is an example of an array made from the device shown in FIG. 18A.

In order to maximize efficiency, a common method is to utilize narrower bandgaps. However, the problem with this is that it creates extra dark current. Since the energy needed to jump from the valence band to the conduction band is so small, the electrons can sometimes gain the requisite energy from ambient heat instead of the absorbed photons, creating noise or "dark current." Up until recently, the only way to combat this problem was to operate image sensors in extremely cold temperatures. This solution is expensive and inconvenient, though. A new solution is what is known as the nBn detector. This detector is a heterostructure made from two n-doped semiconductor layers sandwiching a barrier layer which blocks dark current. This barrier layer's material is chosen for having a high conduction band compared to the materials in the n-layers.

Figure 19:
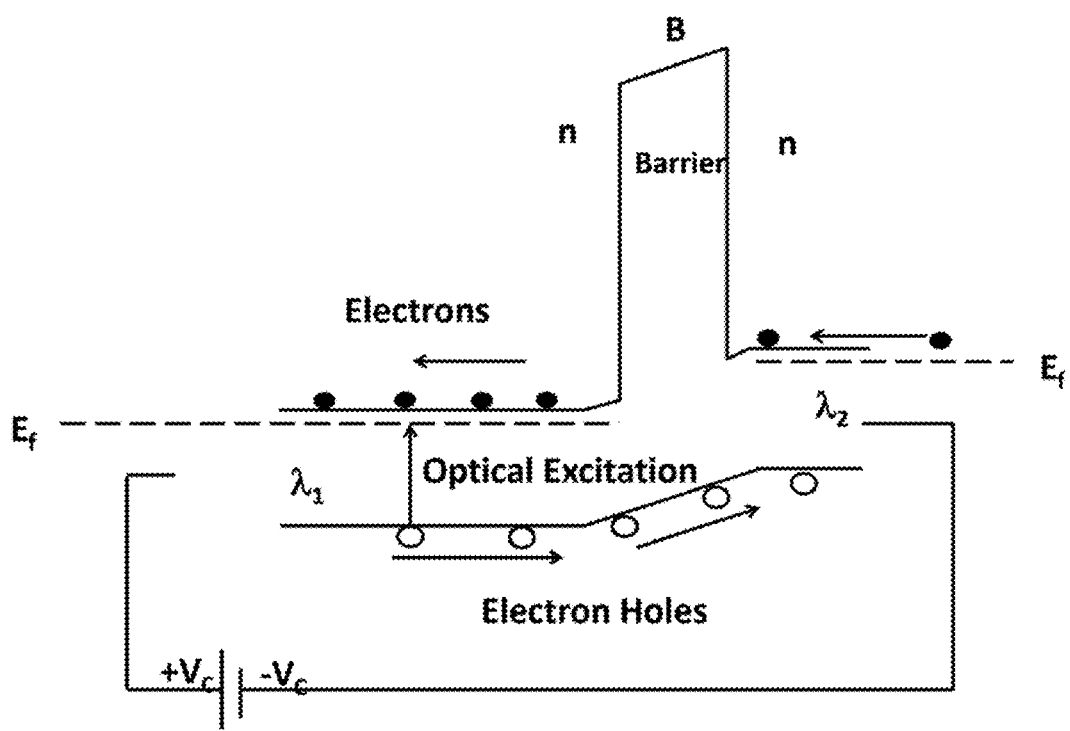
FIG. 19 is a diagram explaining the functionality of an nBn detector.

FIG. 19 is a schematic showing the band-diagram of nBn detector under light illumination. In this diagram, a reverse bias has been applied, and photons striking the system (not shown) cause the electrons to jump from the valence band to the conduction band, creating holes in the valence band. The n material to the left of the barrier absorbs photons in the wavelength $\lambda_1$ while the n material to the right of the barrier absorbs photons in the wavelength $\lambda_2$. In the case of this specific invention, those wavelengths are chosen in order to cover wavelengths from 1-15 µm, where $\lambda_2$ is a shorter wavelength than $\lambda_2$. The electrons and electron holes move in opposite directions, but the electrons are blocked by the barrier layer, allowing absorption of those that resulted from the photons of wavelength $\lambda_1$. If a forward bias were applied instead, then the electrons resulting from photons of wavelength $\lambda_1$ would instead be absorbed. This functionality is very similar to that of a p-i-n junction, where the i-layer blocks the majority carriers and allows the minority carriers to flow freely, but this structure does not result in the Shockley-Reed-Hall dark currents which are produced by the p-i-n structure.

In its most basic form, the nBn detector is fabricated using the same material system for both n-layers. In this way, the detector has the same absorption range regardless of whether a forward or reverse bias is applied.

Alternatively (not shown), it is possible to make a similar detector from a pBp structure. In this case, the electron holes are the majority carriers rather than the electrons, so the electron holes would need to be blocked coming from the material with the undesired wavelength absorption. Accordingly, the barrier layer would have to be formed from a material with a very low valence band as compared to the two p-layers. It is also possible to make a p-n structure with a barrier layer, but this construction is more difficult, and so will not be discussed in detail here except to mention it as a possibility.

Figure 20A:
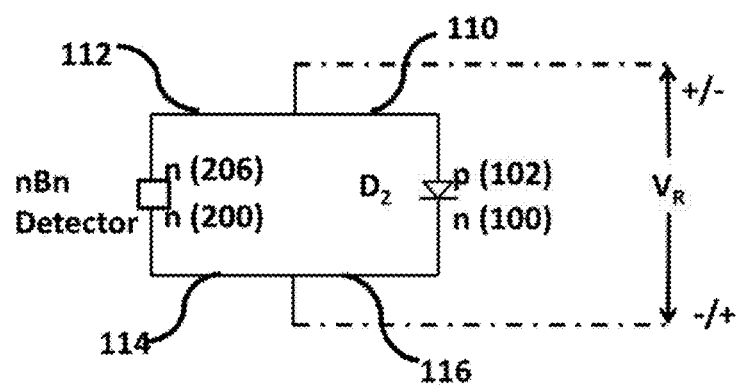
FIG. 20A shows an electric diagram of a photodiode placed in parallel with an nBn detector.
Figure 20B:
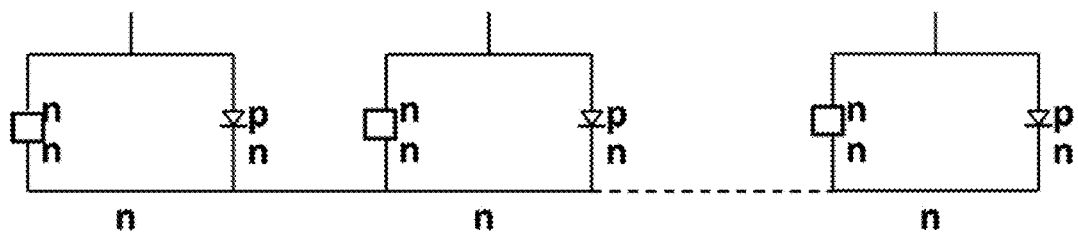
FIG. 20B shows this invention in an array.
Figure 21:
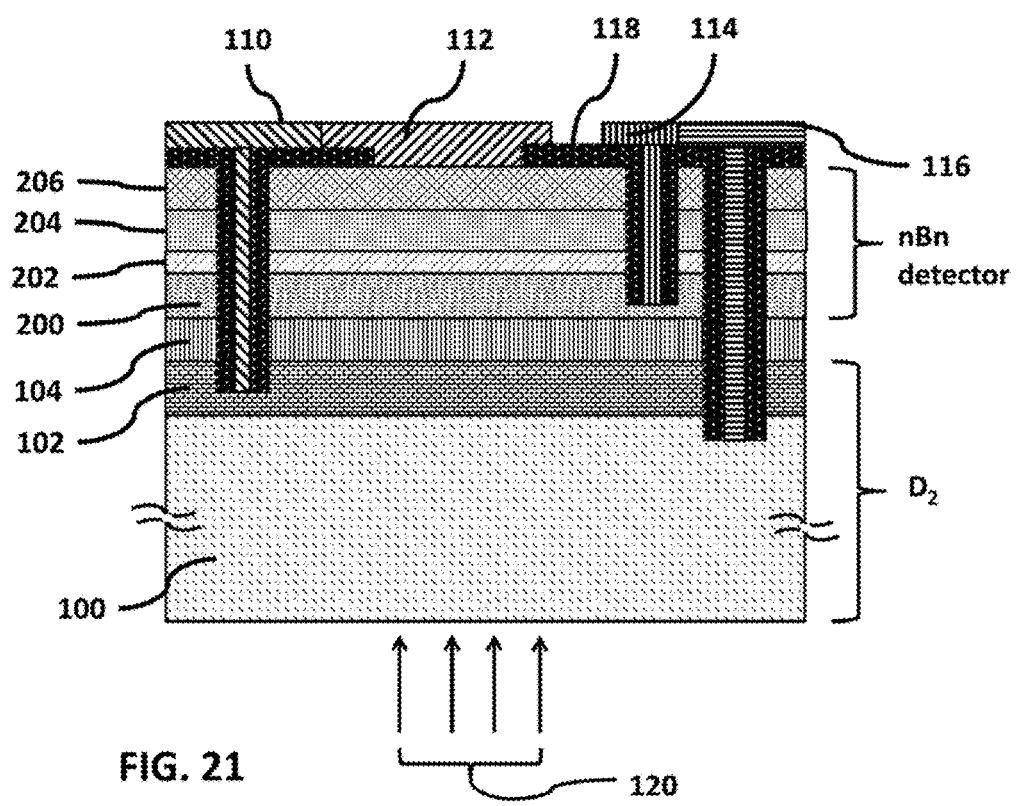
FIG. 21 is an example of a physical embodiment for FIG. 20A.

FIG. 20A shows an electrical diagram of how this nBn detector would be integrated into the current invention. In this embodiment, $D_1$ has been replaced with the nBn detector, while $D_2$ remains the same. The numerals have been added in order to clarify how this diagram would relate to the physical structure, as shown in FIG. 21. FIG. 20B shows how this embodiment might fit into an array using a common n-contact. Once again, the numerals have not been added to the array schematic in order to illustrate that the schematic is a general figure, and is not necessarily limited to the physical embodiment described below.

FIG. 21 shows one possible physical structure for the invention in FIG. 20A. As an example, but not a limitation, a possible way to construct a detector with an nBn detector and a $D_2$ detector in parallel, we have taken the structure in FIG. 4A and completely replaced the $D_1$ layers. In this embodiment, $D_2$ is constructed from a Si substrate, while the nBn detector is constructed from a HgCdTe system, 100 is the n-layer of Si, while 102 is the p-layer. Since this example utilizes materials which have significant lattice mismatch, at least one buffer layer, 104, is needed. In this specific example, CdTe is used. For the nBn device, a layer attached to the buffer is n-doped HgCdTe, 200. On top of this, an undoped barrier 202 is formed, and is extremely thin (typically not thicker than about 100 nm). In a HgCdTe system such as this one, the barrier layer(s) can be formed from CdTe, ZnCdTe, HgCdTe, or CdSeTe. On top of this barrier layer, another n-layer is formed from HgCdTe. Although only one such layer is needed, this embodiment includes, as an example, two layers, 204 is n⁻ doped, while 206 is n⁺ doped. Layer 200 could also have been split in a similar manner.

An additional use for the nBn structure is in dual-band detection, if the two n-layers are formed from materials with different absorption ranges. Usually in image detecting, in order to force pixels to detect only a specific wavelength range, external filters must be used. In a dual-band detector, one can control the spectrum which the detector absorbs without adding any new elements. In order to do this, an nBn, pBp, nBp, nB-i-p, or pB-i-n detector can be used, but nBn will be discussed as the example. For this to work, one of the n-layers would be grown from a material which absorbs wavelengths $\lambda_1$, and the second n-layer would be grown from a material which absorbs a different spectrum, $\lambda_2$. The B layer would be formed from a material which is transparent to the wavelengths of interest. With this construction, the detector will only absorb from one spectrum at a time, depending on whether a forward or reverse bias was applied. In this way, the pixel's absorption spectrum can be controlled merely by reversing the applied voltage, rather than applying or removing various filters.

Figure 22A:
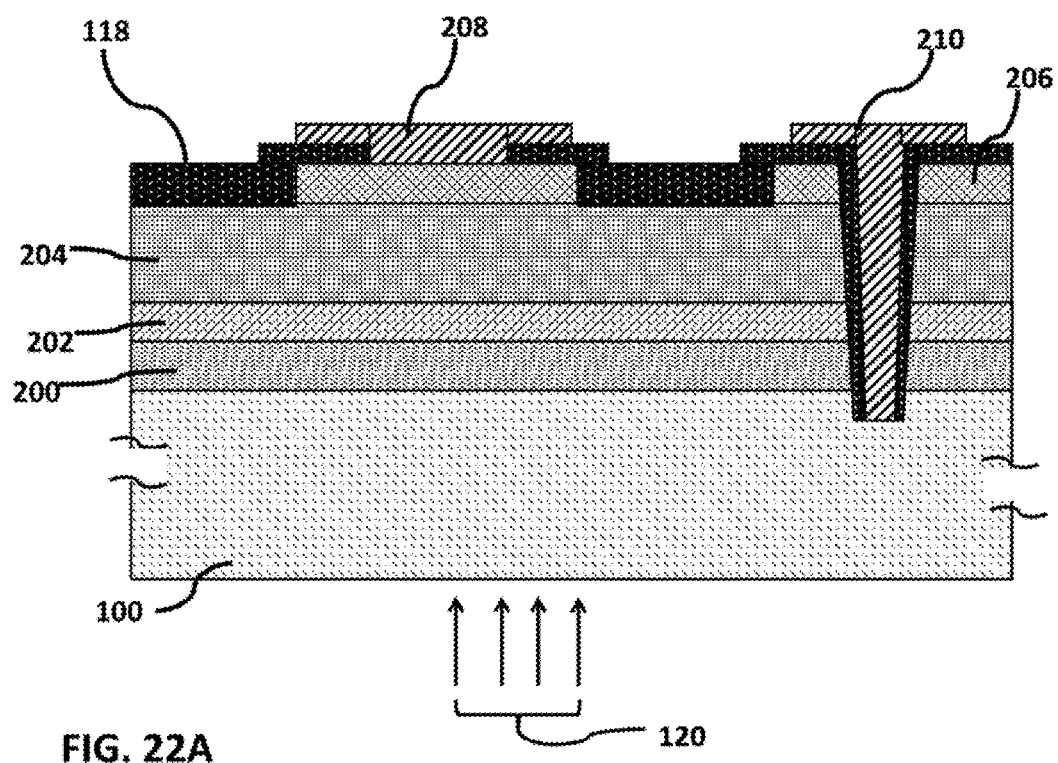
FIG. 22A is a general structure for a bottom-illuminated dual-band device

Dual bands detector is presented according to this invention in various structural forms. As an example, but not to be construed as a limitation, FIG. 22A shows the cross-sectional structure of the nBn device alone, as grown on an n-doped substrate 100, 200 is another n-layer, 202 is the barrier layer, and 204 and 206 are two more n-layers, 208 and 210 are the metal contacts for the device, insulated from each other by 118. Various specific material systems will be described below for forming detectors of different ranges. These are meant to be examples only. Unless otherwise stated, all layers in the FIG. 22A-E embodiments are doped the same way as explained previously.

Figure 22B:
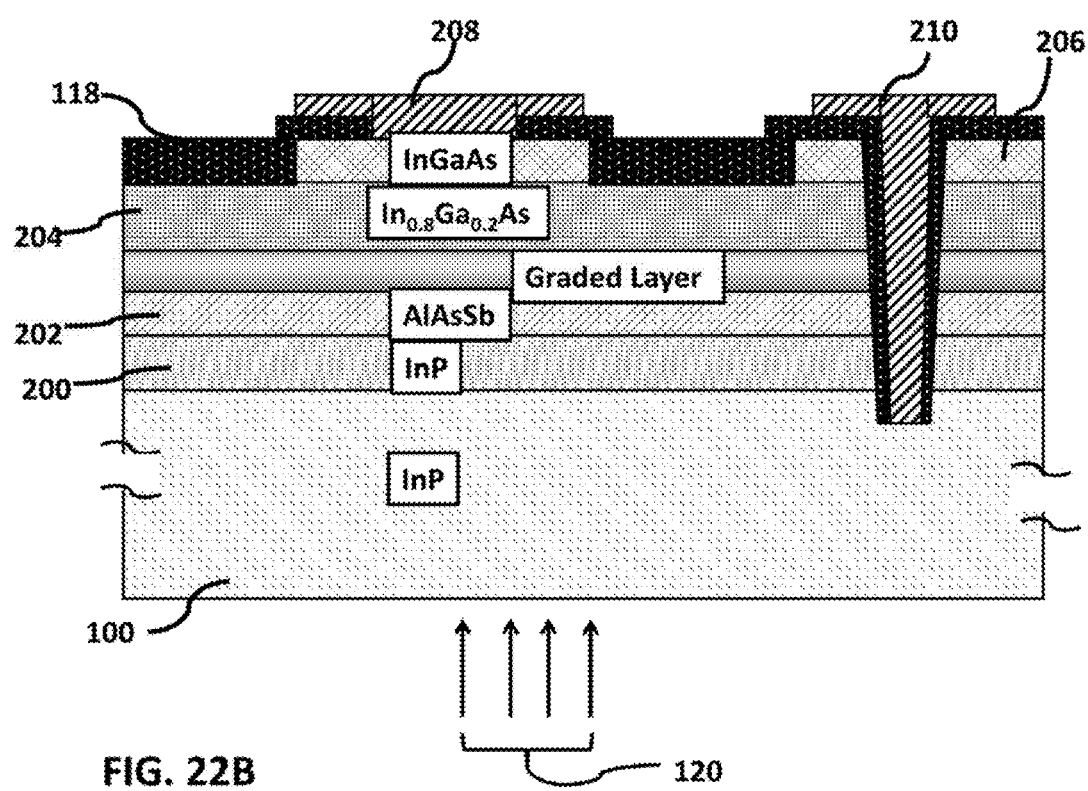
FIG. 22B-E are specific material examples for dual-band detectors

FIG. 22B shows a cross-sectional view of a dual-band detector which detects in the visible spectrum or the range from approximately 0.9 µm-3.1 µm. This embodiment could be formed from several materials grown on an n-doped InP substrate. After forming the epitaxial/dopant layers upon the substrate, the substrate can either be left alone, thinned, or removed entirely. Atop this substrate is another n-doped layer of InP which serves partially as an absorption layer, but also as a buffer in case there is some lattice mismatch between the substrate and the barrier. AlAsSb is chosen as the thin undoped barrier layer. As shown in FIG. 2, the AlAsSb barrier can be formed in a variety of ways, where the percentage of As and Sb varies the lattice constant. If the variation chosen lines up with InP, such as the one shown at 404, then no buffer is needed. Next, an n-doped graded layer is placed on the barrier layer to reduce lattice mismatch between it and the next layer. The next layer of the device is $In_{0.8}Ga_{0.2}As$, as shown in FIG. 2 by 402. Lastly, the top layer is n-doped $In_xGa_{1-x}As$. With this configuration, the InP substrate absorbs in the visible spectrum, while the InGaAs layers absorb in the 0.9 μm-3.1 μm spectrum.

The necessity of a buffer and graded layer depends on the percentage of As and Sb chosen in the barrier layer. As seen in FIG. 2, one would logically choose a percentage that falls somewhere on or between points 404 and 406. If 404 is chosen, then there is lattice match with InP and that buffer layer is not required. However, this causes a large mismatch between $In_{0.8}Ga_{0.2}As$ and the barrier, so a graded layer is needed there. This layer would consist of doped or undoped $In_{0.8}Ga_{0.2}As$ or AlAsSb, where the composition of the material is gradually changed as it is grown. This way, the surface which touches the barrier layer is lattice matched with it, and the surface which touches the $In_{0.8}Ga_{0.2}As$ layer is also lattice matched with that. If, however, 406 is instead chosen, then there is lattice match between it and $In_{0.8}Ga_{0.2}As$, and no graded layer is needed. Instead, the InP buffer or a graded layer of AlAsSb is needed between the substrate and the barrier. Alternatively, one can choose a form of AlAsSb that falls somewhere in the middle of 404 and 406. This would require both of the extra buffer layers. The buffer and/or grading layers as discussed here can be one or multiple layers.

Figure 22C:
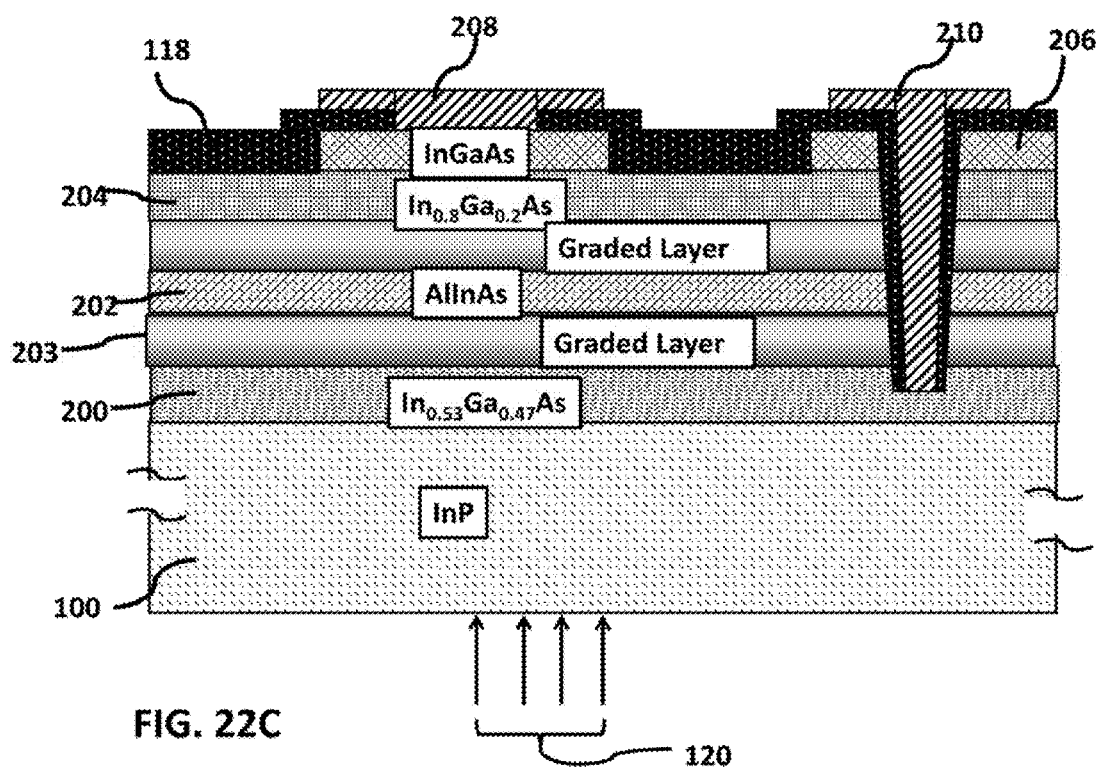

FIG. 22C shows an embodiment which absorbs in either the visible to 1.7 μm, or in the 1.7-3.1 μm range. This configuration is almost identical to that shown in FIG. 22B, except that the InP buffer layer has been replaced with a $In_{0.53}Ga_{0.47}As$ layer and the barrier material has been replaced with AlInAs. The replacement of the barrier layer is not needed, however. Since the conduction band for InGaAs is so much lower than InP, there are simply more choices for materials in the barrier layer. In this case, AlAsSb or AlInAs can be used, whereas only AlAsSb was available when InP acted as one of the layers touching the barrier. Since $In_{0.53}Ga_{0.47}As$ matches the lattice constant in the InP substrate and the barrier, no graded or buffer layer is needed between them. As discussed in the previous embodiment, here there might be need for two graded layers as shown in the figure. AlInAs can be made in a composition which lattice matches either $In_{0.53}Ga_{0.47}As$ or $In_{0.8}Ga_{0.2}As$. Depending on which composition is chosen, a graded or buffer layer is needed between the barrier and the unmatched material. Alternatively, if the barrier is of a composition that falls between the two lattice constants, both graded layers might be needed.

With the above configuration, the $In_{0.53}Ga_{0.47}As$ and InP layers absorb in the visible spectrum up to 1.7 μm. Alternatively, the InP substrate can be thinned or removed completely, which would result in the $In_{0.53}Ga_{0.47}As$ layer only absorbing in the 0.9-1.7 μm range. The InGaAs and $In_{0.8}Ga_{0.2}As$ layer would then absorb in the 1.7-3.1 μm range.

Figure 22D:
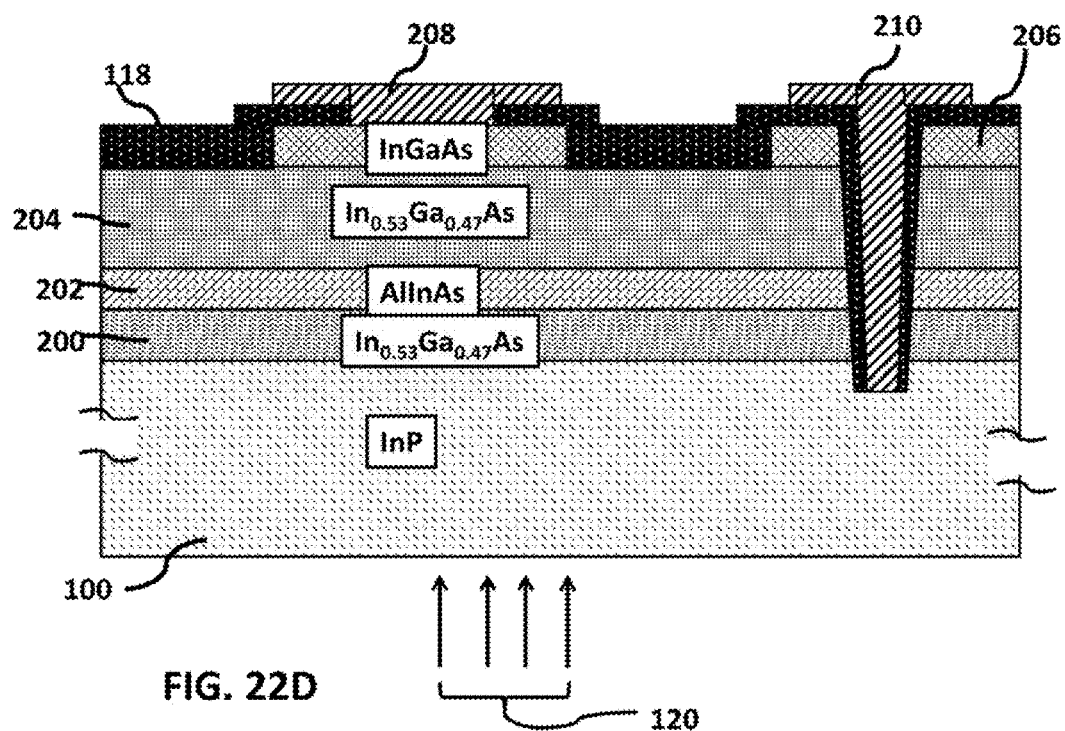

FIG. 22D shows a version of the dual-band detector which absorbs in either the visible to 1.7 μm spectrum or the 0.9-1.7 μm spectrum. This configuration is almost identical to the one in FIG. 22C, except that the $In_{0.8}Ga_{0.2}As$ layer is replaced with a $In_{0.53}Ga_{0.47}As$ layer. In this version, no grading layers are needed at all. Since the layers in direct contact with the barrier are exactly the same, the AlInAs or AlAsSb barrier can be chosen to have a lattice match with both those layers. In this way, the InP and bottom $In_{0.53}Ga_{0.47}As$ layer absorb in the visible spectrum up to 1.7 μm, while the top $In_{0.53}Ga_{0.47}As$ and InGaAs layers absorb in the 0.9-1.7 μm. Alternatively, the InP substrate can be thinned or removed completely. This would mean that the bottom layers only absorb in the 0.9-1.7 μm range, though, and would render this embodiment to be a single-band detector rather than a dual-band detector.

Figure 22E:
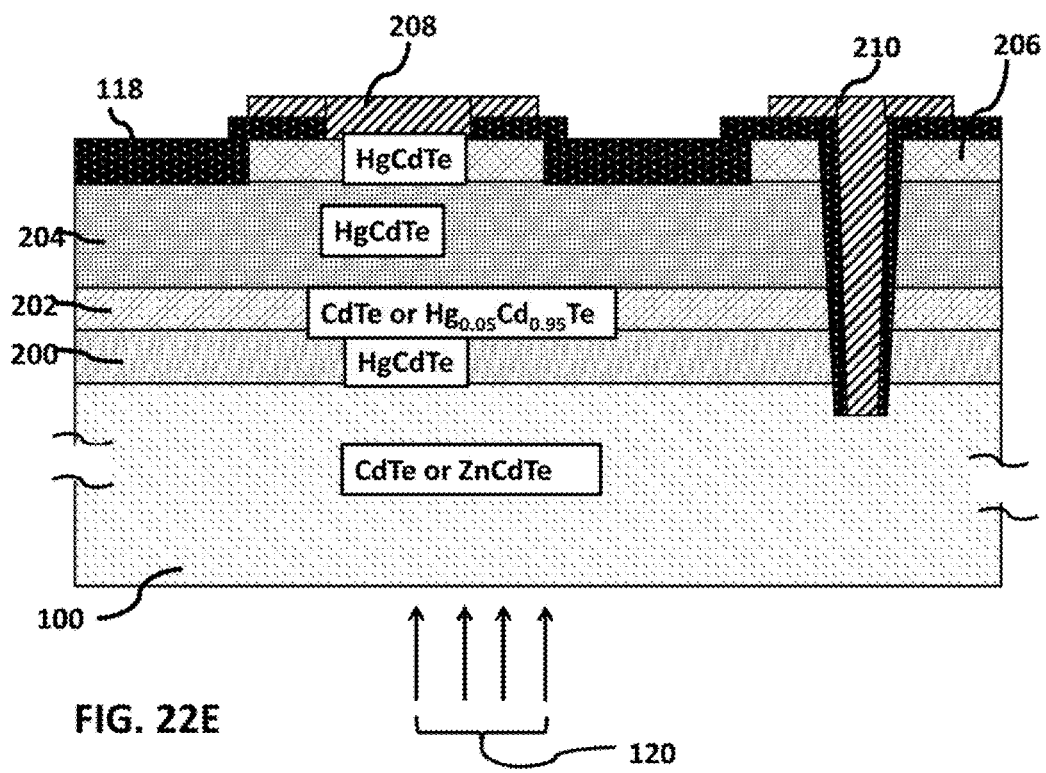

Lastly, the embodiment shown in FIG. 22E can be used to either detect in one band or two. If fabricating a dual-band detector, then the range will be either SWIR (short wave infrared) or from approximately 3-15 μm. This version utilizes a system made almost entirely from HgCdTe. If the composition of every layer is made the same way, then the device will only absorb in one spectrum range regardless of what kind of bias is applied. However, as seen in FIG. 2, the bandgap range for HgCdTe is quite large, and changing the bandgap does not significantly alter the lattice constant. Those two factors together mean that an nBn detector fabricated from an HgCdTe system has high versatility. For example, if one first n-layer is $Hg_{0.99}Cd_{0.01}Te$, and one n-layer on the opposite side of the barrier from the first is $Hg_{0.01}Cd_{0.99}Te$, then the device can detect in either the SWIR or over 15 μm. This embodiment can either be left on the substrate, or the substrate can be thinned or removed.

Figure 23A:
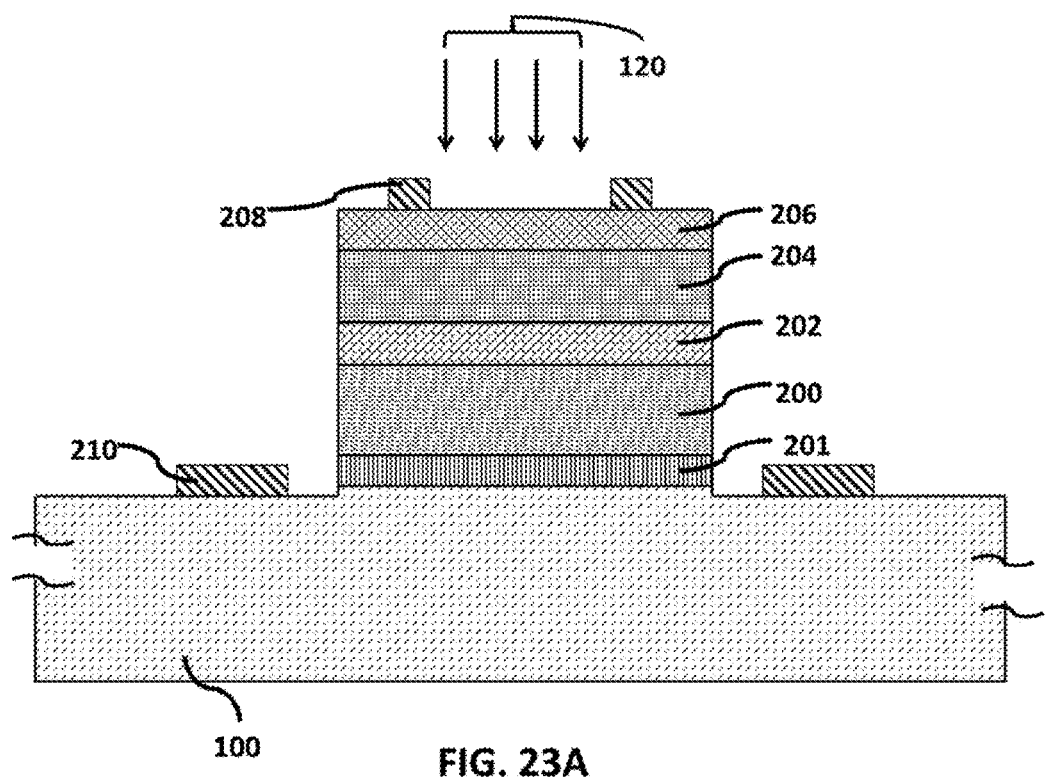
FIG. 23A is a general structure for a top-illuminated dual-band device

The above versions of the dual band detectors are ideally only used for bottom-illuminated devices, although they can be used with top-illumination as well. FIG. 23A shows an alternate embodiment which is better suited if the device is instead top-illuminated. This is the general configuration, and more specific examples will be shown and discussed below. Here, an n-doped substrate 100 is used and incorporated into the device instead of leaving the possibility of removing it. Layer 201 is included as another n-doped layer which acts as a buffer in case there is lattice mismatch between 100 and 200, 200 is an additional n-doped absorption later, 202 is the thin barrier layer, while 204 and 206 are n-layers as well. Rather than having to etch gaps into the layers to form the contacts, in this version contact 208 sits directly on layer 206 and contact 210 sits directly on the substrate 100. Optimally, the contacts should be formed from a transparent metal in order to prevent them from blocking radiation, but this is not required. It merely improves efficiency. Various specific material systems will be described below for forming detectors of different ranges. These are meant to be examples only. Unless otherwise stated, all layers in the FIG. 23A-C embodiments are doped the same way as in this general figure.

Figure 23B:
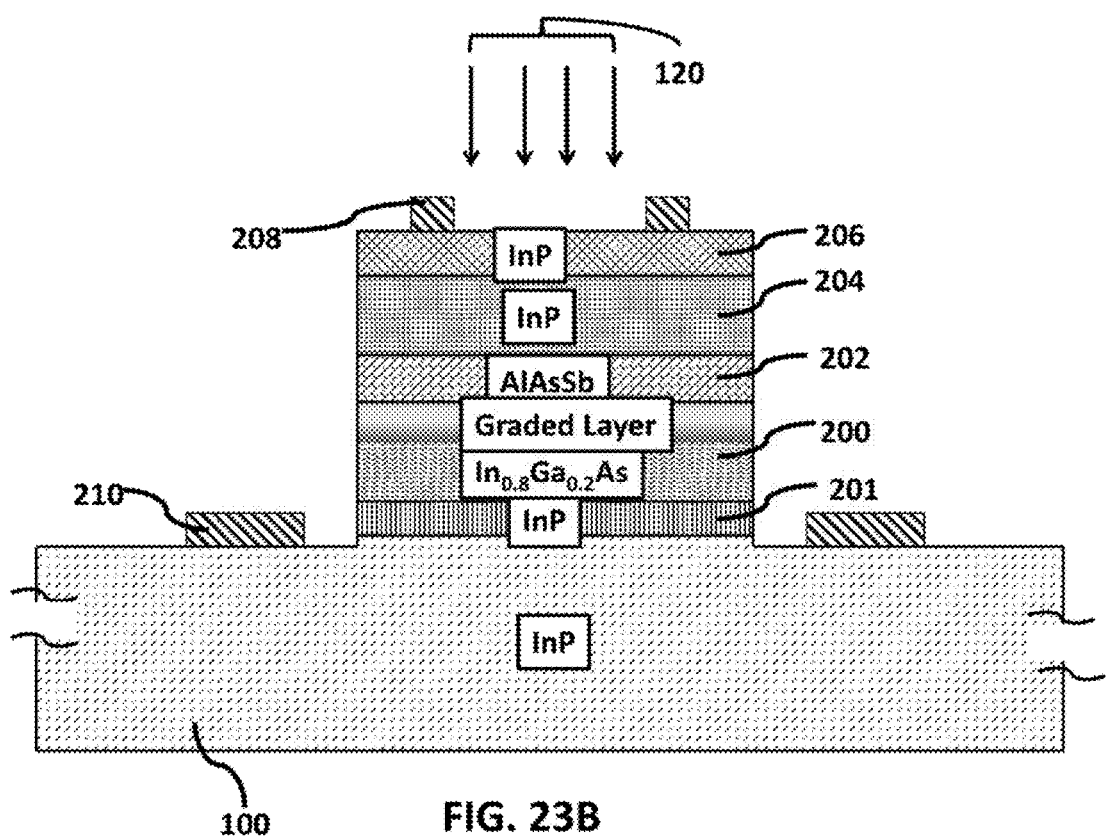
FIG. 23B, C are specific material examples for dual-band detectors

FIG. 23B shows an embodiment which detects in either the visible spectrum or the 0.9-2.8 μm range. Here, the invention is fabricated on an n-doped InP substrate, which can be thinned but not completely removed. An n-doped InP buffer is then placed on top in order to prevent defects resulting from the lattice mismatch between the substrate and the next layer. Next is an $In_{0.8}Ga_{0.2}As$ layer, also n-doped. The barrier layer is undoped AlAsSb, and the top two n-layers are InP. As discussed previously in FIG. 22B, graded layers will be needed, but only their location might vary. AlAsSb, according to FIG. 2, can be chosen to fall anywhere on or between 404 and 406, in order to match with one of the two layers it touches. If it is chosen to match up with InP, as shown in the figure, then the graded layer will be needed between the barrier and the $In_{0.8}Ga_{0.2}As$ layer. If AlAsSb is chosen to match with $In_{0.8}Ga_{0.2}As$, then the graded layer will be between it and InP. If AlAsSb is chosen to fall somewhere between the two, then graded layers will be needed on either side of it. In this embodiment, the top two layers will detect in the visible spectrum, while the bottom three will detect in the 0.9-2.5 μm range.

Figure 23C:
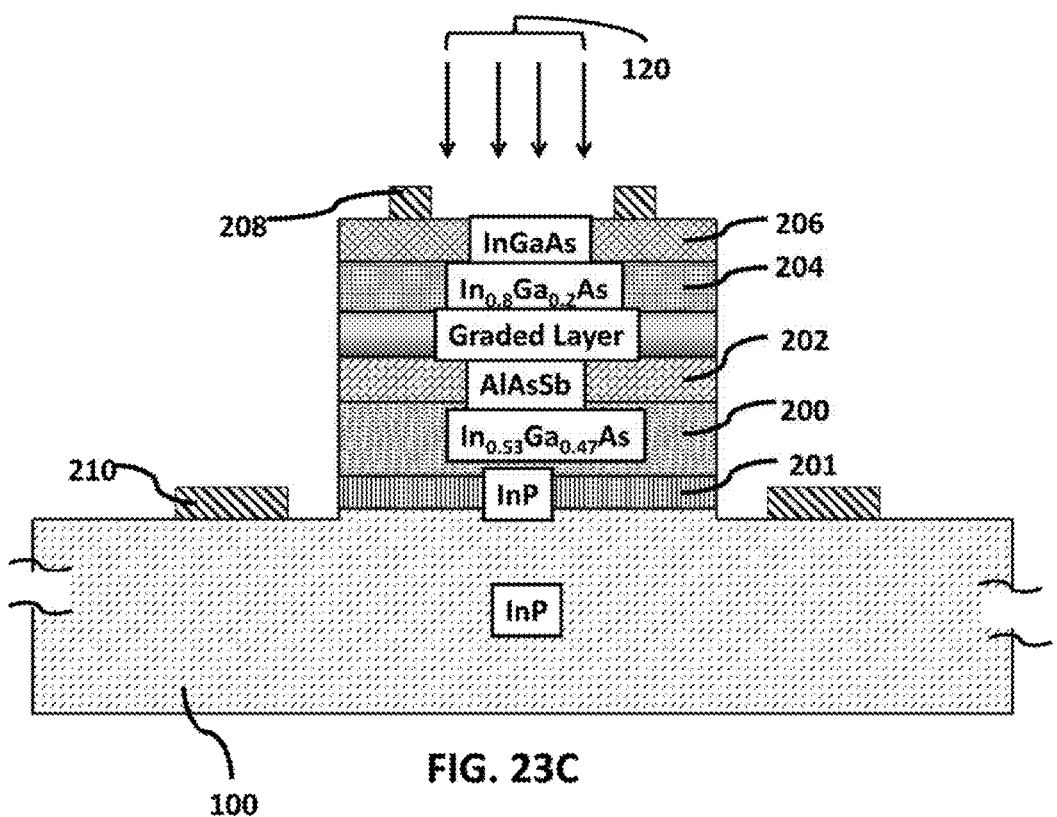

FIG. 23C shows an alternate embodiment that will detect either in the visible to 1.7 μm range or in the 0.9-3.1 μm range. In this version, InP is still the substrate and buffer layer, but $In_{0.53}Ga_{0.47}As$ is the next layer instead. Since this is lattice matched with InP, the buffer layer is not needed. It may, however, be left in simply to serve as an additional n-layer. AlAsSb or AlInAs can be used as the barrier layer, then $In_{0.8}Ga_{0.2}As$ and InGaAs are the top two n-layers. As with the previous embodiment, a graded layer might be needed on either side of the barrier, depending on which configuration of the barrier is used. See the previous paragraph for more details. In this embodiment, the top two layers absorb in the 0.9-3.1 μm range, while the substrate and $In_{0.53}Ga_{0.47}As$ layers absorb in the visible to 1.7 μm range.

Figure 24A:
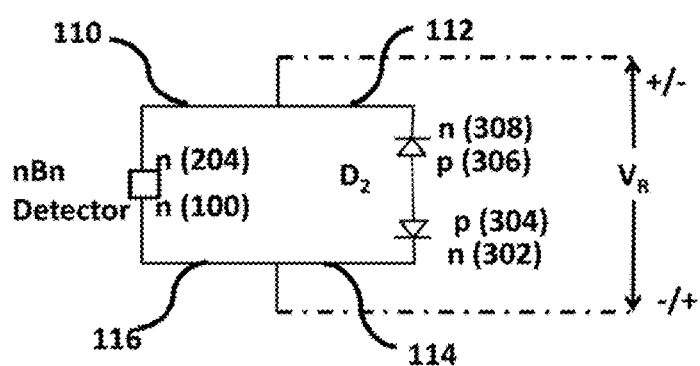
FIG. 24A shows an electrical circuit diagram of a multi-band selective detector.

FIG. 24A shows the electrical circuit diagram for preferred embodiment of the invention, a multi-band selective detector. This invention is based on the same concept as the dual-band nBn detector described above, but incorporated into a two-device structure and expanded to selectively detect several spectrums rather than just two. This embodiment shows $D_2$ as a dual-band nBn detector, and $D_1$ as two photodiodes placed back-to-back. In this way, when a bias is applied to the structure, one material in the nBn detector will absorb, and only one of the diodes in $D_2$ will function. Reversing the bias switches the functions. Take, for example, a situation where the nBn structure is fabricated to absorb wavelengths $\lambda_1$ or $\lambda_2$, while one diode absorbs $\lambda_3$ and the other $\lambda_4$. Here, when applying a forward bias the invention might absorb $\lambda_1$ and $\lambda_3$, and when applying a reverse bias the invention might absorb $\lambda_2$ and $I_4$.

This diagram is an example only, and many variations of this device are possible. For example, this could be made with any number of diodes in $D_2$. Putting multiple diodes back-to-back would simply mean that all the diodes facing one direction would function at once when a bias is applied, and when the bias is reversed, all of the diodes facing the other way would function instead. In this way, theoretically any number of bands could be selected, allowing for wide customization of detector ranges. With the above invention, additional filters are entirely unnecessary.

As another variation on the multi-band detector (not shown here), it is possible to omit the nBn detector entirely. One can, for example, make a multi-band detector where $D_1$ comprises multiple back-to-back diodes, and $D_2$ also comprises multiple back-to-back diodes.

Figure 24B:
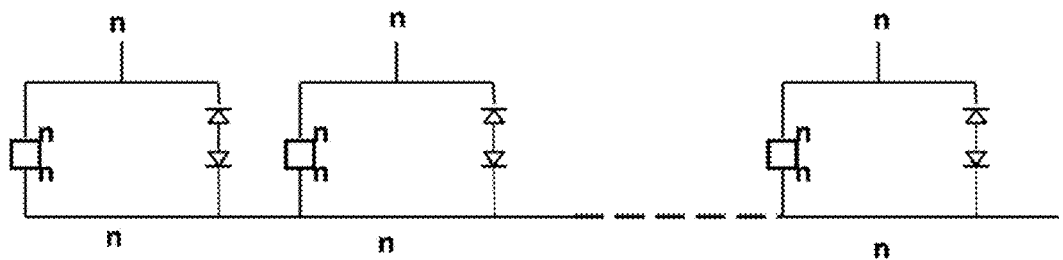
FIG. 24B shows this device in an array

FIG. 24B shows the above device in an array. As with previous schematics, the numerals have not been added. This is done to illustrate that the schematic is general, and is not limited to the physical embodiment described below.

Figure 25:
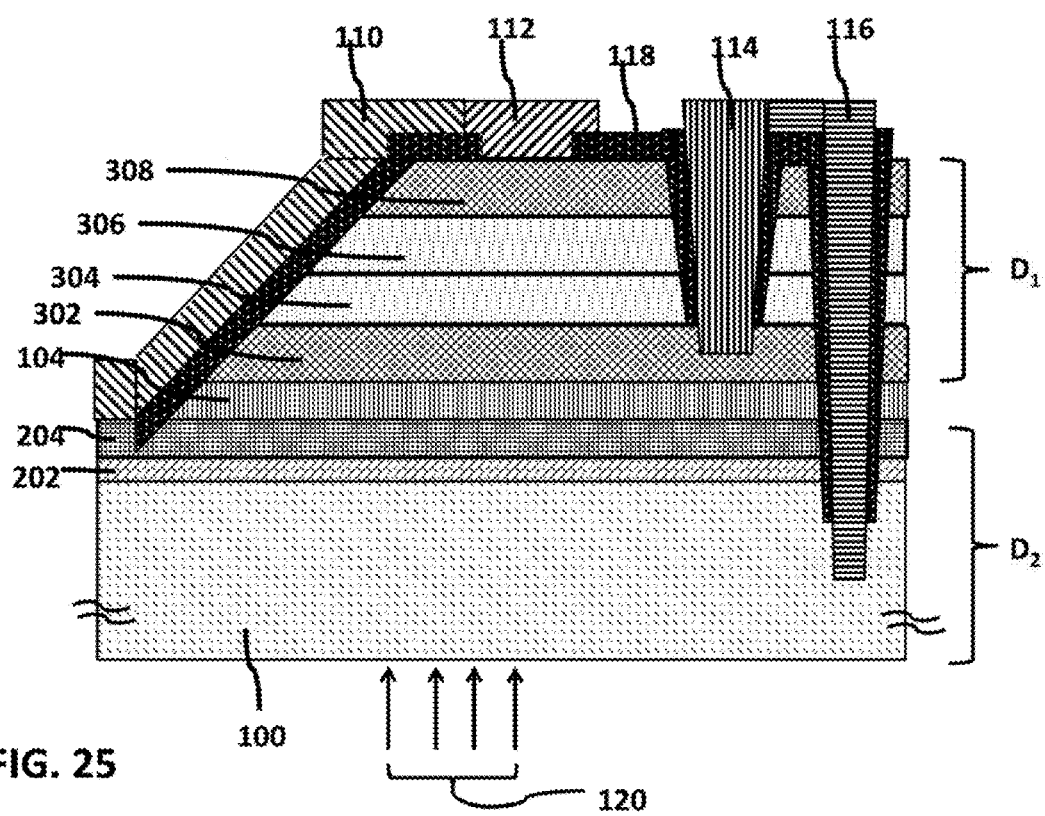
FIG. 25 is an example physical embodiment for the invention in FIG. 24A

FIG. 25 shows an example of a preferred embodiment for the multi-band selective detector. In this example, $D_1$ is the device comprising two diodes placed back-to-back, and $D_2$ comprises an nBn dual-band detector. As explained previously, the substrate can be either formed from a semiconductor and then incorporated into one of the devices, or it can be formed from a semiconductor, metal, or dielectric device and then left separate. It can then either be left, or thinned or etched out completely. In this example the substrate 100 is formed from an n-doped semiconductor, 202 is a very thin barrier layer with a conduction band which is high compared to the conduction bands for layers 100 and 204, 204 is an n-doped layer of a material which has a different absorption range as layer 100, 104, as in the embodiments described previously, is an optional buffer region placed between the two devices. It can comprise one layer, or many, or one or many graded layers, in order to reduce defects between the two devices. Layer 302 is an n-layer while 304 is a p-layer, thus creating a p-n photodiode, 306 is another p-layer, then 308 is another n-layer. Although 306 and 308 are illustrated using the same fill-texture as layer 302 and 304 respectively, this is meant to show only that they have the same type of doping, not to imply that they are formed from the same material. While they can be the same material, generally they will not be since the main purpose of the two diodes is to absorb different ranges. Note that a graded layer may need to be inserted in between to reduce lattice mismatch (not shown). Contacts 110, 112, 114, and 116 are then inserted in the device, electrically isolated by insulator 118. Contacts 110 and 112 connect to each other and to layers 204 and 308 respectively, while contacts 114 and 116 connect to each other and layers 100 and 302 respectively.

FIG. 25 shows the structure in a mesa instead of in uniformly wide layers. This structure is optional, and will be discussed in more detail below in the manufacturing section.

Figure 26A:
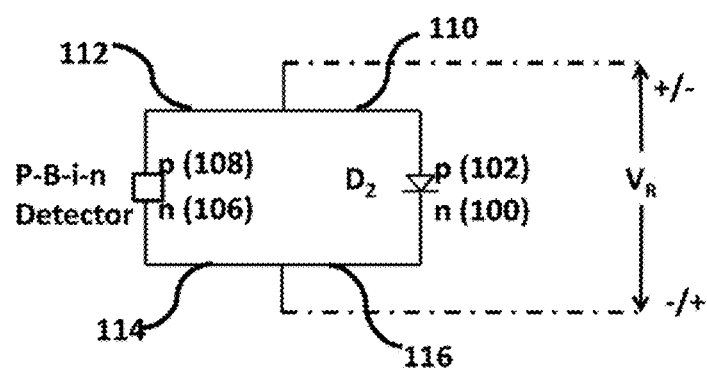
Figure 26B:
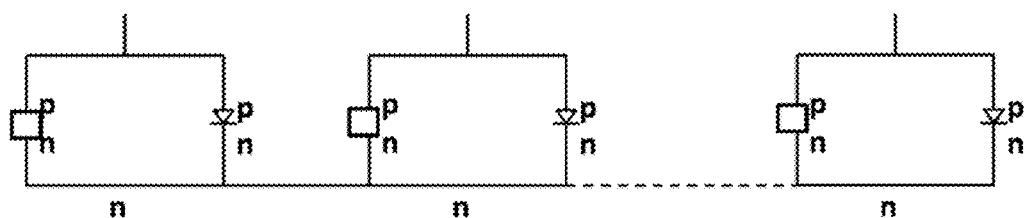
FIG. 26B shows the pixel in an array.

FIG. 26 is the schematic showing the circuit diagram of preferred embodiment utilizing a high-barrier layer 202, like that in the nBn detector. In this case, the barrier layer 202 is a very thin material placed in between the p and i layers of a p-i-n junction, By using this layer, the charge carriers are multiplied and the dark current across the device is reduced. In short, the barrier layer acts similarly to the i-layer, by blocking holes to reduce dark current. However, the barrier layer adds an extra benefit in preventing Shockley-Reed-Hall current. With high bias, however, the carriers multiplication can also be achieved, which results in increasing the responsivity of the detector.

Figure 27A:
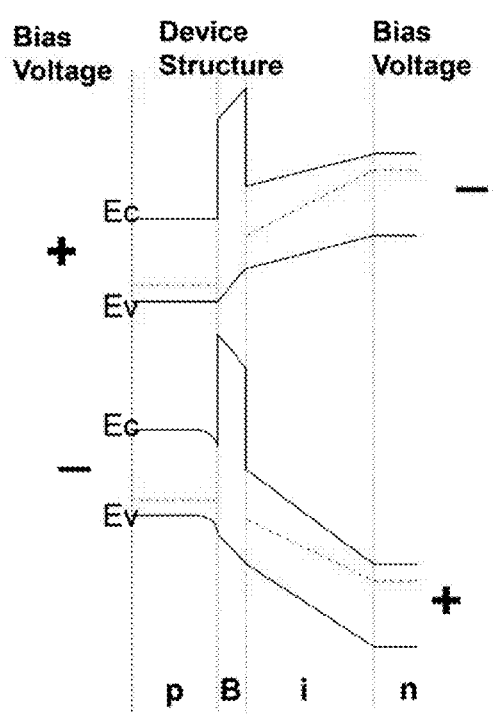
FIGS. 27A and 27B are the band-diagrams of the p-B-i-n type detector at both reverse and forward bias conditions at dark and under illumination, according to this invention.
Figure 27B:
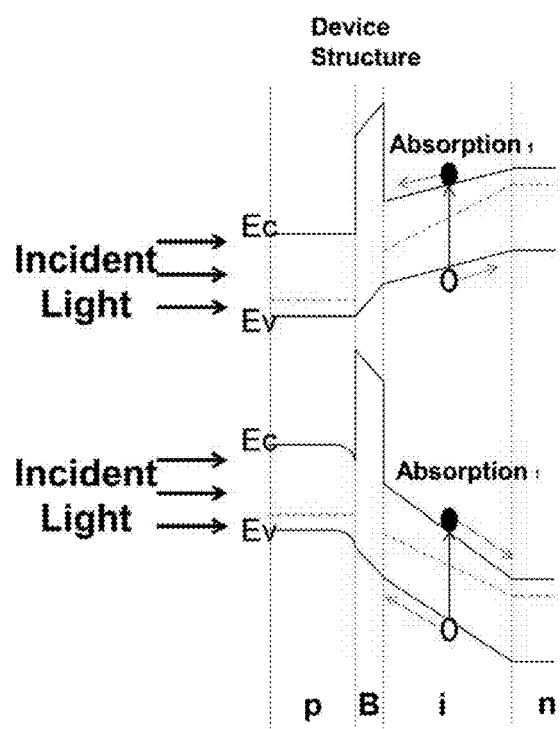

Before proceeding to explain on multiband detector and its array, p-B-i-n (which is similar to n-B-i-p) is explained. FIG. 27A and FIG. 27B are the schematics showing the band diagrams of the p-B-i-n detector for both forward and reverse bias conditions at dark condition (FIG. 27A), and also under illumination (FIG. 27B). Intrinsic layer acts as the absorption layer.

When the device is forward biased, there will be a large hole diffusion current from the p-region to the n-region. Because the diffusion current is exponentially dependent on the forward bias, the forward bias current will dominate the device. Generation currents due to incident light will be in the same direction, but will not have forward bias voltage-dependence and will be overshadowed by the diffusion current when the forward bias is large enough (past the turn-on voltage). Electron accumulation will happen at the B-i interface as electrons diffusing from the n- to p-region will be stopped at the barrier's large conduction band offset. Electron tunneling may occur through the barrier for thin barrier widths and large applied fields.

When the device is reverse biased, the diffusion current will be heavily suppressed. There will be a large depletion region field, supplemented by the applied bias. Photo-generated carriers in the intrinsic region will be swept by the field: holes will go towards the p-region and electrons will go towards the n-region. Compared to a conventional p-i-n photodiode structure, the incorporation of the barrier region will prevent surface leakage current from occurring. This is highly desirable in order to minimize the dark current.

Figure 27C:
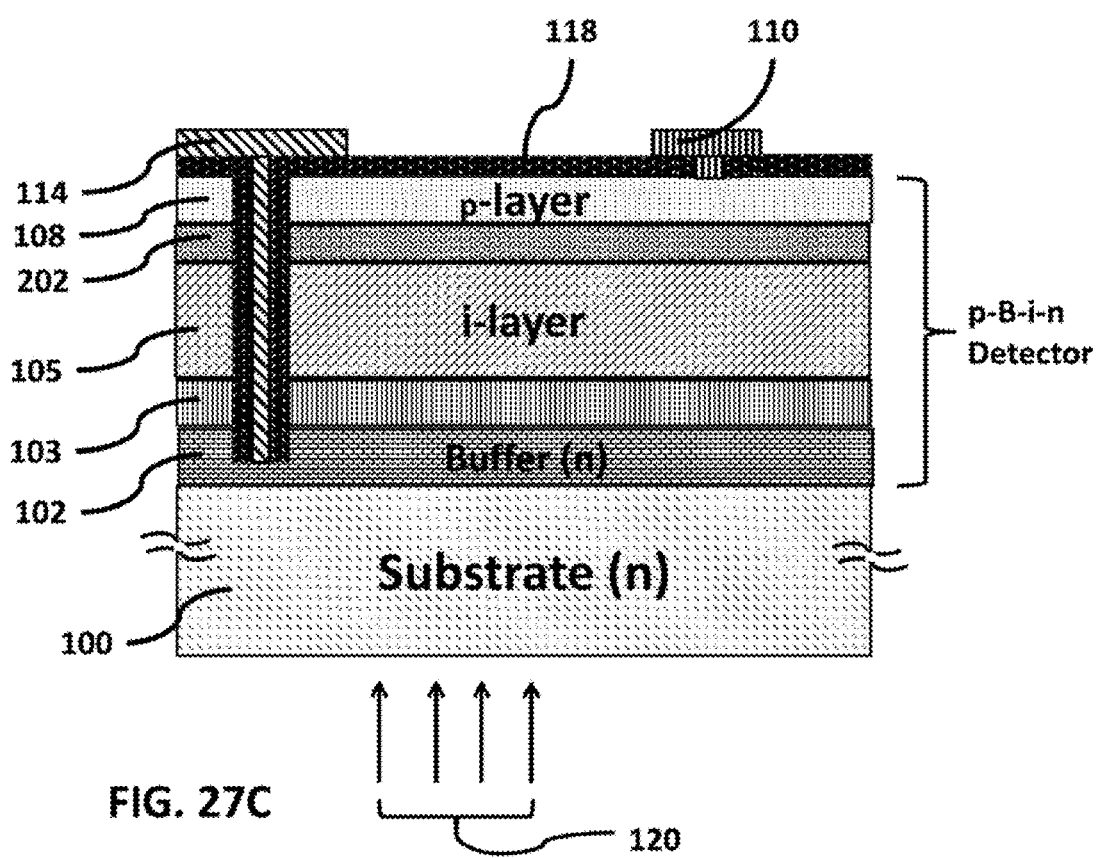
FIG. 27C is the schematic showing the cross-sectional view of the p-B-i-n detector according to this invention.
Figure 27D:
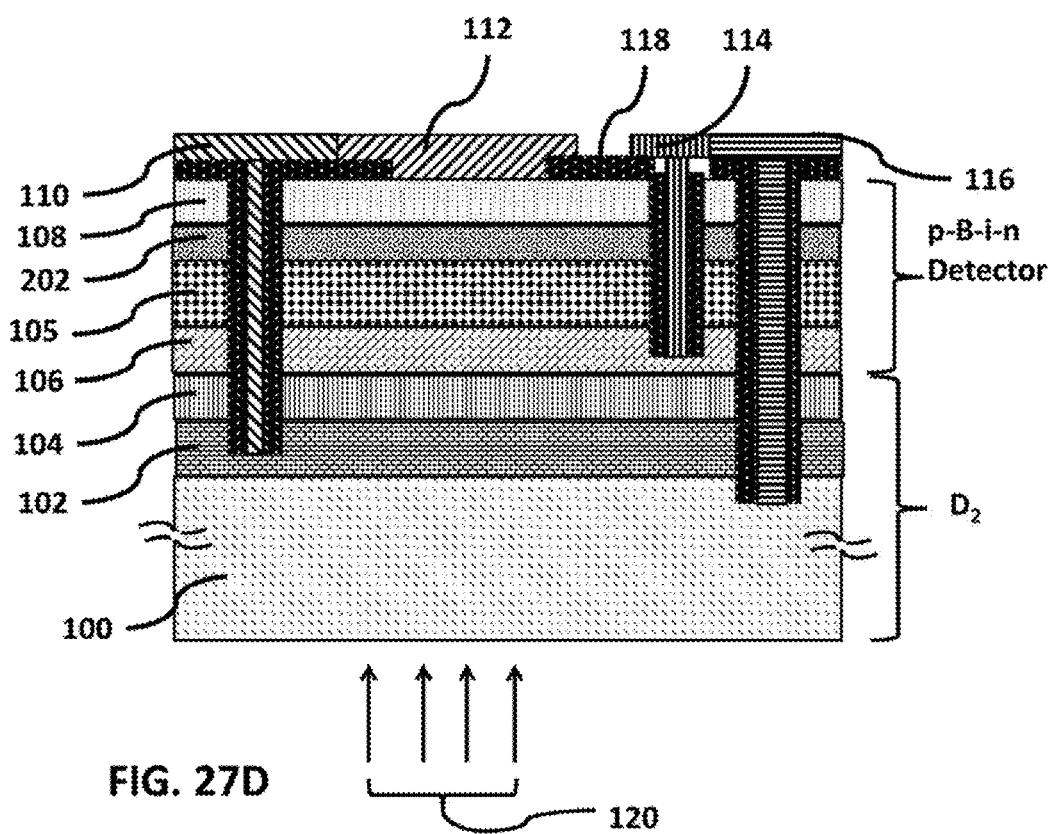
FIG. 27D is the schematic showing a cross-sectional vie of multiband detectors based on first p-B-i-n structure and second detector structure of that shown in FIG. 26A, according to this invention.

FIG. 27C is a schematic showing a cross-sectional view of preferred embodiment of the p-B-i-n detector. All numerals, as with FIG. 26, have been previously explained, so that repeated explanation is omitted here. The main differences are that this is two terminal device for single or dual bands detection. The Barrier layer is placed in between p-doped layer 108, and intrinsic layer 105, in order to reduce the leakage current and also to achieve carrier multiplication to increase the responsivity of the detector. Single layer 103 or multiple layers (not shown here) may necessary in between buffer n-layer 102 and i-layer 105. Based on the type material systems, layer 103 may not be needed. Like with previous embodiments, this one is not intended to be limiting our inventions. For example, the p-B-i-n detector could be connected so that it is an n-i-B-p or n-B-i-p type detectors instead.

FIG. 27B is a schematic showing a cross-sectional view of preferred embodiment of the multiband detectors based on p-B-i-n and p-n (or n-p, or photoconductor)

The same numerals are used for the same parts, as explained in FIGS. 26 and 27C, so that repeated explanations are omitted here. Like with previous embodiments, this one is not intended to be limiting. For example, the p-B-i-n detector could be connected so that it is an n-i-B-p or n-B-i-p type detectors instead. Similarly, it could be placed on the bottom or top (as shown). Moreover, it need not be placed with a second device at all.

FIGS. 28A and 28B are the band diagrams of multiband or broadband detector based on n-B-p-i-n, according to this invention. Like with previous embodiments, this one is not intended to be limiting, For example, the n-B-p-i-n structure detector could be connected so that it is an p-B-n-i-p type detector instead. The detector can be designed to have two absorption regions; absorption 1 and absorption 2, and those are based on same material systems or different material system having different absorption spectra. Under bias mode 1 (top row of FIGS. 28A and 28B), the n-B-p structure is reverse biased, and its diffusion current is limited while permitting flow across the barrier field for generated holes. On the other hand, the p-i-n structure is forward biased, and it will permit an exponentially-growing forward diffusion current, much like a forward-biased in p-i-n diode. Thus, the device current will be limited due to the n-B-p generation current. There is a depletion region at the B-p interface with the same field direction.

Under bias mode 2 (bottom row of FIGS. 28A and 28B), the n-B-p structure is forward biased and the p-i-n structure is reverse biased. Similar to the reverse situation, the generation current in the reverse biased structure of the p-i-n structure, will define the device current.

By utilizing two different semiconductor material with different bandgaps and a matched valence band for the two absorption regions, it is possible to obtain detection for two different wavelengths. This is theoretically possible because for each bias polarity (large forward-bias or large reverse-bias), the device current will be limited by the reverse biased half while the other half serves as a conducting channel. Thus, for each bias polarity, the device current will be mainly dominated by the generation current in the reverse-biased structure. The detector can operate in two different modes, each with an associated detection wavelength and switchable through bias voltage polarity. With this device can detect two separate wavelengths by switching the voltage bias polarity.

For this device, the depletion region exists on the B-p interface, apart from the absorption region. This is advantageous in order to reduce dark current because an absorption region depletion will introduce SRH generation current with lower absorption layer doping, while higher doping will reduce the depletion region but also decrease the electron population available in the valence band for excitation.

Figure 29A:
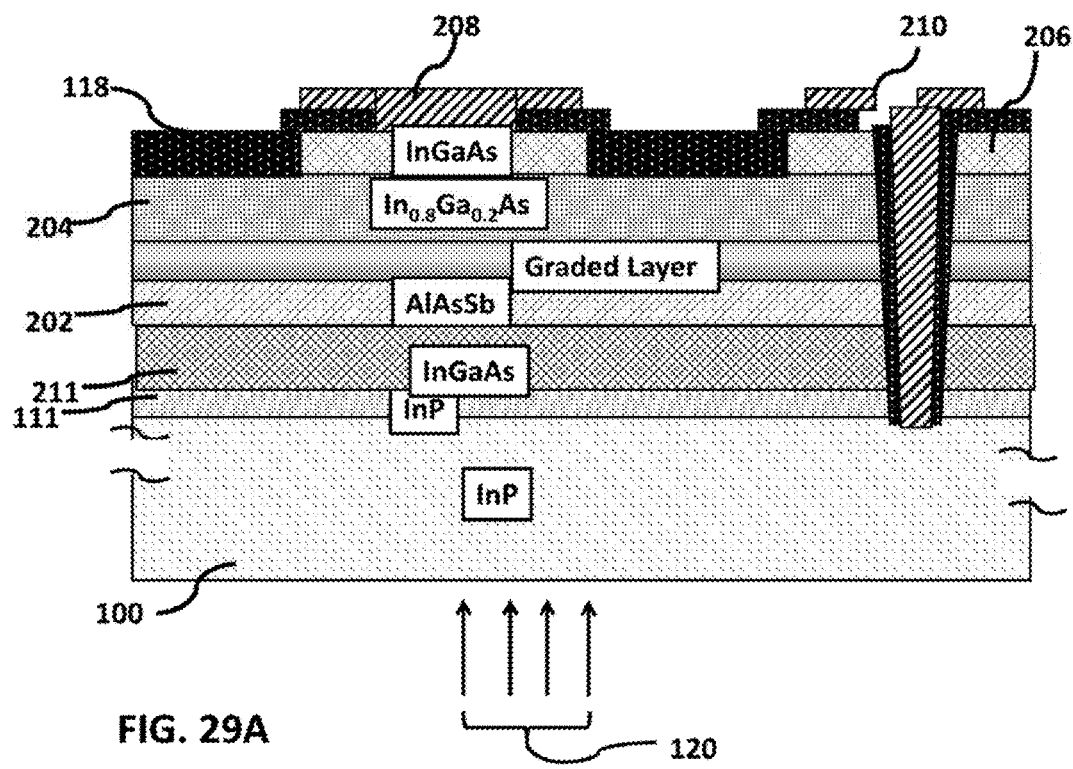
FIG. 29A and FIG. 29B are the schematics showing the cross-sectional views of detector structure as shown in FIG. 28, for InP based material system as an example, according to this invention.

FIG. 29A shows a cross-sectional view of a dual-band detector which detects in the visible spectrum or the range from approximately 0.9 μm-3.1 μm representing FIG. 28, according to this invention, wherein similar numerals are for the same parts as explained in FIG. 22B, so that repeated explanation is omitted here. This embodiment could be formed from several materials grown on an n-doped InP substrate as an example. The differences are the n-type InP buffer layer 111 and i-layer and p-layer of InGaAs 211. After forming the epitaxial/dopant layers upon the substrate, the substrate can either be left alone, thinned, or removed entirely. Atop this substrate is another n-doped buffer layer 111 of InP which serves partially as an absorption layer, but also as a buffer in case there is some lattice mismatch between the substrate and the barrier. The layer 211 could be single layer multiple layers and it could be n– or p– and p+ layer. Multiple layers having different composition of InGaAs could be used for either as i-layer or p_ or n_layers. Single or multiple graded layers (not shown here) could be used in the interfaces having lattice mismatches. AlAsSb is chosen as the thin undoped barrier layer. As shown in FIG. 22B, the AlAsSb barrier can be formed in a variety of ways, where the percentage of As and Sb varies the lattice constant. If the variation chosen lines up with InP, such as the one shown at 404, then no buffer is needed. Next, an n-doped graded layer is placed on the barrier layer to reduce lattice mismatch between it and the next layer. The next layer of the device is In0.8Ga0.2As, as shown in FIG. 2 by 402. Lastly, the top layer is n-doped InxGa1-xAsInGaAs. With this configuration, the InP substrate absorbs in the visible spectrum, while the InGaAs layers absorb in the 0.9 μm-3.1 μm spectrum.

The necessity of a buffer and graded layer depends on the percentage of As and Sb chosen in the barrier layer. As seen in FIG. 2, one would logically choose a percentage that falls somewhere on or between points 404 and 406. If 404 is chosen, then there is lattice match with InP and that buffer layer is not required. However, this causes a large mismatch between In0.8Ga0.2As and the barrier, so a graded layer is needed there. This layer would consist of doped or undoped In0.8Ga0.2As or AlAsSb, where the composition of the material is gradually changed as it is grown. This way, the surface which touches the barrier layer is lattice matched with it, and the surface which touches the In0.8Ga0.2As layer is also lattice matched with that. If, however, 406 is instead chosen, then there is lattice match between it and In0.8Ga0.2As, and no graded layer is needed. Instead, the InP butter or a graded layer of AlAsSb is needed between the substrate and the barrier. Alternatively, one can choose a form of AlAsSb that falls somewhere in the middle of 404 and 406. This would require both of the extra buffer layers. The buffer and/or grading layers as discussed here can be one or multiple layers.

Figure 29B:
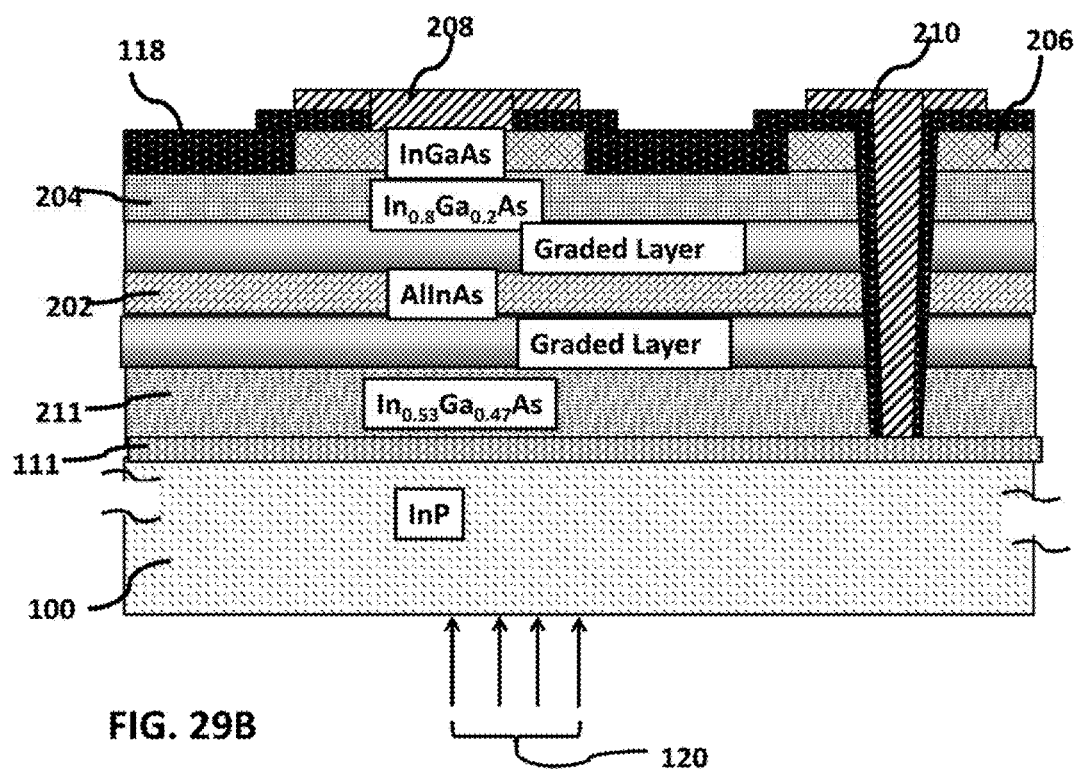

FIG. 29B is a schematic showing the cross-sectional view of a band selectable dual detectors based on the detector structure as explained in FIGS. 28A and 28B, according to this invention, wherein similar numerals as explained in FIGS. 29A and 22C are used for similar pans, therefore the repeated explanation is omitted here. In this case, AlAsSb or AlInAs can be used, whereas only AlAsSb was available when InP acted as one of the layers touching the barrier. Since $In_{0.53}Ga_{0.47}As$ layer 211 matches the lattice constant in the InP substrate and the barrier, single or no graded or buffer layer is needed between them. As discussed in the previous embodiment, here there might be need for single or multiple graded layers as shown in the FIG. 29B. The layer 211 could be single layer multiple layers and it could be n– or p– and p+ layer. Multiple layers having different composition of InGaAs could be used for either as i-layer or p_ or n_layers.

Single or multiple graded layers (not shown here) could be used in the interfaces having lattice mismatches. AlInAs can be made in a composition which lattice matches either In0.53Ga0.47As or In0.8Ga0.2As. Depending on which composition is chosen, a graded or buffer layer is needed between the barrier and the unmatched material. Alternatively, if the barrier is of a composition that falls between the two lattice constants, both graded layers might be needed.

With the above configuration, the In0.53Ga0.47As and InP layers absorb in the visible spectrum up to 1.7 µm. Alternatively, the InP substrate can be thinned or removed completely, which would result in the In0.53Ga0.47As layer only absorbing in the Visible-1.7 µm range. The InGaAs and In0.8Ga0.2As layer would then absorb in the 1.7-3.1 µm range.

Similarly as FIGS. 29A and 29B, other material systems can also be used, For example, HgCdTe or InSb based material systems can also be used to make the selectable dual band detector (not shown here), as FIG. 22E. Only difference for n-B-P-i-n structure detector (not shown here) with FIG. 22E is that the intrinsic layer is needed and it can be made based on HgCdTe material composition selected for desired wavelength detection.

Other material system such as Si:Ge, InSb, ZnSe, ZnBeO, AlGaN etc. material systems can also be used for the structure explained in FIGS. 28A, 28B, 29A, and 29B.

Figure 30:
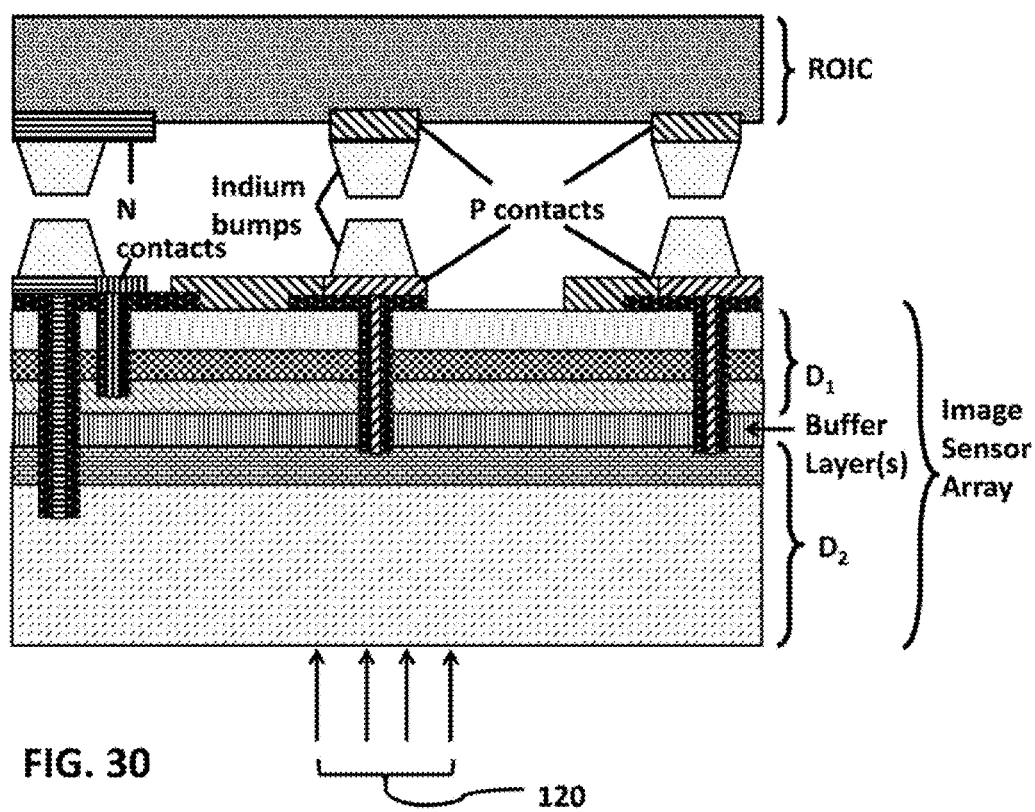
FIG. 30 shows how the invention, specifically an array from FIG. 4, can be connected to an ROIC.

The image sensor or focal plane array (detector array independently operable) is made using any of the detector types explained earlier in the preferred embodiments. In order for any of the detector arrays described above to function as image sensor or FPA, they must be attached in some way to a device which can interpret the generated voltages. This is done with a Readout Integrated Circuit (ROIC). The ROIC is connected in various ways to our claimed invention's various embodiments, and the following descriptions should not be viewed as the only possibilities. FIG. 30 is a schematic showing a cross-sectional view of detector array (a.k.a. image sensor) and ROIC integration according to this invention, where the image sensor array is on the bottom, with radiation striking from the bottom surface. In this way, the light strikes the $D_2$ diode first, then the $D_1$ diode. An ROIC which has P and N contacts similar to those on the sensor array is placed on top. The ROIC and array are connected through a series of "bumps," most commonly fabricated from Indium or Arsenic. Here, "bumps" means any kind of shape which is raised from the surface. As seen in the figure, the bumps are placed on all of the p- and n-contacts, and then connected to each other.

Figure 31:
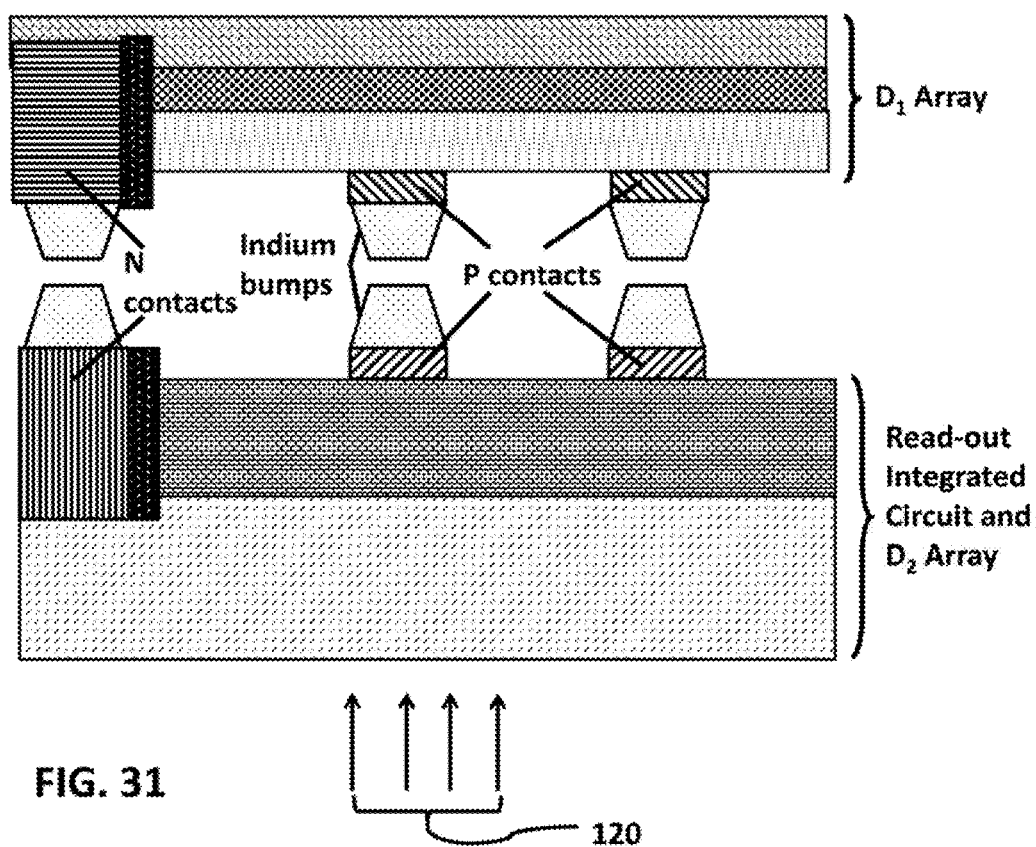
FIG. 31 shows an alternate embodiment to FIG. 30, where the ROIC is integrated into one of the devices.

FIG. 31 is an alternate embodiment where the ROIC is fabricated from a material which is suitable for absorption within the visible spectrum. The material Si is used for both visible image sensing and ROIC. The Si is doped to form the appropriate p-n, p-i-n, or superlattice structure in order to form a photodiode. When done this way, it serves a dual purpose of acting as the ROIC as well as the $D_2$ diode. This embodiment shows the ROIC on the bottom, so that the radiation strikes it first. The ROIC is then connected through its p- and n-contacts to In bumps, which are in turn connected to the upper In bumps. Those bumps are attached to the P and N contacts in the thermal diode array, which absorbs the remaining radiation in the spectrum from 1 µm to 40 µm.

Figure 32A:
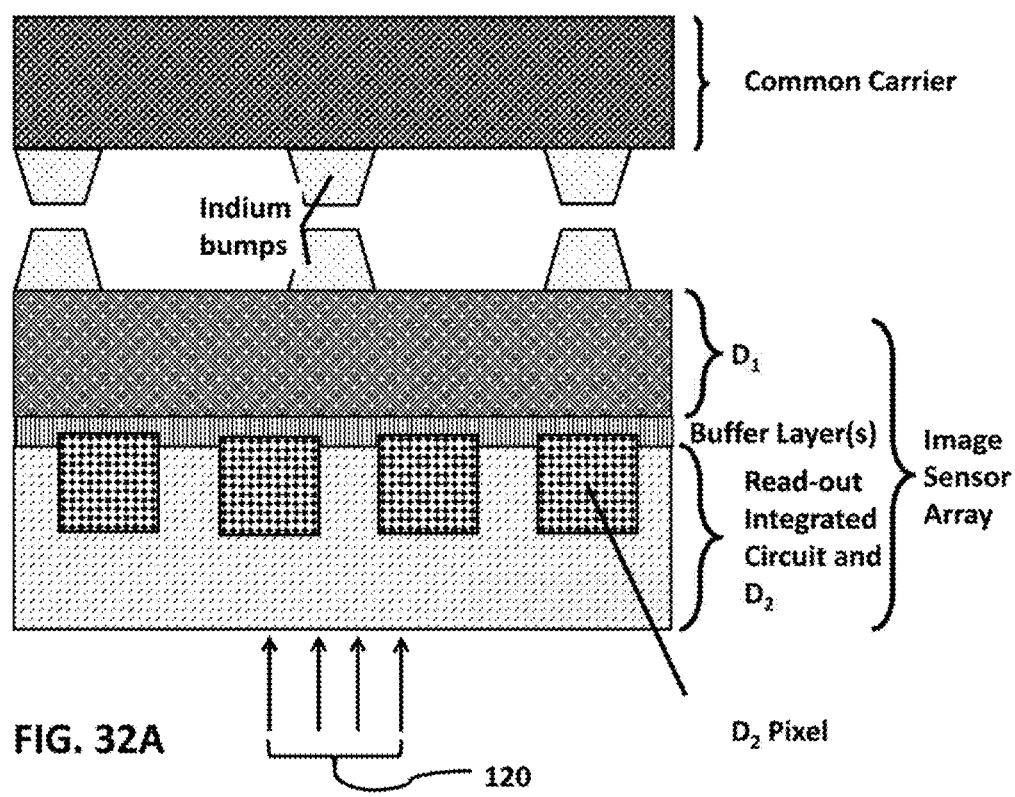
FIG. 32A shows a general version of an alternate embodiment to FIG. 30. In this version, the ROIC is integrated into one of the devices, then the other device is connected to a common carrier.

FIG. 32A is a schematic showing cross-sectional view of another preferred embodiment, utilizing a common carrier. This is the general version, and so does not show a detailed diagram of where the various contacts are located. In this version, the ROIC is again fabricated in order to serve also as the $D_2$ array. The $D_1$ array is then formed on top, with a buffer layer in between to minimize lattice mismatch. In bumps are then connected to the surface of $D_1$, and in turn connected to the In bumps which have been placed on a common carrier material. Since the two devices have been connected to the ROIC already, the bumps do not need to be connected in any specific place, and may be placed randomly. This is different from FIGS. 30 and 31, since in those the bumps were used to connect the correct contacts to each other to put the two devices in parallel. In this embodiment, the devices are already connected in parallel, so the bumps serve only as a means for connecting the common carrier to the invention.

Figure 32B:
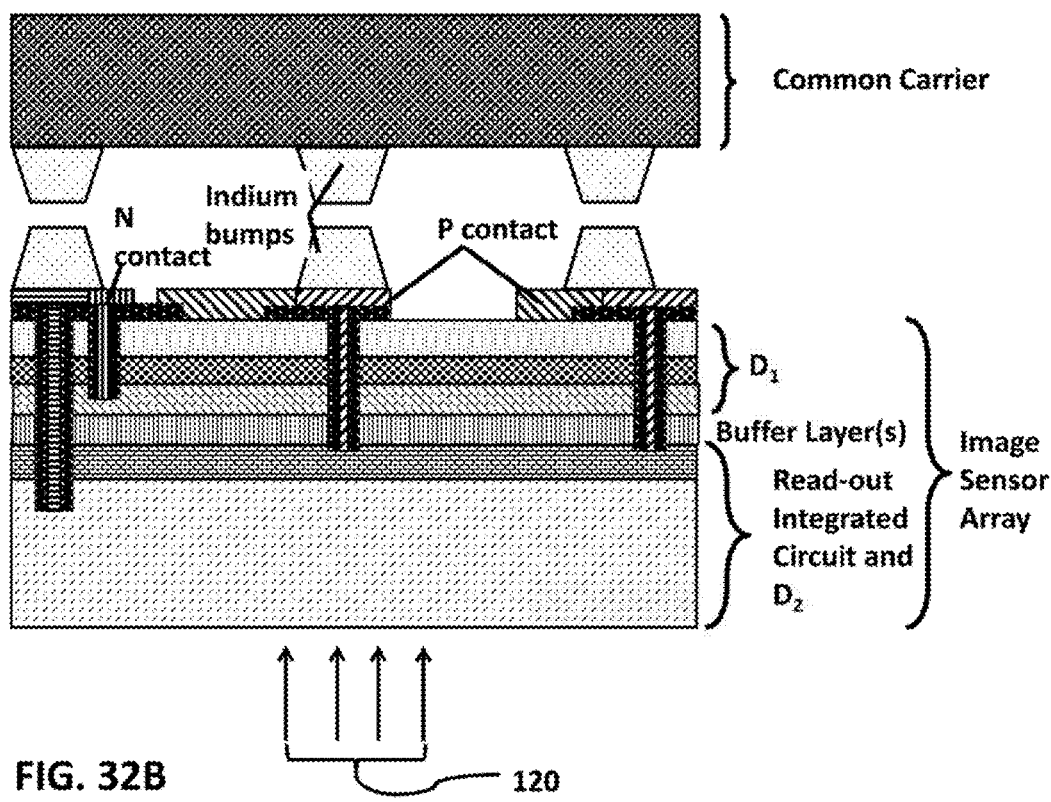
FIG. 32B shows a more detailed and specific version of the invention in FIG. 32A, and how it might be connected to a common carrier.

FIG. 32B shows an alternate embodiment for 32A, where the pixels are each connected to a different bump. In this way, one can see a more detailed example of what the embodiment might look like, even though connecting the bumps this way is not necessary.

In all of the above embodiments showing an ROIC, it is not required that the two devices (D1 and D2) be p-n photodiodes. As with the previously listed embodiments, either device can be replaced with a photoconductor, nBn detector, nBp, n-B-i-n, p-B-i-n, p-i-n diode, n-p diode, n-i-p diode, QWIP, or superlattice, or some plurality or combination thereof. $D_1$ and $D_2$ may also be switched, or the devices can be flipped so that the radiation strikes the top surface instead of the bottom. When fabricating the actual image sensor, it is unlikely that the end result will look exactly like the structure pictured in FIG. 3. Because of the various difficulty of forming the metal contacts in such a way as to connect to the right layers, it is much more likely that a mesa structure will be utilized for easier connections. However, mesa structure is more likely to have more leakage current, if the fabrication process is not optimized. The embodiments explained earlier, can also be fabricated in planar way.

Figure 33A:
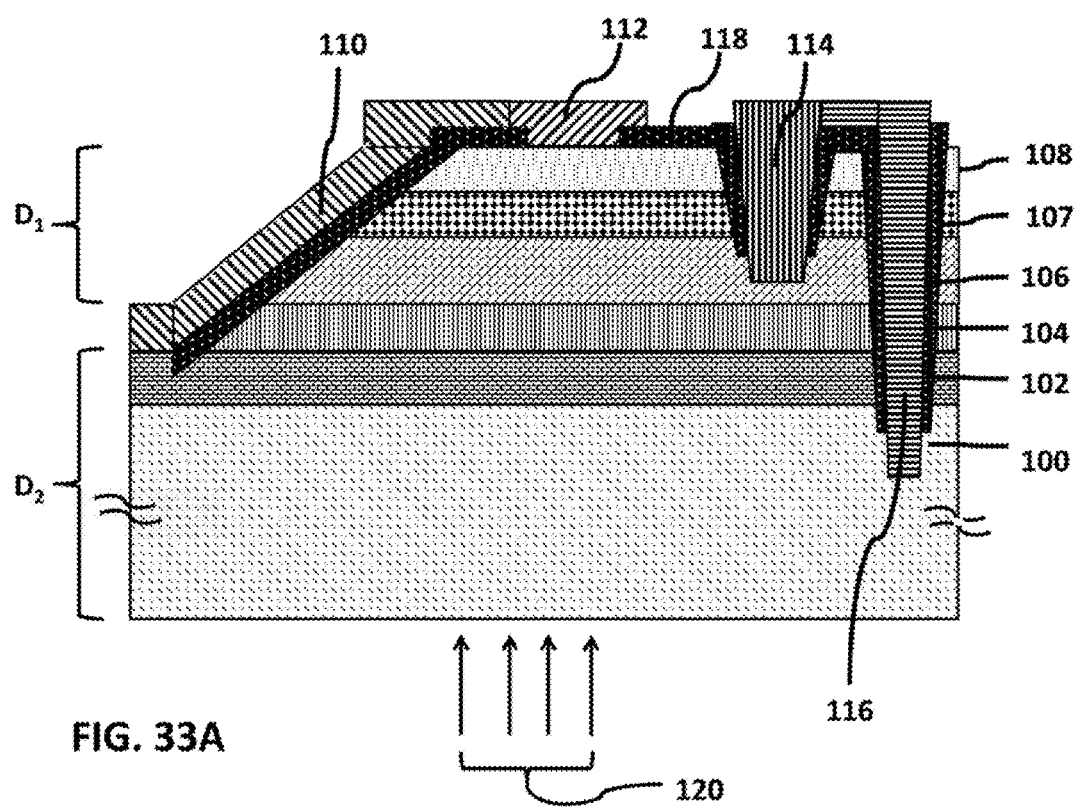
FIG. 33A shows the invention from a fabrication point of view, showing an alternate physical embodiment from those shown above
Figure 33B:
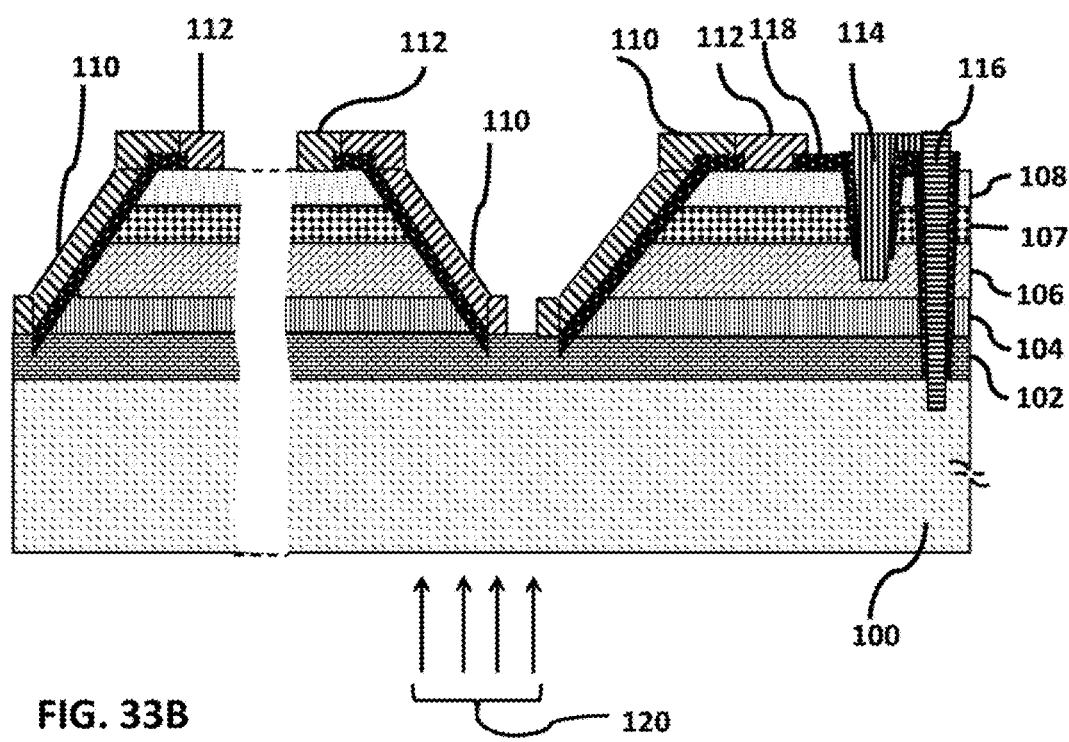
FIG. 33B shows the mesa structure in FIG. 33A in an array

FIG. 33A is presented here as a possible embodiment from the fabrication point of view, showing one of the possible structures for the invention. The same numerals are used for the similar parts, explained in earlier embodiments, so that repeated explanation is omitted here. For image sensors, often a mesa structure is utilized for each pixel. This figure shows such a mesa structure, where the layers are widest at the bottom and narrower at the top. The metal contacts, also, are fabricated more like an inverted cone than the straight narrow cylinder shown in previous embodiments. Neither of those shapes are required though, as any 3-dimensional shape can carry out the same purpose. FIG. 33B shows the mesa structure in an array.

In order to fabricate the above invention and its various embodiments, many techniques can be used. First, one must start with a substrate on which to grow the epitaxial-layers. As discussed above, this substrate can be a semiconductor, metal, or dielectric material. If using a semiconductor, such as Si, GaAs, InP, Ge, or CdTe, it can be either integrated into one of the devices, or it can be left as a separate base on which to grow the invention. If it is not integrated into one of the devices, the substrate can be left to act as a support for the whole structure, or it can be later etched out. This is especially desirable if the radiation is striking the substrate first, and the substrate absorbs any of the wavelengths of interest, thereby blocking those wavelengths from reaching either of the devices. The following figures will show embodiments where the substrate is a semiconductor which is integrated into $D_2$, but this is for ease of explanation alone, and not to be construed as a limitation.

After the substrate is chosen, the layers of the two devices are grown on top according to any one of the embodiments described previously. For the purpose of showing the fabrication process in FIG. 29, FIG. 32 and FIG. 33, $D_1$ is shown as a three-layer device, and $D_2$ is shown as a two-layer device, and a single buffer layer is shown separating the two. In order to show that this fabrication process can be utilized for any of the above inventions, numerals identifying the layers have been deliberately omitted.

As an example, Si is used as the substrate. This material is then doped using standard industry methods for doping materials (such as ion implantation), and then either the top surface can be doped the opposite way, or a separate material layer can be grown on top which is doped the opposite way. In this way, the first device is formed from a p-n diode. The growth of these layers can be done in any standard semiconductor growth methods, including UHV sublimation, hotwall epitaxy, thermal evaporation electro deposition, spray pyrolysis, atomic layer epitaxy, metal organic chemical vapour deposition (MOCVD), metal organic vapour phase epitaxy (MOVPE), chemical bath deposition (CBE), chemical vapour deposition (CVD), molecular beam epitaxy (MBE), liquid phase epitaxy (LPE), or sputtering.

Alternatively, GaAs or InP can be used as the substrate. In order to form the diode, the substrate is doped one way. Then the top surface is doped the opposite way to form a p-n diode. Or, to form a p-i-n junction instead, the substrate is doped one way, then an undoped layer of InGaAs is grown on top, and another layer of GaAs or InP is grown on top of that, and doped the opposite way as the substrate.

The buffer layer is then grown. Most material systems can be grown through any of the standard semiconductor growth methods listed above, but systems based on HgCdTe, CdTe, CdSeTe, InSb, GaSb, or InAs are generally grown using MOCVD, MBE, or MOVPE.

Keeping the above in mind, the layers for the second device are then grown as well. FIG. 34A shows this point in the fabrication process, after all of the layers of the devices have been grown.

The next step in the fabrication process is depicted in FIG. 34B. The mesas are formed by patterning and etching out parts of the layers. Patterning can be made utilizing either contact photolithography, electron-beam patterning or nano-imprinting utilizing the master mold. Etching may be done using wet or dry etching. As shown in FIG. 34C, an insulator is then deposited on all of the exposed area on the top of the structure.

Figure 34D:
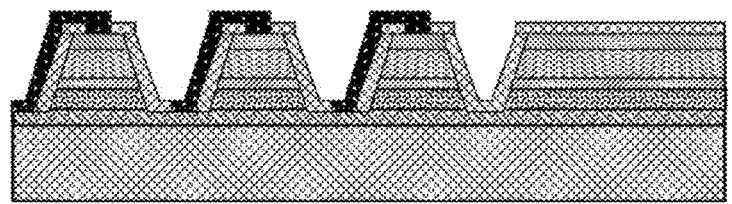

For ease of explanation, in this example, the p-contacts will form the pixels, and the n-contacts will be common across the array. Once the insulator is deposited, it must be patterned and etched out strategically so that the p-contacts can connect to the appropriate layers. In FIG. 34D, the metal forming the p-contact is then deposited onto the surface through thermal evaporation, sputtering, or electron-beam evaporation. The metal is then patterned and lifted-off where necessary.

Figure 34E:
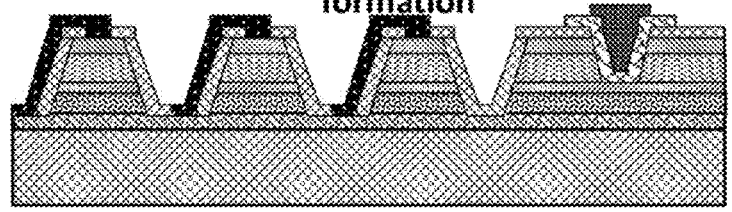
Figure 34F:
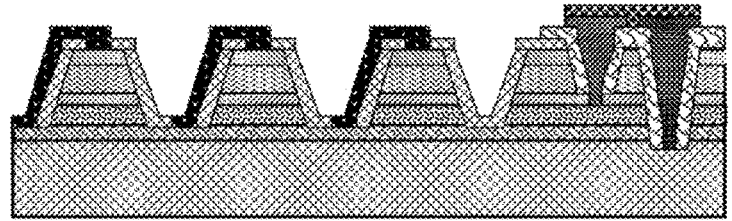

Next, FIG. 34E shows the formation of the top n-contact. This is done by first patterning and etching out a space for the contact, then depositing a passivation (or insulating) layer within the space. A small gap at the bottom will need to be etched out after this step in order to make contact with the underlying layer possible. Metal is then deposited within the space, and any excess can be patterned and lifted-off. In FIG. 34F, similarly to FIG. 34E, the space for the bottom n-contact is formed by patterning and etching it out. Then the passivation layer is added, and the bottom etched out. Metal is then deposited to form the contact itself, where extra material has been patterned and lifted-off. Once this is done, an additional metal can be deposited to connect the two n-contacts, where any excess is again patterned and lifted-off.

Figure 34G:
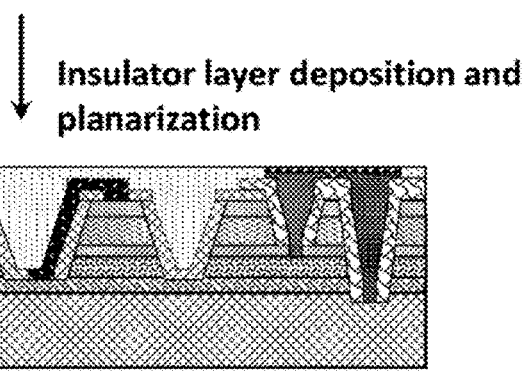
Figure 34H:
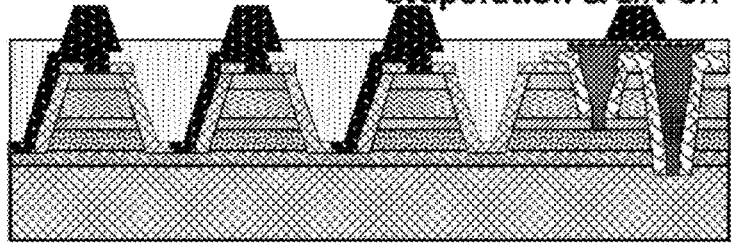

FIG. 34F is repeated merely to show continuity across multiple sheets of drawings. Next, the array is prepared for connection to an ROIC or common carrier. In FIG. 34G, additional insulator is deposited on the surface to fill in the gaps between the mesas, then the surface is planarized using standard industry methods in order to create a flat surface. In FIG. 34H, the insulator surface is patterned and etched out in order to allow access to the previously formed metal contacts. Lastly, metal is evaporated onto the exposed surface to create contact bumps in the gaps, extending slightly upward so they are raised from the surface of the insulator, and excess metal is lifted-off.

Figure 35A:
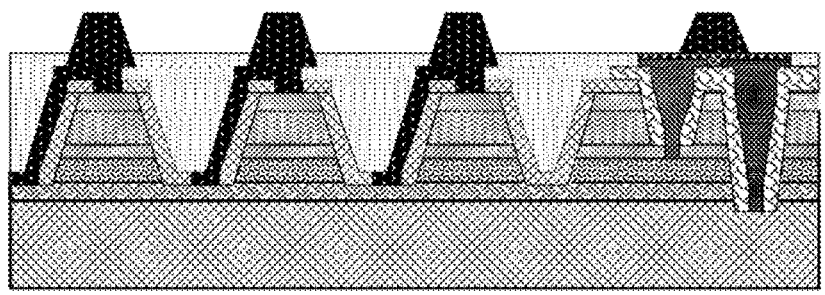
FIG. 35A-B shows how the invention array can be connected to an ROIC or common carrier
Figure 35B:
Figure 35B:
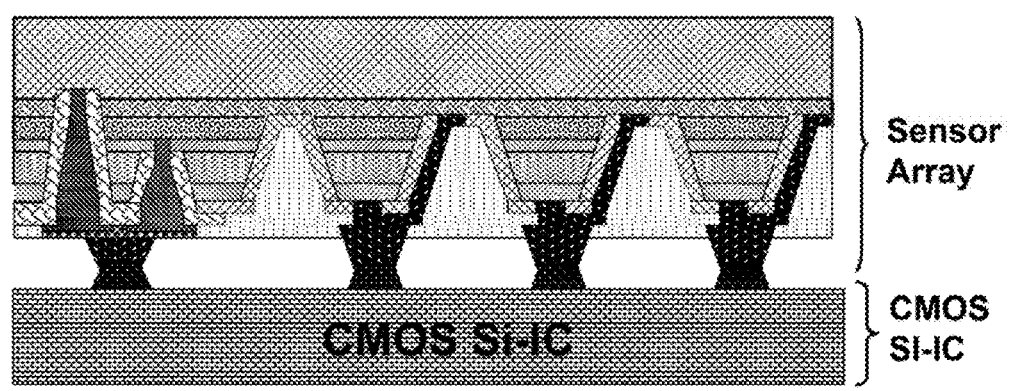

FIG. 35A-B shows how the device might now be connected to a ROIC device. The ROIC can be fabricated using standard CMOS technology, and then metal contact bumps must be added to match those on the detector array. The detector array is then flipped and each bump is bonded to a corresponding bump on the ROIC.

The above is only one example of a possible fabrication process and finished product. There are numerous variations. For instance, the mesa structures might look slightly different depending on where the contacts are supposed to connect.

As another example, not shown here, either device can be etched into pillars as well. If the device is bottom-illuminated, then the bottom device would be etched into pillars, and vice versa. These pillars act to better absorb radiation by creating more surface area, and by causing any reflected radiation to strike other pillars, thereby increasing absorption. These pillars, if on the top device, could be in addition to the mesa etching. In that situation, the mesa structure would be created, then the pillars would be etched out of each mesa. The gaps between the pillars could then be filled with an insulator or left empty, and the metal contacts would be formed on top. As mentioned before, this etching could be done with dry or wet etching.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is our object to have the single, dual, and multicolor photodiode structure, which could provide the broad spectral detection capability ranges within UV to as high as 25 µm wavelengths of radiations According to the present invention, it is our also object to provide the photodiode array of M.times.N elements which could also provide the broad spectral detection capability ranges within UV to as high as 25 µm wavelengths of radiations It is also our object to have the photodiode structure, which can provide stable spectral detection performance under wide range of temperature variation. Unlike a wide-wavelength wafer bonded photodiode, this present invented photodiode structure is capable of operating at any temperature with slight/or no variation in the quantum efficiency for long wavelengths as the bandgap increases with decreasing temperature.

In the preferred embodiment, the photodiode array of M×N elements where each photodiode can be addressable independently is explained. Photodiode array having broad spectral detection ranges can also have the structure where the photodiode elements are connected by the two-axis electrode.

The present invention is expected to be found practically use in multiple purpose applications such as imaging, telecommunication, and also many sensing applications, and also in the applications including surveillance, satellite tracking, advanced lidar systems, automobile imaging systems etc. The most important advantage of this photodiode is that the performance will not be degraded under wide range of temperature variation, which eliminates the use of the temperature controller. Other advantage of this invention is that conventional fabrication technology can be used to fabricate the single photodiode or its array herein described.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A broadband detector comprising:
    a first detecting device,
        wherein said first detecting device is formed from materials which absorb radiation wavelengths in the approximate range within 0.25 μm-2.51 μm, and
        wherein said first detecting device comprises:
            at least one layer of first electric material, doped either p or n; and
            at least one layer of second electric material, doped either p or n;
    a second detecting device, wherein said second detecting device is formed from materials which absorb radiation wavelengths in the approximate range within 2.5 μm-40 μm, and wherein said second detecting device comprises:
        at least one layer of third electric material, doped either p or n; and
        at least one layer of fourth electric material, doped either p or n;
    a first pair of electrodes, wherein said first pair of electrodes comprises:
        a first electrode, connected to said at least one layer of first electric material; and
        a second electrode, connected to said at least one layer of third electric material; and
    a second pair of electrodes, wherein said second pair of electrodes comprises:
        a third electrode, connected to said at least one layer of second electric material; and
        a fourth electrode, connected to said at least one layer of fourth electric material;
    wherein said first and said second pairs of electrodes are placed in such a way as to connect said first and said second detecting devices electrically in parallel, and
    wherein said first detecting device and said second detecting device are formed monolithically on the same wafer on top of one another.

2. The broadband detector of claim 1, further comprising a substrate, wherein said substrate is either integrated into said first or second detecting device, or wherein said substrate is electrically separate from said first and second detecting devices.

3. The broadband detector of claim 1, further comprising at least buffer layer placed in between said first detecting device and said second detecting device.

4. The broadband detector of claim 1, wherein said at least one first and said at least one second layers of electric material are doped in such a way as to form a p-n junction, p-i-n junction, quantum dot junction, quantum well, Schottkey junction, or photoconductor.

5. The broadband detector of claim 1, wherein said at least one third and said at least one fourth layers of electric material are doped in such a way as to form a p-n junction, p-i-n junction, quantum dot junction, quantum well, Schottkey junction, n-n junction, n-i-n junction, p-p junction, or p-i-p junction.

6. The broadband detector of claim 1, further comprising at least one barrier layer, placed in between said at least one first and said second layers of electric material and/or in between said at least one third and fourth layers of electric material, wherein said at least one barrier layer has a conduction band higher than the conduction band of any of the adjacent said layers of electric material.

7. The broadband detector of claim 1, wherein said first detecting device and said second detecting device form an array of mesa or planar structures.

8. The broadband detector of claim 1, form either an one-dimensional or a two-dimensional array comprising M×N numbers of said broadband detector.

9. The broadband detector of claim 1, further comprising an ROIC connected to said first and second pairs of electrodes using metallic bumps.

10. A broadband detector comprising:
    a first detecting device,
        wherein said first detecting device is formed from materials which absorb radiation wavelengths in the approximate range within 0.25 μm-2.5 μm, and
        wherein said first detecting device comprises:
            at least one layer of first electric material, doped p; and
            at least one layer of second electric material, doped n;
    a second detecting device, wherein said second detecting device is formed from materials which absorb radiation wavelengths in the approximate range within 2.5 μm-40 μm, and wherein said second detecting device comprises:
        at least one layer of third electric material, doped n; and
        at least one layer of fourth electric material, doped p;
    a first pair of electrodes, wherein said first pair of electrodes comprises:
        a first electrode, connected to said at least one layer of first electric material; and
        a second electrode, connected to said at least one layer of third electric material; and
    a second pair of electrodes, wherein said second pair of electrodes comprises:
        a third electrode, connected to said at least one layer of second electric material; and
        a fourth electrode, connected to said at least one layer of fourth electric material;
    wherein said first and second electrodes are connected to each other, and wherein said third and fourth electrodes are connected to each other, thereby connecting said first detecting device and said second detecting device in parallel formation,
    and wherein said first detecting device and said second detecting device are formed monolithically on the same wafer on top of one another.

11. The broadband detector of claim 10, wherein said first detecting device and said second detecting device form an array of mesa or planar structures.

12. The broadband detector of claim 10, form either an one-dimensional or a two-dimensional array comprising M×N numbers of said broadband detector, wherein M and N are integers.

13. The broadband detector of claim 10, further comprising at least buffer layer placed in between said first detecting device and said second detecting device.

14. The broadband detector of claim 10, further comprising an ROIC connected to said first and second pairs of electrodes using metallic bumps.

15. A broadband detector comprising:
a first detecting device,
wherein said first detecting device comprises:
at least one layer of first electric material, either p or n doped;
at least one barrier layer;
at least one layer of second electric material, either p or n doped;
at least one layer of third electric material, either p or n doped,
wherein said at least one layer of second electric material and said at least one layer of third electric material are doped opposite to each other;
at least one first electrode, wherein said at least one first electrode connects to said at least one layer of first electric material; and
at least one second electrode,
wherein said at least one second electrode connects to said at least one layer of third electric material, and
wherein said at least one barrier layer has a conduction band higher than the conduction band of said at least one layer of first electric material, and higher than the conduction band of said at least one layer of second electric material; and
a second detecting device, and wherein said second detecting device comprises:
at least one layer of fourth electric material, doped either p or n; and
at least one layer of fifth electric material, doped either p or n;
a third electrode connected to said at least one layer of fourth electric material; and
a fourth electrode connected to said at least one layer of fifth electric material;
wherein said first, second, third, and fourth electrodes are placed in such a way as to connect said first and said second detecting devices electrically in parallel, and
wherein said first detecting device and said second detecting device are formed monolithically on the same wafer on top of one another,
wherein one of said first or second detecting devices is formed from materials which absorb radiation wavelengths in the approximate range within 0.25 µm-2.5 µm, and
wherein the other of said first or second detecting devices is formed from materials which absorb radiation wavelengths in the approximate range within 2.5 µm-40 µm.

16. The broadband detector according to claim 15, further comprising a substrate, wherein said substrate is either integrated into said at least one third electric material, or wherein said substrate is separate from said third electrical material.

17. The broadband detector according to claim 15, further comprising a intrinsic layer in between the said second electrical material and said third electrical material.

18. The broadband detector according to claim 15, further comprising a intrinsic layer in between the said first layer of electrical material and said barrier layer.

19. The broadband detector according to claim 15, further comprising a layer in between the said second layer of electrical material and said third layer of electrical material, wherein said layer is formed from a group multiquantum-wells, quantum-dots, and photoconductors.

20. The broadband detector according to claim ?, wherein said at least one layer of first electric material and said at least one layer of second electric material are formed from materials which absorb different wavelengths of radiation.

* * * * *